(12) United States Patent
Nagasaka

(10) Patent No.: US 7,932,994 B2
(45) Date of Patent: Apr. 26, 2011

(54) EXPOSURE APPARATUS, EXPOSURE METHOD, AND METHOD FOR PRODUCING DEVICE

(75) Inventor: Hiroyuki Nagasaka, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1011 days.

(21) Appl. No.: 11/645,643

(22) Filed: Dec. 27, 2006

(65) Prior Publication Data

US 2007/0242255 A1 Oct. 18, 2007

(30) Foreign Application Priority Data

Dec. 28, 2005 (JP) .................................. 2005-378633

(51) Int. Cl.
*G03B 27/42* (2006.01)

(52) U.S. Cl. ........................................... 355/53; 355/30

(58) Field of Classification Search ............... 355/30, 355/53; 359/489
See application file for complete search history.

(56) References Cited

U.S. PATENT DOCUMENTS

| | | | |
|---|---|---|---|
| 5,473,410 A | 12/1995 | Nishi | |
| 6,327,022 B1 | 12/2001 | Nishi | |
| 6,819,405 B2 | 11/2004 | Mulkens et al. | |
| 6,952,253 B2 | 10/2005 | Lof et al. | |
| 2002/0123012 A1 | 9/2002 | Sewell | |
| 2003/0190762 A1 | 10/2003 | Wang et al. | |
| 2004/0057036 A1* | 3/2004 | Kawashima et al. | 355/77 |
| 2004/0239904 A1* | 12/2004 | Nishinaga | 355/53 |
| 2005/0200819 A1* | 9/2005 | Van Buel | 355/67 |
| 2005/0270608 A1* | 12/2005 | Shiozawa et al. | 359/15 |
| 2005/0280791 A1 | 12/2005 | Nagasaka et al. | |
| 2006/0055834 A1 | 3/2006 | Tanitsu et al. | |
| 2006/0170901 A1 | 8/2006 | Tanitsu et al. | |
| 2007/0013890 A1 | 1/2007 | Loopstra et al. | |

FOREIGN PATENT DOCUMENTS

| | | |
|---|---|---|
| JP | 2000021748 A * | 1/2000 |
| JP | A-2000-21708 | 1/2000 |
| JP | A 2000-021742 | 1/2000 |
| JP | A 2000-021748 | 1/2000 |
| JP | A 2001-291654 | 10/2001 |
| JP | A 2001-297976 | 10/2001 |
| JP | A 2004-519850 | 7/2004 |
| WO | WO 97/11411 | 3/1997 |
| WO | WO 02/069049 A2 | 9/2002 |
| WO | WO 2004/090634 A2 | 10/2004 |

OTHER PUBLICATIONS

Englich translation of JP 2000021748 A is attached.*
Supplementary European Search Report issued Jul. 1, 2010 in EP 06 84 3445.

* cited by examiner

*Primary Examiner* — Edward J Glick
*Assistant Examiner* — Mesfin T Asfaw
(74) *Attorney, Agent, or Firm* — Oliff & Berridge, PLC

(57) ABSTRACT

An exposure apparatus includes a light source unit which emits an exposure light beam; and an illumination system which includes a splitting optical system splitting the exposure light beam emitted from the light source unit into a first exposure light beam and a second exposure light beam, and which illuminates a first pattern with the first exposure light beam and illuminates a second pattern with the second exposure light beam; wherein a predetermined area on a substrate is multiply exposed by radiating the first exposure light beam from the first pattern and the second exposure light beam from the second pattern onto the predetermined area on the substrate.

9 Claims, 20 Drawing Sheets

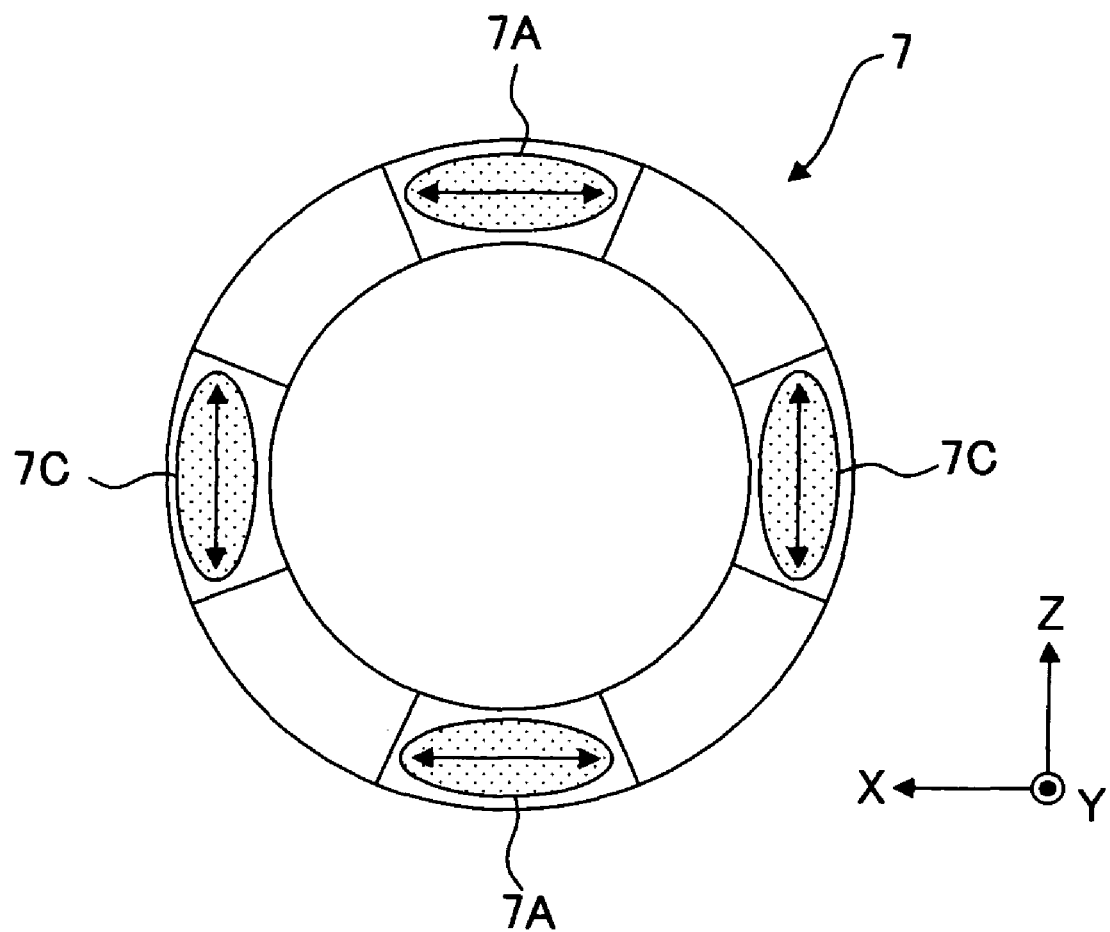

Fig. 20
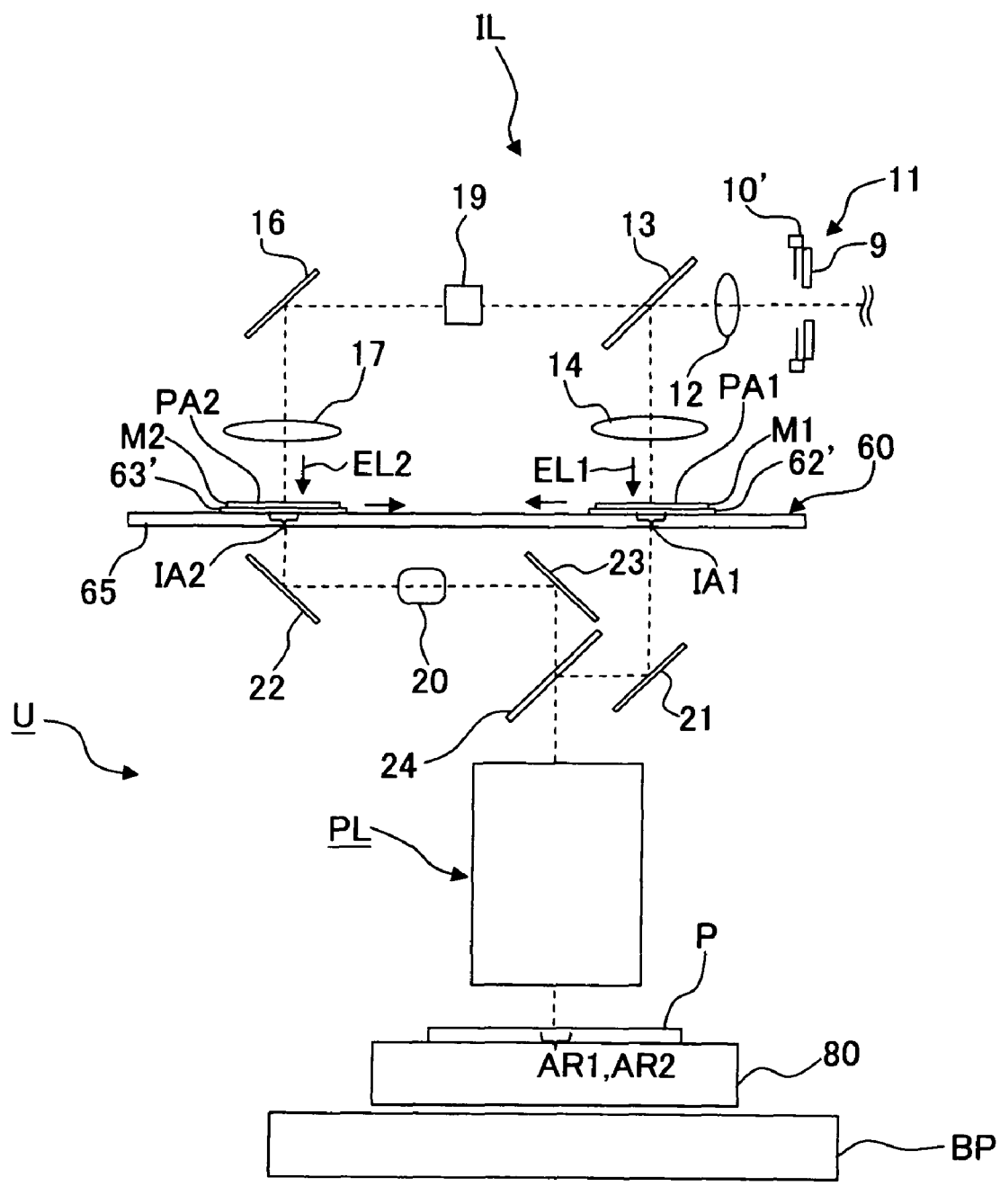
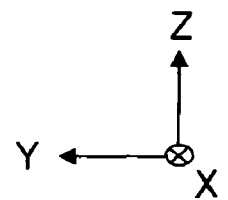

EXPOSURE APPARATUS, EXPOSURE METHOD, AND METHOD FOR PRODUCING DEVICE

CROSS-REFERENCE TO RELATED APPLICATION

This application claims the benefit of priority of Japanese Patent Application No. 2005-378633 filed on Dec. 28, 2005, the entire disclosure of which is incorporated herein by reference.

BACKGROUND OF THE INVENTION

1. Field of the Invention

The present invention relates to an exposure apparatus and an exposure method for exposing a substrate, and a method for producing a device.

2. Description of the Related Art

An exposure apparatus, which performs the multiple exposure for the substrate, is known as disclosed, for example, in Japanese Patent Application Laid-open No. 2001-297976 in relation to the exposure apparatus to be used in the photolithography steps.

In the multiple exposure, when a plurality of light source units are provided and/or a plurality of illumination systems are provided in order to illuminate a plurality of masks with exposure light beams respectively, there is such a possibility that the apparatus cost is increased and/or the exposure apparatus becomes large-sized.

SUMMARY OF THE INVENTION

The present invention has been made taking the foregoing situations into consideration, an object of which is to provide an exposure apparatus, an exposure method, and a method for producing a device, in which the increase in the apparatus cost and the increase in the size of the apparatus are suppressed, and the substrate can be subjected to the multiple exposure efficiently.

In order to achieve the object as described above, the present invention adopts the following constructions corresponding to respective drawings as illustrated in embodiments. However, parenthesized symbols affixed to respective elements merely exemplify the elements by way of example, with which it is not intended to limit the respective elements.

According to a first aspect of the present invention, there is provided an exposure apparatus which performs multiple exposure for a substrate, comprising a light source unit which emits an exposure light beam; a splitting optical system which splits the exposure light beam emitted from the light source unit into a first exposure light beam and a second exposure light beam; and an illumination system which illuminates a first pattern with the first exposure light beam and which illuminates a second pattern with the second exposure light beam; wherein a predetermined area on the substrate is multiply exposed by radiating the first exposure light beam from the first pattern and the second exposure light beam from the second pattern onto the predetermined area on the substrate.

According to the first aspect of the present invention, it is possible to suppress the increase in the apparatus cost and the increase in the size of the apparatus, and it is possible to perform the multiple exposure for the substrate efficiently.

According to a second aspect of the present invention, there is provided an exposure apparatus which exposes a substrate; comprising a light source which generates an exposure light beam; an illumination system which illuminates a first pattern with a first exposure light beam and which illuminates a second pattern with a second exposure light beam; a moving unit which moves the first pattern and the second pattern relative to the substrate; and a movable blind which is movable in synchronization with movement of at least one of the first pattern, the second pattern, and the substrate and which has a first area allowing only the first exposure light beam to pass therethrough, a second area allowing only the second exposure light beam to pass therethrough, and a third area allowing both of the first exposure light beam and the second exposure light beam to pass therethrough; wherein a predetermined area on the substrate is multiply exposed by radiating the first exposure light beam from the first pattern and the second exposure light beam from the second pattern onto the predetermined area on the substrate.

According to the exposure apparatus of the second aspect of the present invention, it is possible to avoid any unnecessary exposure for the substrate by satisfactorily controlling the two exposure areas formed at isolated positions on the substrate by using the single movable blind.

According to a third aspect of the present invention, there is provided a method for producing a device, comprising performing multiple exposure for a substrate by using the exposure apparatus as defined in the first or second aspect; developing the substrate for which the multiple exposure has been performed; and processing the developed substrate. According to the method for producing the device of the present invention, it is possible to produce the device by using the exposure apparatus which makes it possible to perform the multiple exposure for the substrate efficiently.

According to a fourth aspect of the present invention, there is provided an exposure method for performing multiple exposure for a predetermined area on a substrate while moving the substrate in a scanning direction, the exposure method comprising splitting an exposure light beam emitted from a light source unit into a first exposure light beam and a second exposure light beam; radiating the first exposure light beam onto a first exposure area and radiating the second exposure light beam onto a second exposure area defined at a position different from that of the first exposure area in relation to the scanning direction; and performing multiple exposure for the predetermined area on the substrate by moving the predetermined area on the substrate with respect to the first exposure area and the second exposure area.

According to the fourth aspect of the present invention, it is possible to suppress the increase in the apparatus cost and the increase in the size of the apparatus, and it is possible to perform the multiple exposure for the substrate efficiently.

According to a fifth aspect of the present invention, there is provided a method for producing a device, comprising performing multiple exposure for a substrate by using the exposure method as defined above; developing the substrate for which the multiple exposure has been performed; and processing the developed substrate.

According to the fifth aspect of the present invention, the device can be produced by using the exposure method in which the substrate can be multiply exposed efficiently.

According to the present invention, it is possible to suppress the increase in the apparatus cost and the increase in the size of the apparatus, it is possible to perform the multiple exposure for the substrate efficiently, and it is possible to produce the device satisfactorily.

BRIEF DESCRIPTION OF THE DRAWINGS

FIG. 8 illustrates another example of aperture diaphragm of the illumination system.

FIG. 20 shows a schematic arrangement view illustrating an exposure apparatus according to a seventh embodiment.

DESCRIPTION OF THE PREFERRED EMBODIMENTS

Embodiments of the present invention will be explained below with reference to the drawings. However, the present invention is not limited to the embodiments. In the following description, an XYZ rectangular coordinates system is set. The positional relationship concerning respective members will be explained with reference to the XYZ rectangular coordinates system. An X axis direction is a predetermined direction in a horizontal plane. An Y axis direction is a direction which is perpendicular to the X axis direction in the horizontal plane. A Z axis direction is a direction which is perpendicular to each of the X axis direction and the Y axis direction (i.e., the vertical direction). Directions of rotation (inclination) about the X axis, the Y axis, and the Z axis are designated as the θX, θY, and θZ directions respectively.

First Embodiment

Figure 1:
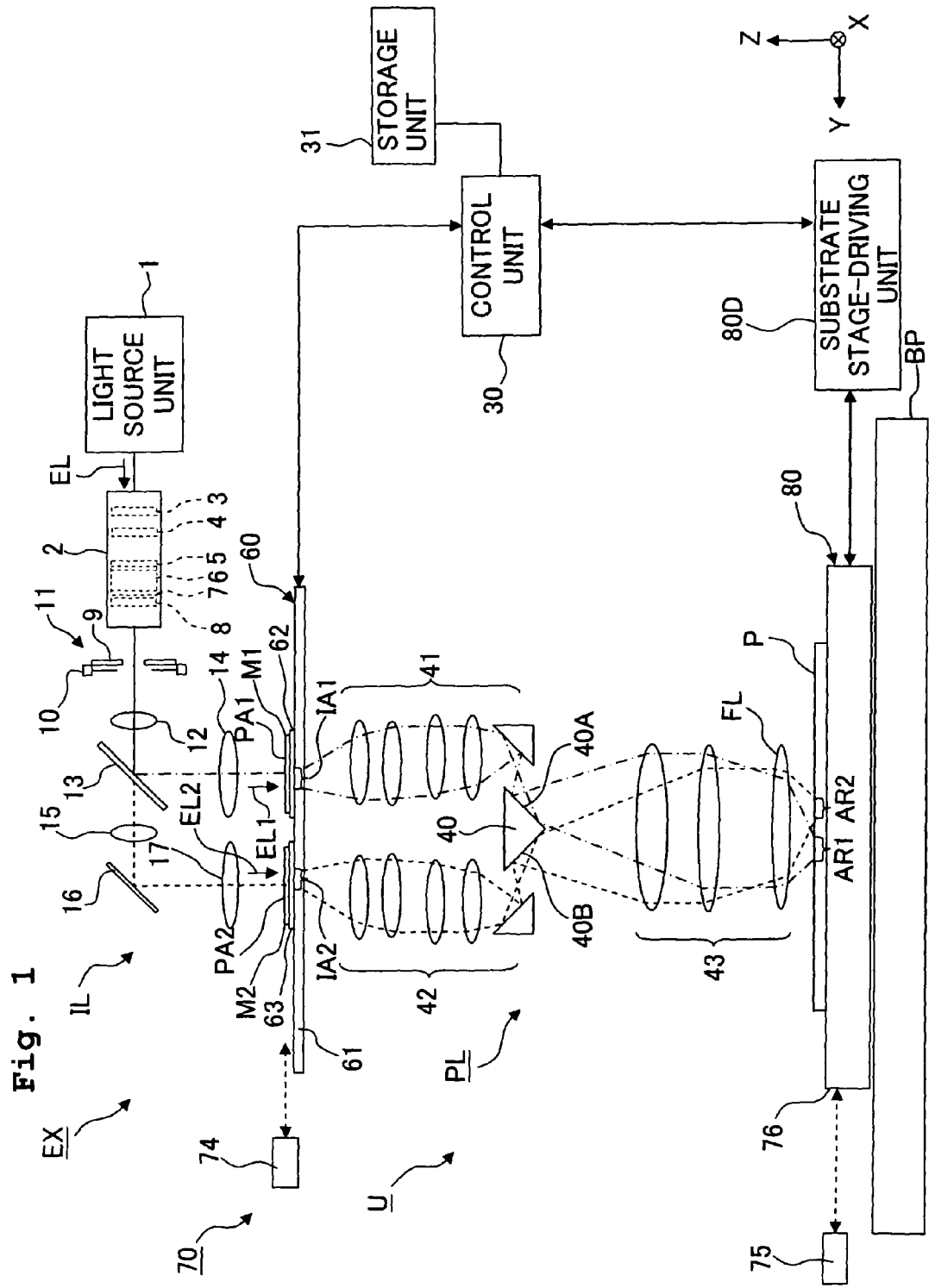
FIG. 1 shows a schematic arrangement view illustrating an exposure apparatus according to a first embodiment.

A first embodiment will be explained. FIG. 1 shows a schematic arrangement view illustrating an exposure apparatus EX according to a first embodiment. With reference to FIG. 1, the exposure apparatus EX includes a mask stage 60 which is movable while holding a first mask M1 having a first pattern PA1 and a second mask M2 having a second pattern PA2, a substrate stage 80 which is movable while holding a substrate P, a measuring system 70 which is capable of measuring a position information about the respective stages, a light source unit 1 which emits an exposure light beam EL, an illumination system IL which has a splitting optical system 13 for splitting the exposure light beam EL emitted from the light source unit 1 into a first exposure light beam EL1 as a first component of the exposure light beam EL and a second exposure light beam EL2 as a second component of the exposure light beam EL and which illuminates the first pattern PA1 of the first mask M1 with the first exposure light beam EL1 and illuminates the second pattern PA2 of the second mask M2 with the second exposure light beam EL2, a projection optical system PL which projects, onto the substrate P, an image of the first pattern PA1 illuminated with the first exposure light beam EL1 and an image of the second pattern PA2 illuminated with the second exposure light beam EL2, a control unit 30 which controls the operation of the entire exposure apparatus EX, and a storage unit 31 which is connected to the control unit 30 and which stores various pieces of information in relation to the exposure.

The substrate referred to herein includes those in which a base material, including, for example, a semiconductor wafer such as a silicon wafer is coated with various films, including, for example, protective films (top coat films) and photosensitive materials (photoresists). The mask includes a reticle on which a device pattern to be subjected to the reduction projection onto the substrate is formed. The mask has a predetermined pattern formed by using a light-shielding film such as chromium on a transparent plate member such as a glass plate. In this embodiment, a transmission type mask is used as the mask. However, it is also allowable to use a reflection type mask. In this embodiment, the first pattern PA1 and the second pattern PA2 are different patterns.

In this embodiment, an optical system, which is arranged between the light source unit 1 and the substrate P and which includes, for example, optical members and optical elements of the projection optical system PL and the illumination system IL, is appropriately referred to as "optical unit U".

The exposure apparatus EX of this embodiment performs the multiple exposure (double exposure) for a shot area on the substrate P by radiating the first exposure light beam EL1 from the first pattern PA1 and the second exposure light beam EL2 from the second pattern PA1 onto the shot area on the substrate P. Specifically, the exposure apparatus EX performs the multiple exposure for the shot area on the substrate P with an image of the first pattern PA1 formed by the first exposure light beam EL1 emitted from the illumination system IL and radiated onto a first exposure area AR1 via the first pattern PA1 and the projection optical system PL and with an image of the second pattern PA2 formed by the second exposure light beam EL2 emitted from the illumination system IL and radiated onto a second exposure area AR2 via the second pattern PA2 and the projection optical system PL.

The exposure apparatus EX of the present invention is a scanning type exposure apparatus (so-called scanning stepper) in which the image of the first pattern PA1 of the first mask M1 and the image of the second pattern PA2 of the second mask M2 are projected onto the substrate P while synchronously moving the substrate P and the first and second masks M1, M2 in predetermined scanning directions. In this embodiment, the scanning direction (synchronous movement direction), in which each of the substrate P and the first and masks M1, M2 is subjected to the scanning, is designated as the Y axis direction.

The exposure apparatus EX of this embodiment performs the multiple exposure for the shot area on the substrate P by moving the substrate P in the Y axis direction with respect to the first exposure light beam EL1 and the second exposure light beam EL2 radiated onto the first exposure area AR1 and the second exposure area AR2 respectively. The substrate stage 80 is capable of moving the shot area on the substrate P in the Y axis direction with respect to the first exposure area AR1 and the second exposure area AR2. The control unit 30 makes the first exposure light beam EL1 and the second exposure light beam EL2 to be radiated onto the first exposure area AR1 and the second exposure area AR2 respectively while moving the shot area on the substrate P in the Y axis direction by using the substrate stage 80 with respect to the first exposure area AR1 and the second exposure area AR2, to thereby subject the shot area on the substrate P to the multiple exposure (double exposure).

At first, the light source unit 1 will be explained. The light source unit 1 emits the exposure light beam EL for exposing the substrate P. Those usable as the exposure light beam EL emitted from the light source unit 1 include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser unit is used as the light source unit 1. The ArF excimer laser light beam is used as the exposure light beam EL. In this embodiment, the exposure apparatus EX is provided with one (single) light source unit 1. That is, the single light source is used to illuminate the first exposure area AR1 and the second exposure area AR2.

Next, the illumination system IL will be explained. The illumination system IL splits the exposure light beam (laser beam) EL emitted from the light source unit 1 into the first exposure light beam EL1 and the second exposure light beam EL2 by using the splitting optical system 13. The illumination system IL illuminates the first pattern PA1 of the first mask M1 held by the mask stage 60 with the first exposure light beam EL1, and illuminates the second pattern PA2 of the second mask M2 with the second exposure light beam EL2. As disclosed in International Publication No. 2005/076045, for example, the illumination system IL of this embodiment includes a first optical system 2 which includes, for example, a beam expander, a polarization state-switching optical system 3, a diffraction optical element 4, an afocal optical system (non-focus optical system), a zoom optical system, a polarization conversion element 5, an optical integrator 6, and a condenser optical system; a blind unit 11 which includes a fixed blind 9 for defining a first illumination area IA1 brought about by the first exposure light beam EL1 on the first mask M1 and a second illumination area IA2 brought about by the second exposure light beam EL2 on the second mask M2, and a movable blind 10 for avoiding any unnecessary exposure for the substrate P with the first and second exposure light beams EL1, EL2; and the splitting optical system 13 which splits the exposure light beam EL into the first exposure light beam EL1 and the second exposure light beam EL2, the exposure light beam EL being emitted from the light source unit 1 and allowed to pass through the first optical system 2 and the blind unit 11. That is, the illumination system IL of the exposure apparatus of this embodiment is used as a (common) single illumination system for illuminating the first pattern PA1 of the first mask M1 and the second pattern PA2 of the second mask M2 owing to the provision of the splitting optical system 13. It is not necessarily indispensable that the splitting optical system is incorporated into the illumination system IL. The splitting optical system may be provided distinctly from the illumination system.

The polarization state-switching optical system 3 is capable of switching the exposure light beam EL, which is to come into the diffraction optical element 4, between in a polarization state and a non-polarization state. In the case of the polarization state, the polarization state-switching optical system 3 is capable of making the switching between in a linear polarization state and a circular polarization state. In the case of the linear polarization state, the polarization state-switching optical system 3 is capable of making the switching between mutually perpendicular polarization states (between S-polarization and P-polarization).

The diffraction optical element 4 has a function to diffract the incident exposure light beam EL at a desired angle. The diffraction optical element 4 is capable of generating a diffracted light beam with the exposure light beam EL from the light source unit 1 to illuminate a predetermined surface with a predetermined illumination area with the diffracted light beam. The diffraction optical element 4 has the unevenness or difference in height (concave/convex structure), having a pitch which is about the wavelength of the exposure light beam EL, formed on a predetermined base material. The size and the shape of the illumination area provided by the diffraction optical element 4 can be set by appropriately adjusting the structure condition including, for example, the pitch, the depth of the concave portion of the concave/convex structure (height of the convex portion), and the direction in which the inner side surface of the concave portion (outer side surface of the convex portion) is directed. For example, the diffraction optical element 4 is capable of generating the detecting light beam from the exposure light beam EL from the light source unit 1 so that the generated diffracted light beam can be used to illuminate a light-incident surface of the optical integrator 6 including, for example, a micro-fly's eye lens with the illumination area having predetermined size and shape by the aid of, for example, the afocal optical system, the zoom optical system, the polarization conversion element 5, and the like. In this embodiment, a zonal illumination area, which is disposed about the center of the optical axis of the illumination system IL, is formed on the light-incident surface of the optical integrator 6. A zonal secondary light source 7, which is disposed about the center of the optical axis of the illumination system IL, is formed on a light-exit surface (back focal plane) of the optical integrator 6. The control unit 30 is capable of adjusting the size and the shape of the illumination area on the light-incident surface of the optical integrator 6 as well as the size and the shape of the secondary light source 7 by adjusting the focal distance of the zoom optical system.

The polarization conversion element 5 converts the polarization state of the exposure light beam EL. In this embodiment, the polarization conversion element 5 is arranged just before (in front of) the optical integrator 6 (in the vicinity of the light-incident surface). The polarization conversion element 5 is capable of adjusting the polarization state of the exposure light beam EL which is to come into the light-incident surface of the optical integrator 6 (as well as the polarization state of the exposure light beam EL to be radiated onto the mask M and the substrate P).

Figure 2:
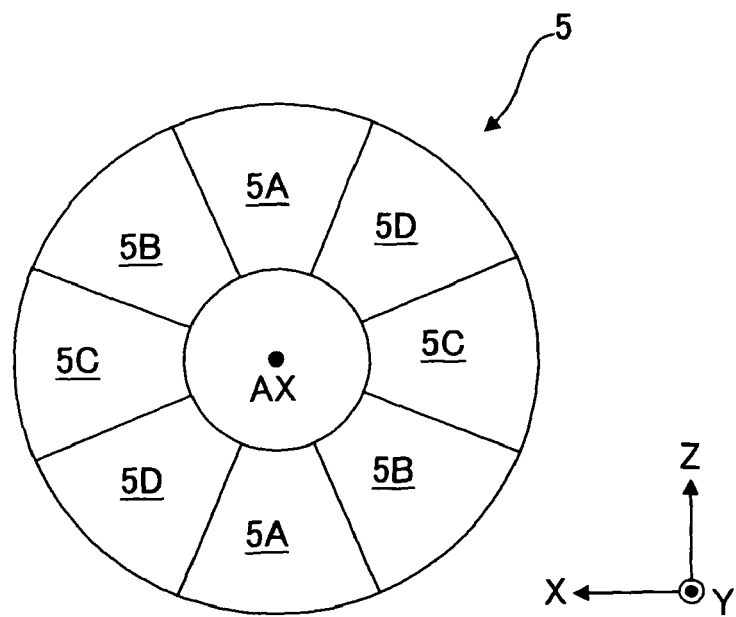
FIG. 2 illustrates an example of a polarization conversion element of an illumination system according to the first embodiment.

FIG. 2 shows an example of the polarization conversion element 5. The polarization conversion element 5 has a zonal effective area which is disposed about the center of the optical axis AX of the illumination system IL. The zonal effective area is formed of, for example, an optical material such as quartz crystal having the optical rotary power. The optical material of the effective area, which is formed to have the zonal shape, has a thickness distribution which is changed in relation to the circumferential direction. The term "thickness of the optical material" herein refers to a length of the optical material in relation to the light transmission direction (Y axis direction).

In this embodiment, the polarization conversion element 5 has a plurality of basic elements 5A to 5D each of which is arranged in the zonal effective area and composed of the optical material having the optical rotary power. In this embodiment, the polarization conversion element 5 is provided with two pieces of each of the first to fourth basic elements 5A to 5D having mutually different characteristics, and thus is provided with the basic elements 5A to 5D in total of eight pieces. Each of the first to fourth basic elements 5A to 5D is formed in a sector form in relation to the XZ direction as shown in FIG. 2, and the elements 5A to 5D are arranged so that the elements divide the zonal effective area substantially equally. Two pieces of the basic elements 5A, 5B, 5C, 5D, which have same characteristics, are arranged mutually opposite with the optical axis AX intervening therebetween. The first to fourth basic elements 5A to 5D are arranged so that their optical axes of crystals are substantially parallel to the optical axis AX, i.e., their optical axes of crystals are substantially coincident with a traveling direction in which the incoming (incident) light beam travels.

As described above, in this embodiment, the zonal illumination area is formed by the exposure light beam EL about the center of the optical axis AX on the light-incident surface of the optical integrator 6. That is, the setting is made such that the exposure light beam EL, which has a substantially zonal cross section about the center of the optical axis AX, is allowed to come into the light-incident surface of the optical integrator 6. Therefore, the exposure light beam EL, which has the substantially zonal cross section about the center of the optical axis AX, is allowed to come into the zonal effective area of the polarization conversion element 5 arranged immediately before or in front of the optical integrator 6.

The exposure light beam EL, which is allowed to come into the first to fourth basic elements 5A to 5D arranged in the zonal effective area of the polarization conversion element 5, is subjected to the conversion of the polarization state in accordance with the optical rotary power of each of the basic elements 5A to 5D, and the exposure light beam EL is allowed to exit from each of the basic elements 5A to 5D. For example, when the exposure light beam EL, which is mainly composed of a linearly polarized light in a predetermined direction, is allowed to come into each of the basic elements 5A to 5D, then each of the basic elements 5A to 5D of the polarization conversion element 5 converts the polarization state of the exposure light beam EL so that the direction of polarization of the incoming exposure light beam EL is rotated by a predetermined angle of rotation about the optical axis AX (in the θY direction in the drawing), and the exposure light beam EL, in which the polarization state has been converted, is allowed to exit therefrom. The angle of rotation of the direction of polarization is determined depending on, for example, the thickness and the optical rotary power of each of the basic elements 5A to 5D. When the thickness, the optical rotary power and the like of each of the basic elements 5A to 5D are set, then the polarization conversion element 5 rotates, by a predetermined angle of rotation, the direction of polarization of the incoming (incident) exposure light beam EL in the linear polarization state, and the exposure light beam EL, which is in the polarization state of the converted direction of polarization, is allowed to exit therefrom.

In this embodiment, the respective thicknesses of the first to fourth basic elements 5A to 5D in relation to the light transmission direction (Y axis direction) are different from each other. The respective basic elements 5A to 5D rotate the direction of polarization of the incoming exposure light beam EL by mutually different angles of rotation. The exposure light beam EL, in which the polarization state (direction of polarization) has been converted by each of the basic elements 5A to 5D, is allowed to come into the optical integrator 6 from the light-incident surface of the optical integrator 6, and forms the zonal secondary light source 7, which is provided about the center of the optical axis AX, on the light-exit surface of the optical integrator 6.

Figure 3:
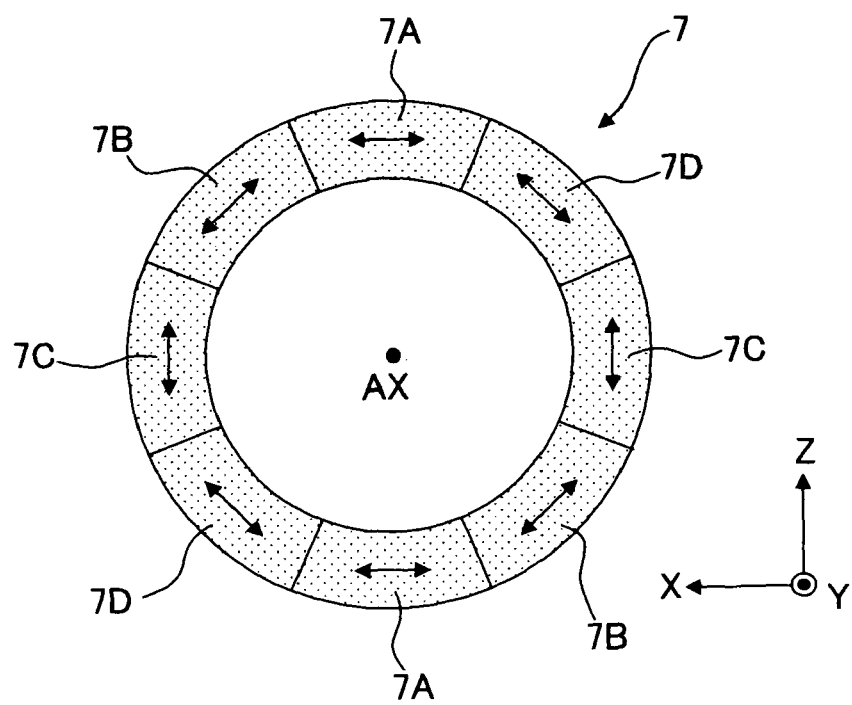
FIG. 3 illustrates an example of a secondary light source of the illumination system according to the first embodiment.

FIG. 3 schematically shows the secondary light source 7 formed on the light-exit surface of the optical integrator 6 by the exposure light beam EL allowed to pass through the polarization conversion element 5 and the optical integrator 6. In this embodiment, the exposure light beam EL, which is mainly composed of the linearly polarized light in the Z axis direction, comes into each of the first to fourth basic elements 5A to 5D as shown in FIGS. 2 and 3.

With reference to FIGS. 2 and 3, the first basic element 5A is provided so that the direction of polarization of the incoming exposure light beam EL is rotated by +90 degrees in the θY direction with respect to the Z axis. Therefore, the exposure light beam EL in the linear polarization state, in which the polarization direction is the direction of rotation by +90 degrees in the θY direction with respect to the Z axis, is allowed to exit from the first basic element 5A. The exposure light beam EL in the linear polarization state, in which the polarization direction is the direction of rotation by +90 degrees in the θY direction with respect to the Z axis, is allowed to exit from a first circular arc-shaped area 7A of the secondary light source 7 formed by the exposure light beam EL which has undergone the optical rotary action of the first basic element 5A.

The second basic element 5B is provided so that the direction of polarization of the incoming exposure light beam EL is rotated by +135 degrees in the θY direction with respect to the Z axis. Therefore, the exposure light beam EL in the linear polarization state, in which the polarization direction is the direction of rotation by +135 degrees in the θY direction with respect to the Z axis, is allowed to exit from the second basic element 5B. The exposure light beam EL in the linear polarization state, in which the polarization direction is the direction of rotation by +135 degrees in the θY direction with respect to the Z axis, is allowed to exit from the second circular arc-shaped area 7B of the secondary light source 7 formed by the exposure light beam EL which has undergone the optical rotary action of the second basic element 5B.

The third basic element 5C is provided so that the direction of polarization of the incoming exposure light beam EL is rotated by +180 degrees in the θY direction with respect to the Z axis. Therefore, the exposure light beam EL in the linear polarization state, in which the polarization direction is the direction parallel to the Z axis, is allowed to exit from the third basic element 5C. The exposure light beam EL in the linear polarization state, in which the polarization direction is the direction parallel to the Z axis, is allowed to exit from the third circular arc-shaped area 7C of the secondary light source 7 formed by the exposure light beam EL which has undergone the optical rotary action of the third basic element 5C.

The fourth basic element 5D is provided so that the direction of polarization of the incoming exposure light beam EL is rotated by +45 degrees in the θY direction with respect to the Z axis. Therefore, the exposure light beam EL in the linear polarization state, in which the polarization direction is the direction of rotation by +45 degrees in the θY direction with respect to the Z axis, is allowed to exit from the fourth basic element 5D. The exposure light beam EL in the linear polarization state, in which the polarization direction is the direction of rotation by +45 degrees with respect to the Z axis, is allowed to exit from the fourth circular arc-shaped area 7D of the secondary light source 7 formed by the exposure light beam EL which has undergone the optical rotary action of the fourth basic element 5D.

As described above, in this embodiment, the exposure light beam EL in the linear polarization state, in which the direction of polarization is substantially the single direction, is converted by the polarization conversion element 5 into the exposure light beam EL in the linear polarization state in which the direction of polarization is the circumferential direction of the polarization conversion element 5. In the following description, the linear polarization state, in which the direction of polarization is the circumferential direction of the polarization conversion element 5, is appropriately referred to as "polarization state in the circumferential direction".

Accordingly, the exposure light beam EL, which is allowed to exit from the zonal secondary light source 7 formed on the light-exit surface of the optical integrator 6, is in the polarization state in the circumferential direction.

In this embodiment, an aperture diaphragm 8, which has predetermined apertures, is arranged in the vicinity of the light-exit surface of the optical integrator 6, i.e., just after the secondary light source 7.

Figure 4:
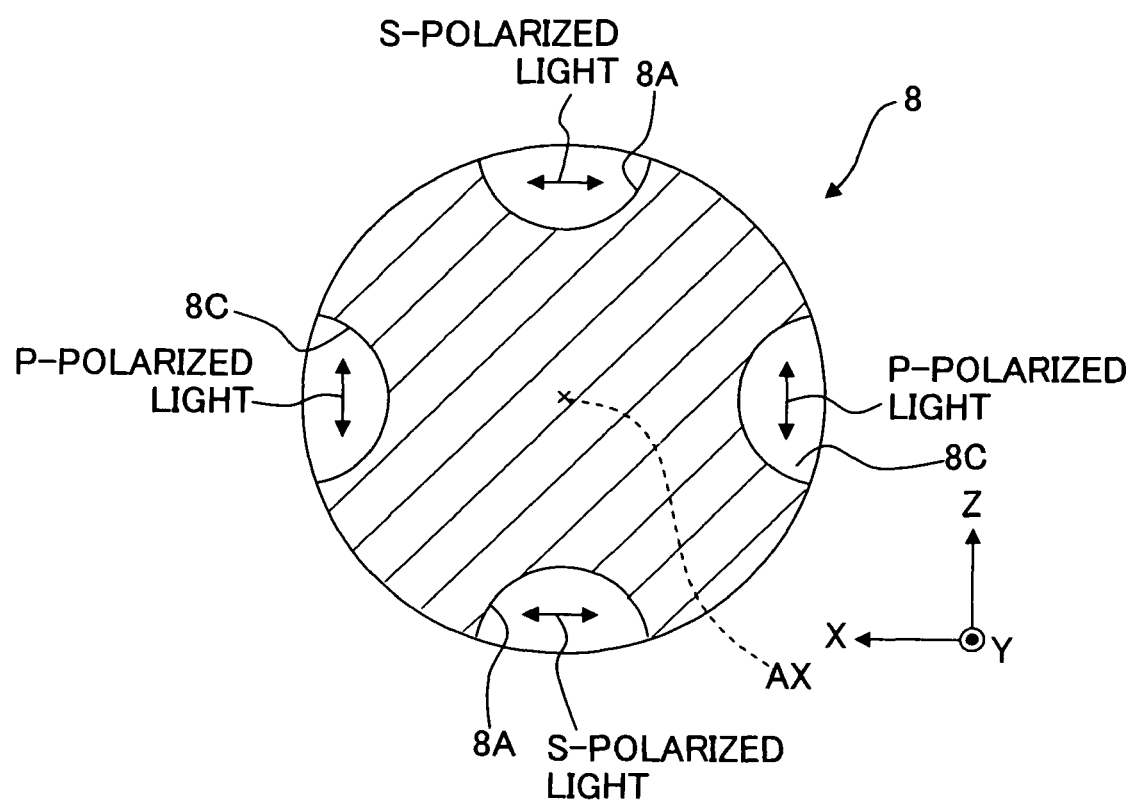
FIG. 4 illustrates an example of aperture diaphragm of the illumination system according to the first embodiment.

FIG. 4 shows an example of the aperture diaphragm 8. With reference to FIG. 4, the aperture diaphragm 8 has apertures 8A, 8C through which the exposure light beam EL is allowed to pass. The aperture diaphragm 8 has two first apertures 8A, 8A which are provided for the passing the exposure light beam EL allowed to exit from the first circular arc-shaped areas 7A of the secondary light source 7 formed by the exposure light beam EL having been subjected to the optical rotary action of the first basic elements 5A, and the two second apertures 8C, 8C which are provided for passing the exposure light beam EL allowed to exit from the third circular arc-shaped areas 7C formed by the exposure light beam EL having been subjected to the optical rotary action of the third basic elements 5C. The first apertures 8A, 8A are provided at opposite positions with the optical axis AX intervening therebetween, and the second apertures 8C, 8C are also provided at opposite positions with the optical axis AX intervening therebetween. In this embodiment, the first apertures 8A, 8A are provided on the +Z side and the −Z side with respect to the optical axis AX respectively as shown in FIG. 4; and the second apertures 8C, 8C are provided on the +X side and the −X side with respect to the optical axis AX respectively, as shown in FIG. 4.

The aperture diaphragm 8 is operated as follows. That is, the exposure light beam EL in the linear polarization state, in which the polarization direction is the direction of rotation by +90 degrees in the θY direction with respect to the Z axis, is allowed to pass through the first apertures 8A, 8A; and the exposure light beam EL in the linear polarization state, in which the polarization direction is the direction parallel to the Z axis, is allowed to pass through the second apertures 8C, 8C. That is, the exposure light beam EL, which is mainly composed of the linearly polarized light in the X axis direction as shown in FIG. 4, is allowed to pass through the first apertures 8A. The exposure light beam EL, which is mainly composed of the linearly polarized light in the Z axis direction perpendicular to the X axis direction, is allowed to pass through the second apertures 8C. In this embodiment, the exposure light beam EL in the S-polarization state as the linearly polarized light is allowed to pass through the first apertures 8A. The exposure light beam EL in the P-polarization state is allowed to pass through the second apertures 8C. Therefore, the exposure light beam EL, which is emitted from the light source unit 1 and which is allowed to pass through the aperture diaphragm 8, mainly contains the S-polarized light component and the P-polarized light component.

The S-polarized light (TE-polarized light) herein refers to a linearly polarized light which has a direction of polarization in the direction perpendicular to the incident (incoming) surface (polarized light in which the electric vector is oscillated in the direction perpendicular to the incident surface). However, the incident surface is defined as a surface which includes the normal line of the boundary surface and the incident direction of the light at a point of arrival of the light when the light arrives at the boundary surface of the medium (irradiated surface: at least one of a surface of the mask and a surface of the substrate). The P-polarized light (TM-polarized light) is a linearly polarized light which has a direction of polarization in the direction parallel to the incident surface defined as described above (polarized light in which the electric vector is oscillated in the direction parallel to the incident surface).

The exposure light beam EL, which comes from the secondary light source 7 formed on the light-exit surface of the optical integrator 6, is allowed to pass through the apertures 8A, 8C of the aperture diaphragm 8, and then the exposure light beam EL is allowed to come into the condenser optical system. The secondary light source 7 illuminates the blind unit 11 in a superimposed manner, for example, by the aid of the condenser optical system.

The blind unit 11 includes the fixed blind 9 which has an aperture (light passing area) for defining the first illumination area IA1 brought about by the first exposure light beam EL1 on the first mask M1 and the second illumination area IA2 brought about by the second exposure light beam EL2 on the second mask M2, and the movable blind 10 which functions as a light-shielding member for shielding any unnecessary (excessive) radiation of the first and second exposure light beams EL1, EL2 onto portions other than the first and second pattern formation areas of the first and second masks M1, M2 in which the first and second patterns PA1, PA2 are formed respectively. The movable blind 10 has a light passing area through which the exposure light beam EL is allowed to pass. The movable blind 10 is provided between the light source unit 1 and the splitting optical system 13 to be movable (between the light source unit 1 and the splitting optical system 13) in synchronization with at least one of the first mask M1 having the first pattern PA1, the second mask M2 having the second pattern PA2, and the substrate P. The exposure light beam EL, which is restricted by the passage through the fixed blind 9, is further restricted by the movable blind 10 at a predetermined timing during the movement of the first mask M1, the second mask M2, or the substrate P. Accordingly, it is possible to shield any unnecessary radiation of the first and second exposure light beams EL1, EL2 onto the portions other than the first and second pattern formation areas of the first and second masks M1, M2. As a result, it is possible to avoid any unnecessary exposure for the substrate P with the first exposure light beam EL1 and the second exposure light beam EL2. The exposure light beam EL, which mainly contains the S-polarized light component and the P-polarized light component allowed to pass through the light passing areas of the blind unit 11 including the fixed blind 9 and the movable blind 10, comes into the splitting optical system 13 via a second optical system 12.

Figure 5:
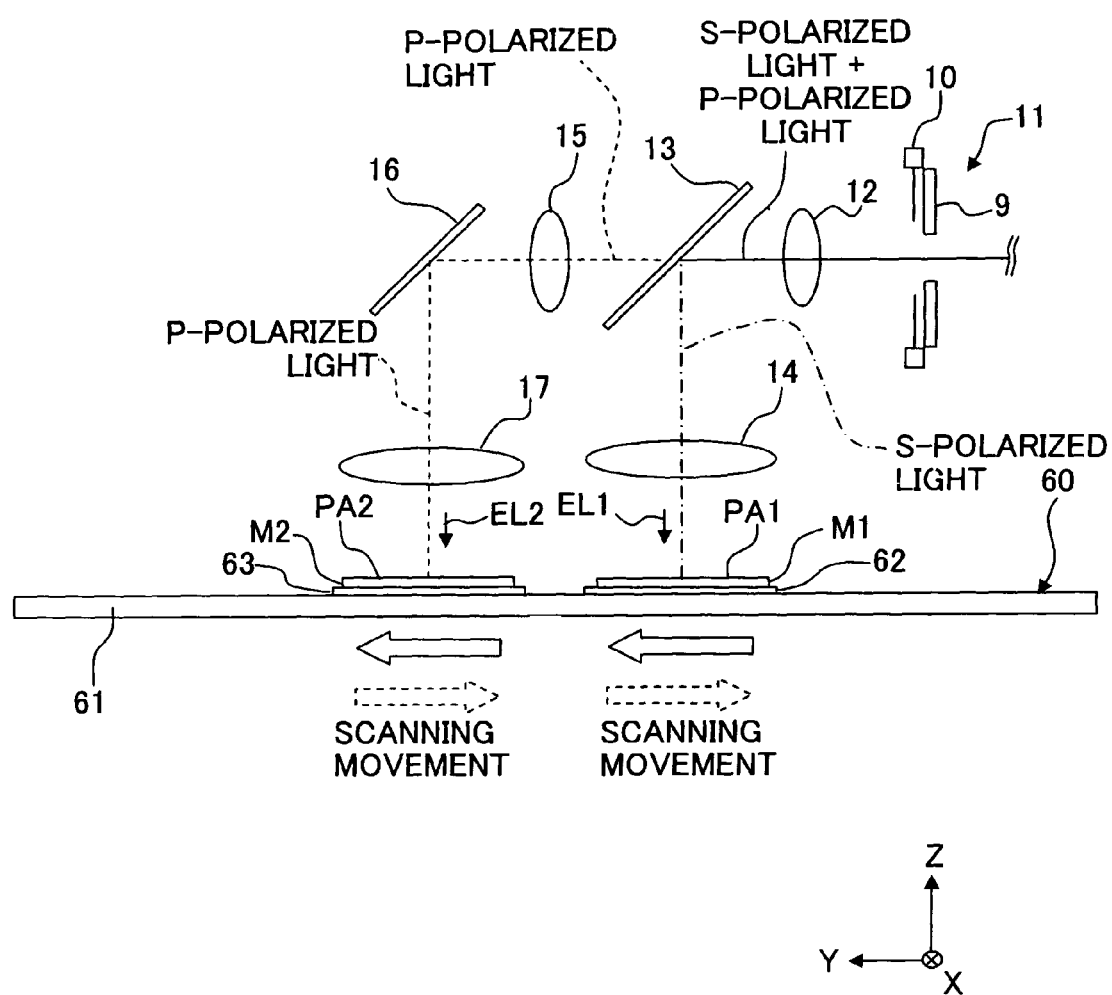
FIG. 5 shows main components of the illumination system according to the first embodiment.

FIG. 5 shows those disposed in the vicinity of the splitting optical system 13. The splitting optical system 13 includes a polarization splitting optical system (polarization beam splitter) which splits the exposure light beam EL into the first exposure light beam EL1 in the S-polarization state and the second exposure light beam EL2 in the P-polarization state. As described above, the exposure light beam EL, which is emitted from the light source unit 1 and which is allowed to pass through the aperture diaphragm 8, mainly contains the S-polarized light component and the P-polarized light component. The exposure light beam EL, which is allowed to pass through the apertures 8A, 8C of the aperture diaphragm 8 and which is allowed to pass through the light passing area of the blind unit 11, is split by the splitting optical system 13 into the first exposure light beam EL1 in the S-polarization state and the second exposure light beam EL2 in the P-polarization state. That is, the exposure light beam EL, which is emitted from the light source unit 1 and which is allowed to pass through the first optical system 2, the blind unit 11 and the like, is split by the splitting optical system 13 of this embodiment into the first exposure light beam EL1 in the S-polarization state and the second exposure light beam EL2 in the P-polarization state.

In this embodiment, the first exposure light beam EL1 in the S-polarization state is reflected by the splitting optical system 13, and the second exposure light beam EL2 in the P-polarization state is allowed to pass through the splitting optical system 13. The first exposure light beam EL1 in the S-polarization state, which is split by the splitting optical system 13, is supplied to a third optical system 14, and is radiated onto the first mask M1 via the third optical system 14. The second exposure light beam EL2 in the P-polarization state, which is split by the splitting optical system 13, is supplied to a fourth optical system 15, and is supplied to a reflecting mirror 16 via the fourth optical system 15. The second exposure light beam EL2 is reflected by the reflecting mirror 16, and then is radiated onto the second mask M2 via a fifth optical system 17. As described above, the illumination system IL illuminates the first pattern PA1 of the first mask M1 with the first exposure light beam EL1 in the S-polarization state split by the splitting optical system 13; and the illumination system IL illuminates the second pattern PA2 of the second mask M2 with the second exposure light beam EL2 in the P-polarization state.

Figure 6:
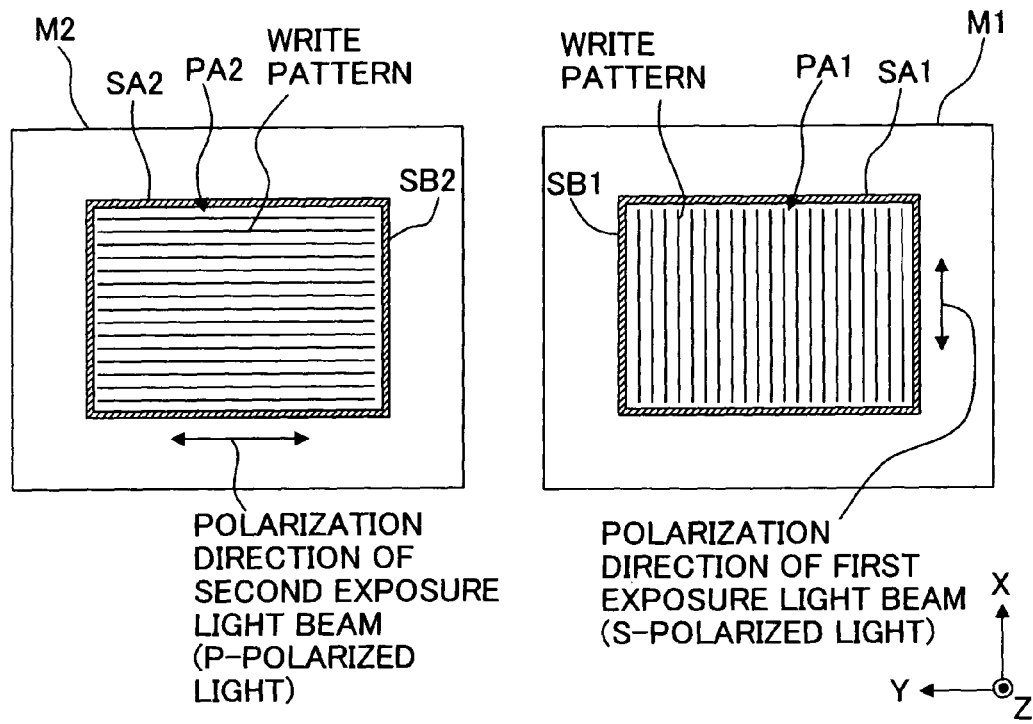
FIG. 6 shows first and second masks according to the first embodiment.

FIG. 6 shows a plan view illustrating the first mask M1 and the second mask M2 held by the mask stage 60. In FIG. 6, the mask stage is omitted from the illustration. As shown in FIG. 6, in this embodiment, the first pattern PA1 of the first mask M1 is mainly composed of a plurality of line-and-space patterns in which the X axis direction is the longitudinal direction. The second pattern PA2 of the second mask M2 is mainly composed of a plurality of line-and-space patterns in which the Y axis direction is the longitudinal direction. That is, the first pattern PA1 dominantly contains the patterns in which the line patterns having the longitudinal direction of the X axis direction are periodically aligned in the Y axis direction. The second pattern PA2 dominantly contains the patterns in which the line patterns having the longitudinal direction of the Y axis direction are periodically aligned in the X axis direction.

The first exposure light beam EL1, which is radiated onto the first mask M1, is mainly composed of the linearly polarized light (S-polarized light) in the predetermined direction. In this embodiment, the setting is made such that the direction of polarization of the first exposure light beam EL1 on the first mask M1 is substantially parallel to the X axis. The second exposure light beam EL2, which is radiated onto the second mask M1, is mainly composed of the linearly polarized light (P-polarized light) in the direction perpendicular to the predetermined direction. In this embodiment, the setting is made such that the direction of polarization of the second exposure light beam EL2 on the second mask M2 is substantially parallel to the Y axis.

That is, in this embodiment, the longitudinal direction of the line patterns of the line-and-space patterns contained in the first pattern PA1 is substantially parallel to the direction of polarization of the first exposure light beam EL1 mainly composed of the S-polarized light, and the longitudinal direction of the line patterns of the line-and-space patterns contained in the second pattern PA2 is substantially parallel to the direction of polarization of the second exposure light beam EL2 mainly composed of the P-polarized light.

As described above, in this embodiment, the illumination system IL effects the linear polarization illumination adjusted to the longitudinal directions of the line patterns of the line-and-space patterns of the first and second masks M1, M2. The diffracted light of the S-polarized light component, i.e., the component in the polarization direction along with the longitudinal direction of the line pattern of the first pattern PA1 is dominantly emitted from the first pattern PA1 of the first mask M1; and the diffracted light of the P-polarized light component, i.e., the component in the polarization direction along with the longitudinal direction of the line pattern of the second pattern PA2 is dominantly emitted from the second pattern PA2 of the second mask M2.

The first exposure light beam EL1, which is allowed to pass through the first apertures 8A, 8A of the aperture diaphragm 8 arranged at the mutually opposing positions with respect to the optical axis AX respectively, is radiated onto the first mask M1. The first pattern PA1 of the first mask M1 is in the state of being subjected to the dipole illumination (two-spot illumination) with the first exposure light beam EL1 in the S-polarization state. Similarly, the second exposure light beam EL2, which is allowed to pass through the second apertures 8C, 8C of the aperture diaphragm 8 arranged at the mutually opposing positions with respect to the optical axis AX respectively, is radiated onto the second mask M2. The second pattern PA2 of the second mask M2 is in the state of being subjected to the dipole illumination (two-spot illumination) with the second exposure light beam EL2 in the P-polarization state.

Figure 7A:
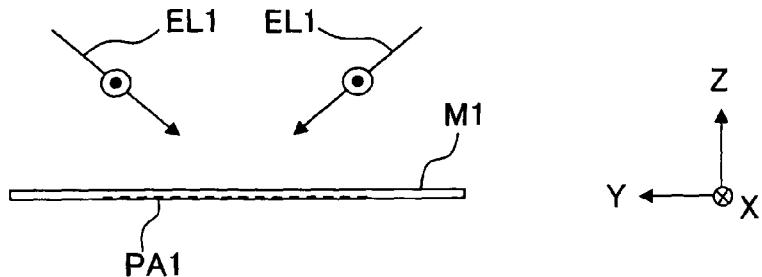
FIGS. 7A and 7B schematically show situations in which the exposure light beams are allowed to come into the first and second masks.
Figure 7B:
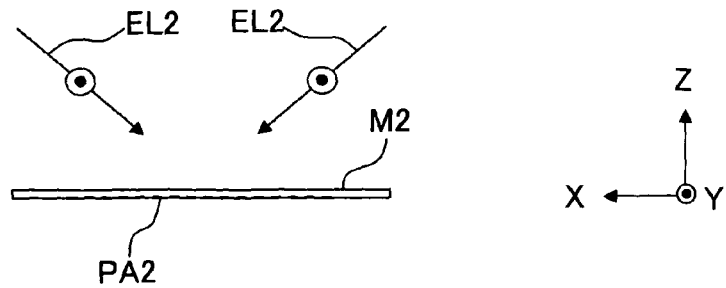

That is, in this embodiment, as schematically shown in FIG. 7A, the illumination system IL performs the oblique incidence illumination (dipole illumination) adjusted to the longitudinal direction of the line pattern of the line-and-space pattern of the first mask M1 by using the two light fluxes (first exposure light beam EL1) in the linear polarization state (S-polarization state). Further, as schematically shown in FIG. 7B, the illumination system IL performs the oblique incidence illumination (dipole illumination) adjusted to the longitudinal direction of the line pattern of the line-and-space pattern of the second mask M2 by using the two light fluxes (second exposure light beam EL2) in the linear polarization state (P-polarization state). As shown in FIG. 7A, the first exposure light beam EL1, which has the direction of polarization of the direction (X axis direction) along with the longitudinal direction of the line pattern, comes into the first pattern PA1 of the first mask M1 in the two directions inclined in the θX direction with respect to the surface of the first mask M1. As shown in FIG. 7B, the second exposure light beam EL2, which has the direction of polarization of the direction (Y axis direction) along with the longitudinal direction of the line pattern, comes into the second pattern PA2 of the second mask M2 in the two directions inclined in the θY direction with respect to the surface of the second mask M2.

In this embodiment, the zonal secondary light source 7, which emits the exposure light beam EL in the polarization state in the circumferential direction, is formed by the illumination system IL on the light-exit surface of the optical integrator 6 by using, for example, the diffraction optical element 4 and the polarization conversion element 5. The exposure light beam EL, which is emitted from the secondary light source 7, is converted by the illumination system IL by the aperture diaphragm 8 into the exposure light beam EL mainly containing the S-polarized light component and the P-polarized light component. After that, the exposure light beam EL is allowed to come into the splitting optical system 13. The first mask M1 is subjected to the dipole illumination (two-spot illumination) with the first exposure light beam EL1 in the S-polarization state, and the second mask M2 is subjected to the dipole illumination (two-spot illumination) with the second exposure light beam EL2 in the P-polarization state. Here, it is allowable to adopt the following manner that, for example, a diffraction optical element for the cross-pole illumination (four-spot illumination) is used as the diffraction optical element, and the diffraction optical element for the cross-pole illumination is arranged on the optical path for the exposure light beam EL. Accordingly, the first mask M1 can be subjected to the dipole illumination with the first exposure light beam EL1 in the S-polarization state, and the second mask M2 can be subjected to the dipole illumination with the second exposure light beam EL2 in the P-polarization state without providing the aperture diaphragm. When the diffraction optical element for the cross-pole illumination is provided on the optical path for the exposure light beam EL, then the four-spot illumination area is formed on the light-incident surface of the optical integrator 6, and the four-spot secondary light source is formed on the light-exit surface of the optical integrator 6. When the basic elements 5A, 5C, which have been explained with reference to FIG. 2, are provided as the polarization conversion elements, for example, at the positions corresponding to the four-spot illumination areas in the vicinity of the light-incident surface of the optical integrator 6, then the four-spot secondary light source 7 is formed on the side of the light-exit surface of the optical integrator 6 as schematically shown in FIG. 8. In this case, the exposure light beam EL, which is emitted from a first circular arc-shaped area 7A, is the exposure light beam EL in the S-polarization state. The exposure light beam EL, which is emitted from a third circular arc-shaped area 7C, is the exposure light beam EL in the P-polarization state. When the construction as described above is adopted, the exposure light beam EL, which mainly contains the S-polarized light component and the P-polarized light component, arrives at the splitting optical system 13, even when the aperture diaphragm is omitted. The first pattern PA1 of the first mask M1 is subjected to the dipole illumination with the first exposure light beam EL1 in the S-polarization state, and the second pattern PA2 of the second mask M2 is subjected to the dipole illumination with the second exposure light beam EL2 in the P-polarization state.

Next, the mask stage 60 will be explained. The mask stage 60 is capable of moving the first mask M1 having the first pattern PA1 in the Y axis direction with respect to the first exposure light beam EL1, and the mask stage 60 is capable of moving the second mask M2 having the second pattern PA2 in the Y axis direction with respect to the second exposure light beam EL2. The position information about the mask stage 60 is measured by the measuring system 70.

Figure 9:
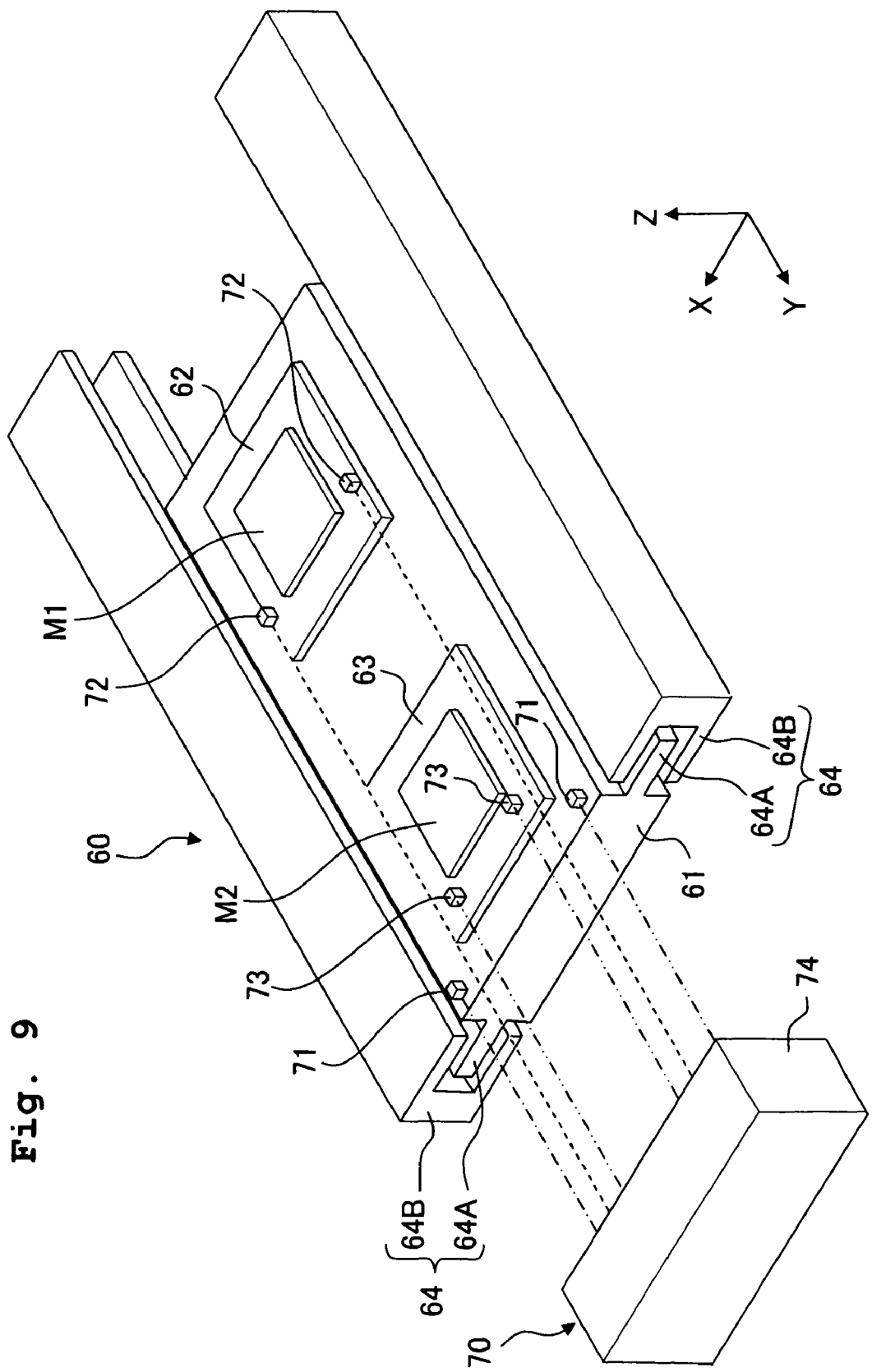
FIG. 9 shows a perspective view illustrating an example of a mask stage.

FIG. 9 shows a perspective view illustrating the mask stage 60 and the measuring system 70 according to this embodiment. The mask stage 60 includes a main stage 61, a first substage 62 which is movable on the main stage 61 in a state in which the first mask M1 is held thereon, and a second substage 63 which is movable on the main stage 61 in a state in which the second mask M2 is held thereon.

The main stage 61 is provided to move the first mask M1 and the second mask M2 in the Y axis direction. The main stage 61 holds the first mask M1 via the first substage 62, and the main stage 61 holds the second mask M2 via the second substage 63. The main stage 61 is movable in a same scanning direction (Y axis direction) while holding the first mask M1 and the second mask M2 via the first substage 62 and the second substage 63, respectively.

The main stage 61 has a relatively large stroke in the Y axis direction so that the entire first pattern PA1 of the first mask M1 is allowed to pass across the first illumination area IA1 and that the entire second pattern PA2 of the second mask M2 is allowed to pass across the second illumination area IA2 during the scanning exposure for one shot area on the substrate P. The mask stage 60 includes a main stage-driving unit 64 for moving the main stage 61 in the Y axis direction. The main stage-driving unit 64 includes, for example, an actuator such as a linear motor. In this embodiment, the main stage-driving unit 64 includes movers 64A which are provided on the both sides of the main stage 61 in the X axis direction, and stators 64B which are provided corresponding to the movers 64A. The control unit 30 is capable of moving the main stage 61 in the Y axis direction by driving the main stage-driving unit 64. When the main stage 61 is moved in the Y axis direction, the first and second substages 62, 63 respectively on the main stage 61 are also moved together with the main stage 61. Therefore, when the main stage 61 is moved in the Y axis direction, the first and second masks M1, M2, which are held by the first and second substages 62, 63, are also moved together with the main stage 61.

The first substage 62 is provided movably with respect to the main stage 61 in the X axis direction, the Y axis direction, and the θZ direction on the main stage 61. The first mask M1 is finely movable with respect to the main stage 61 by an unillustrated first substage-driving unit. Similarly, the second substage 63 is provided movably with respect to the main stage 61 in the X axis direction, the Y axis direction, and the θZ direction on the main stage 61. The second mask M2 is finely movable with respect to the main stage 61 by an unillustrated second substage-driving unit. A structure, which is disclosed, for example, in Japanese Patent Application Laid-open No. 8-130179 (corresponding to U.S. Pat. No. 6,721,034), may be adopted for the first and second substages 62, 63.

The measuring system 70 is capable of measuring the position information about each of the main stage 61, the first substage 62, and the second substage 63. The measuring system 70 includes reflecting members 71 which are provided on the main stage 61, reflecting members 72 which are provided on the first substage 62, reflecting members 73 which are provided on the second substage 63, and a laser interferometer 74 which radiates measuring beams onto reflecting surfaces of the reflecting members 71, 72, 73 and which receives the reflected light beams to obtain the position informations about the main stage 61, the first substage 62, and the second substage 63 respectively. In this embodiment, the laser interferometer 74 is arranged on the +Y side of the mask stage 60. The reflecting member 71 includes, for example, a corner cube mirror (retroreflector). Two pieces of the reflecting members 74 are provided at predetermined positions on the main stage 61 at which the measuring beams from the laser interferometer 74 can be radiated. The reflecting member 72 also includes, for example, a corner cube mirror (retroreflector). Two pieces of the reflecting members 72 are provided at predetermined positions on the first substage 62 at which the measuring beams from the laser interferometer 74 can be radiated. The reflecting member 73 also includes, for example, a corner cube mirror (retroreflector). Two pieces of the reflecting members 73 are provided at predetermined positions on the second substage 63 at which the measuring beams from the laser interferometer 74 can be radiated. The measuring system 70 is capable of measuring the position information in the Y axis direction and the θZ direction about the main stage 61, the first substage 62, and the second substage 63 by using the laser interferometer 74 and the reflecting members 71, 72, 73. Although not shown, the measuring system 70 is also provided with a laser interferometer and reflecting members (reflecting surfaces) which measure the position informations in the X axis direction about the main stage 61, the first substage 62, and the second substage 63.

The measuring system 70 measures the position information of the main stage 61 in relation to the X axis direction, the Y axis direction, and the θZ direction by using the laser interferometer 74, the reflecting members 71 provided on the main stage 61 and the like. The measuring system 70 measures the position information of the first and second substages 62, 63 in relation to the X axis direction, the Y axis direction, and the θZ direction by using the laser interferometer 74, the reflecting members 72, 73 provided on the first and second substages 62, 63, and the like. The control unit 30 appropriately drives the main stage 61, the first substage 62, and the second substage 63 on the basis of the measurement result of the measuring system 70 to control the positions of the first and second masks M1, M2 held by the first and second substages 62, 63. The control unit 30 moves at least one of the first substage 62 and the second substage 63 with respect to the main stage 61, to thereby make it possible to adjust the relative positional relationship between the first mask M1 and the second mask M2.

Next, the projection optical system PL will be explained with reference to FIG. 1. The projection optical system PL projects, at a predetermined projection magnification onto the substrate P, an image of the first pattern PA1 of the first mask M1 illuminated with the first exposure light beam EL1 and an image of the second pattern PA2 of the second mask M2 illuminated with the second exposure light beam EL2. The projection optical system PL of this embodiment is a reduction system having its projection magnification which is, for example, ¼, ⅕, ⅛ or the like. The projection optical system PL of this embodiment forms an inverted image.

As shown in FIG. 1, the projection optical system PL of this embodiment has a plurality of optical elements including one final (last) optical element FL which is arranged opposite to a surface of the substrate P and which is closest to an image plane of the projection optical system PL. The first exposure light beam EL1 and the second exposure light beam EL2 are radiated onto the first exposure area AR1 and the second exposure area AR2 via the single final optical element FL.

The projection optical system PL has an intermediate optical member 40 which is arranged in the vicinity of a position optically conjugate with the first exposure area AR1 and the second exposure area AR2 and which guides, to the final optical element FL, the first exposure light beam EL1 from the first pattern PA1 of the first mask M1 and the second exposure light beam EL2 from the second pattern PA2 of the second mask M2. The projection optical system PL has a first guiding optical system 41 which guides the first exposure light beam EL1 from the first pattern PA1 of the first mask M1 to the intermediate optical member 40, and a second guiding optical system 42 which guides the second exposure light beam EL2 from the second pattern PA2 of the second mask M2 to the intermediate optical member 40. Each of the first and second guiding optical systems 41, 42 includes a plurality of lenses, and a reflecting member which has a reflecting surface for reflecting one of the first and second exposure light beams EL1, EL2 allowed to pass through the plurality of lenses, toward the intermediate optical member 40.

The intermediate optical member 40 has a first reflecting surface 40A which reflects the first exposure light beam EL1 from the first guiding optical system 41, and a second reflecting surface 40B which reflects the second exposure light beam EL2 from the second guiding optical system 42. In this embodiment, the intermediate optical member 40 includes a prism.

The first exposure light beam EL1 from the first pattern PA1 of the first mask M1 and the second exposure light beam EL2 from the second pattern PA2 of the second mask M2 are guided to the intermediate optical member 40 by the first guiding optical system 41 and the second guiding optical system 42. The first exposure light beam EL1 from the first pattern PA1 of the first mask M1 and the second exposure light beam EL2 from the second pattern PA2 of the second mask M2 are reflected by the intermediate optical member 40, and then the first and second exposure light beams EL1 and EL2 are radiated onto the first exposure area AR1 and the second exposure area AR2 respectively via a third guiding optical system 43 which is arranged on a side of the image plane of the projection optical system PL and which includes the final optical element FL.

Next, the substrate stage 80 will be explained. The substrate stage 80 is movable while holding the substrate P in a predetermined area including the first exposure area AR1 and the second exposure area AR2 onto which the first exposure light beam EL1 and the second exposure light beam EL2 are radiated. The substrate stage 80 has a substrate holder for holding the substrate P. The substrate stage 80 is movable on the base member BP in the directions of six degrees of freedom of the X axis, Y axis, Z axis, θX, θY, and θZ directions in a state in which the substrate P is held by a substrate holder in accordance with the driving operation of a substrate stage-driving unit 80D including an actuator such as a linear motor.

The position information of the substrate stage 80 (as well as the substrate P) is measured by a laser interferometer 75 of the measuring system 70. The laser interferometer 75 measures the position information about the substrate stage 80 in relation to the X axis direction, the Y axis direction, and the θZ direction by using a reflecting mirror 76 provided on the substrate stage 80. The surface position information (position information in relation to the Z axis direction, the θX direction, and the θY direction) of the surface of the substrate P held by the substrate stage 80 is detected by an unillustrated focus/leveling-detecting system. The control unit 30 drives the substrate stage-driving unit 80D on the basis of the result of the measurement performed by the laser interferometer 75 and the result of the detection performed by the focus/leveling-detecting system to control the position of the substrate P held by the substrate stage 80. The focus/leveling-detecting system measures the position information of the substrate P in the Z axis direction at a plurality of measuring points to detect the surface position information of the substrate P. In this embodiment, at least a part or parts of the plurality of measuring points are set in the first and second exposure areas AR1, AR2. However, for example, in the case of a liquid immersion exposure apparatus of an eighth embodiment described later on (FIG. 21), all of the measuring points may be set outside the first and second exposure areas AR1, AR2 (or the liquid immersion area LR). It is also allowable that the laser interferometer 75 is capable of measuring the position information of the substrate stage 80 in the Z axis direction, the θX direction, and the θY direction as well. Details thereof are disclosed, for example, in Published Japanese Translation of PCT International Publication for Patent Application No. 2001-510577 (corresponding to International Publication No. 1999/28790). In this case, it is also allowable that the focus/leveling-detecting system is not provided.

Figure 10:
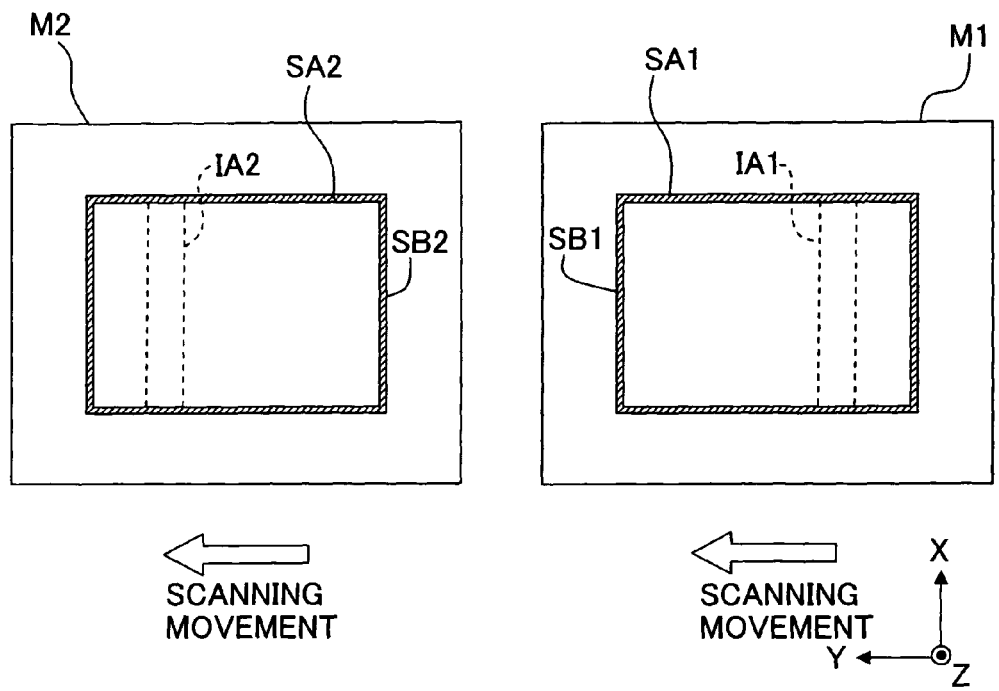
FIG. 10 illustrates an exposure method according to the first embodiment, which schematically shows the relationship between the first and second masks and the first and second illumination areas.
Figure 11:
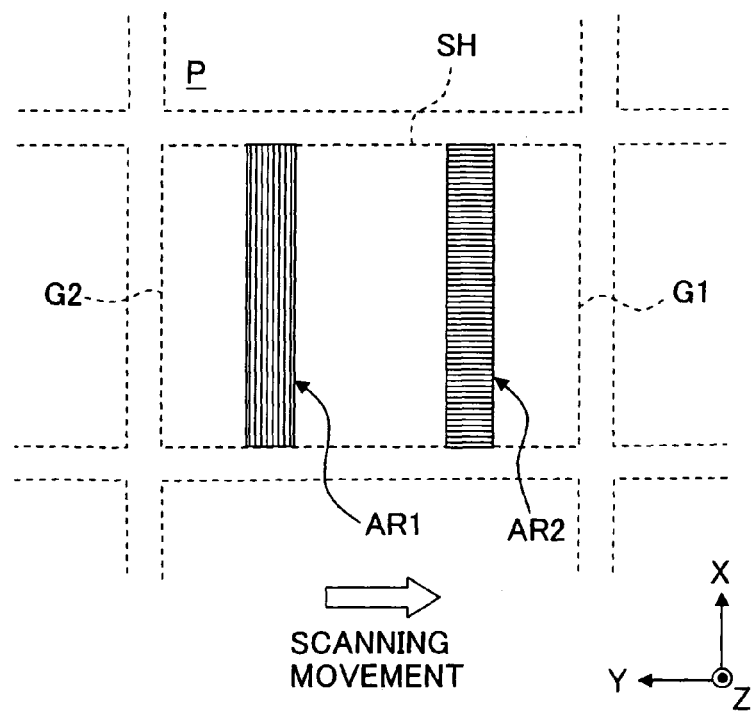
FIG. 11 illustrates the exposure method according to the first embodiment, which schematically shows the relationship between the substrate and the first and second exposure areas.

FIG. 10 schematically shows a relationship between the first illumination area IA1 and the second illumination area IA2 and the first mask M1 and the second mask M2. FIG. 11 schematically shows a relationship between the first exposure area AR1 and the second exposure area AR2 and a shot area SH as the exposure-objective area on the substrate P. In this embodiment, the first exposure area AR1 onto which the first exposure light beam EL1 is radiated and the second exposure area AR2 onto which the second exposure light beam EL2 is radiated are the projection areas of the projection optical system PL.

The optical unit U, which includes the illumination system IL and the projection optical system PL, radiates the first exposure light beam EL1 from the first pattern PA1 onto the first exposure area AR1, and the optical unit U radiates the second exposure light beam EL2 from the second pattern PA2 onto the second exposure area AR2. The illumination system IL radiates the first exposure light beam EL1 from the first pattern PA1 onto the first exposure area AR1 via the projection optical system PL, and the illumination system IL radiates the second exposure light beam EL2 from the second pattern PA2 onto the second exposure area AR2 via the projection optical system PL. The projection optical system PL forms the image of the first pattern PA1 with the first exposure light beam EL1 radiated onto the first exposure area AR1, and forms the image of the second pattern PA2 with the second exposure light beam EL2 radiated onto the second exposure area AR2.

The control unit 30 radiates the first exposure light beam EL1 and the second exposure light beam EL2 onto the first exposure area AR1 and the second exposure area AR2 respectively by the optical unit U including the illumination system IL and the projection optical system PL while moving the shot area SH on the substrate P in the Y axis direction with respect to the first exposure area AR1 and the second exposure area AR2 by using the substrate stage 80 in synchronization with the movement of the first mask M1 and the second mask M2 in the Y axis direction effected by the mask stage 60 with respect to the first illumination area IA1 and the second illumination area IA2. Accordingly, the shot area SH on the substrate P is subjected to the multiple exposure (double exposure) with the image of the first pattern PA1 formed with the first exposure light beam EL1 radiated onto the first exposure area AR1 and the image of the second pattern PA2 formed with the second exposure light beam EL2 radiated onto the second exposure area AR2.

That is, in this embodiment, the control unit 30 synchronously performs the movement of the substrate P in the Y axis direction with respect to the first and second exposure areas AR1, AR2, the movement of the first mask M1 in the Y axis direction with respect to the first illumination area IA1, and the movement of the second mask M2 in the Y axis direction with respect to the second illumination area IA2. Accordingly, the first exposure light beam EL1 and the second exposure light beam EL2, which are patterned, are radiated onto the first exposure area AR1 and the second exposure area AR2 respectively to perform the multiple exposure for the shot area SH on the substrate P.

As shown in FIG. 10, in this embodiment, the first mask M1 and the second mask M2 are arranged and aligned in the Y axis direction. The first mask M1 is arranged on the −Y side with respect to the second mask M2. The first illumination area IA1, which is brought about by the first exposure light beam EL1 on the first mask M1, is set to have a rectangular shape (slit-shaped form) in which the X axis direction is the longitudinal direction. The second illumination area IA2, which is brought about by the second exposure light beam EL2 on the second mask M2, is also set to have a rectangular shape (slit-shaped form) in which the X axis direction is the longitudinal direction. The first illumination area IA1 and the second illumination area IA2 are defined by the fixed blind 9 of the blind unit 11. The fixed blind 9 has the rectangular (slit-shaped) aperture (light passing area) for defining the first and second illumination areas IA1, IA2 on the first and second masks M1, M2. The fixed blind 9 is arranged at the position (slightly defocused position) separated and away by a predetermined distance from the surface conjugate with the pattern formation surfaces on which the first and second patterns PA1, PA2 of the first and second masks M1, M2 are formed. As described later on, the first illumination area IA1 and the second illumination area IA2 are restricted at a predetermined timing by the movable blind 10 of the blind unit 11.

As shown in FIG. 11, in this embodiment, the first exposure area AR1 and the second exposure area AR2 are set at the different positions in the Y axis direction. The substrate stage 80 is capable of moving the shot area SH on the held substrate P in the Y axis direction with respect to the first exposure area AR1 and the second exposure area AR2. The first exposure area AR1 and the second exposure area AR2 are rectangular (slit-shaped) respectively, wherein the X axis direction is the longitudinal direction. The first exposure area AR1 and the second exposure area AR2 can be simultaneously arranged in one shot area SH. That is, in this embodiment, the distance between the first exposure area AR1 (center of the first exposure area AR1) and the second exposure area AR2 (center of the second exposure area AR2) in the Y axis direction is smaller than the width of one shot area SH on the substrate P in the Y axis direction. In this embodiment, the first exposure area AR1 and the second exposure area AR2 are separated and away from each other in the Y axis direction. The first exposure area AR1 is set on the +Y side with respect to the second exposure area AR2.

The control unit 30 moves each of the first mask M1 having the first pattern PA1 and the second mask M2 having the second pattern PA2 each in the scanning direction (Y axis direction) thereof during the exposure for the shot area SH on the substrate P, and the control unit 30 moves the substrate P in the scanning direction (Y axis direction). In this embodiment, the control unit 30 illuminates the first pattern PA1 of the first mask M1 and the second pattern PA2 of the second mask M2 with the first exposure light beam EL1 and the second exposure light beam EL2 respectively while moving the first mask M1 having the first pattern PA1 and the second mask M2 having the second pattern PA2 in the same scanning direction (Y axis direction) by using the mask stage 60 during the exposure for the shot area SH on the substrate P. The first mask M1 and the second mask M2 are placed on the main stage 61. The control unit 30 drives the main stage 61 by using the main stage-driving unit 64. Accordingly, the first mask M1 and the second mask M2 are moved in the same scanning direction (Y axis direction). For example, when the first mask M1 is moved in the +Y direction by the main stage 61 of the mask stage 60 during the exposure for the shot area SH on the substrate P, the second mask M2 is also moved together in the +Y direction. When the first mask M1 is moved in the −Y direction, the second mask M2 is also moved together in the −Y direction. The projection optical system PL of this embodiment forms the inverted image. The control unit 30 moves the first and second masks M1, M2 and the substrate P in the mutually opposite scanning directions (Y axis directions) during the exposure for the shot area SH on the substrate P. For example, when the first and second masks M1, M2 are moved in the +Y direction by using the mask stage 60, the control unit 30 moves the substrate P in the −Y direction by using the substrate stage 80; and when the first and second masks M1, M2 are moved in the −Y direction, the control unit 30 moves the substrate P in the +Y direction.

FIGS. 10 and 11 show a state in which the substrate P is moved in the −Y direction in synchronization with the movement of the first and second masks M1, M2 in the +Y direction during the exposure for the shot area SH on the substrate P.

The relative positional relationship between the first exposure area AR1 and the second exposure area AR2 is determined depending on, for example, the projection magnification of the projection optical system PL and the arrangement of the respective optical elements for constructing the projection optical system PL including, for example, the intermediate optical member 40. The position of the first mask M1 with respect to the first illumination area IA1 brought about by the first exposure light beam EL1 and the position of second mask M2 with respect to the second illumination area IA2 brought about by the second exposure light beam EL2, in other words, the relative positional relationship between the first mask M1 and the second mask M2 on the basis of the first and second exposure light beams EL1, EL2 is determined depending on the position information about the first exposure area AR1 and the second exposure area AR2 with respect to the shot area SH on the substrate P, i.e., the position information about the first exposure area AR1 and the second exposure area AR2 in the XY coordinate system defined by the laser interferometer 75.

As described above, in this embodiment, the first exposure area AR1 and the second exposure area AR2 are set on the substrate P at the different positions in the scanning direction (Y axis direction) of the substrate P. The first exposure area AR1 is set on the +Y side with respect to the second exposure area AR2. The first mask M1 and the second mask M2 are moved in the same scanning direction (Y axis direction). The projection optical system PL of this embodiment forms the inverted image, and the first and second masks M1, M2 and the substrate P are moved in the mutually opposite scanning directions (Y axis directions). Therefore, in this embodiment, as shown in FIG. 10, the first mask M1 is arranged on the −Y side with respect to the second mask M2, and the first illumination area IA1 brought about by the first exposure light beam EL1 and the second illumination area IA2 brought about by the second exposure light beam EL2 are set at the mutually different positions with respect to the respective centers of the first and second masks M1, M2. In other words, by setting the positions on the first and second masks M1, M2 in relation to the first and second illumination areas IA1, IA2, for example, as shown in FIG. 10 depending on the positional relationship between the first and second exposure areas AR1, AR2, the shot area SH on the substrate P can be subjected to the multiple exposure with the image of the first pattern PA1 and the image of the second pattern PA2 in the desired positional relationship.

In this embodiment, when the shot area SH on the substrate P is subjected to the exposure, the control unit 30 is operated such that one of the illumination for the first pattern PA1 with the first exposure light beam EL1 and the illumination for the second pattern PA2 with the second exposure light beam EL2 is started and then the other of the illuminations is started, and one of the illuminations is completed and then the other of the illuminations is completed. Further, the control unit 30 is operated such that one of the radiation of the first exposure light beam EL1 onto the shot area SH (projection of the image of the first pattern PA1 by the first exposure light beam EL1) and the radiation of the second exposure light beam EL2 onto the shot area SH (projection of the image of the second pattern PA2 by the second exposure light beam EL2) is started and then the other of the radiations is started, and one of the radiations is completed and the other of the radiations is completed.

In this embodiment, the control unit 30 uses the movable blind 10 of the blind unit 11 to shield any unnecessary radiation of the first and second exposure light beams EL1, EL2 for a portion or portions other than the first and second pattern formation areas SA1, SA2 of the first and second masks M1, M2 on which the first and second patterns PA1, PA2 are formed, thereby avoiding any unnecessary exposure of the substrate P with the first exposure light beam EL1 and the second exposure light beam EL2. A first light-shielding zone SB1 is provided at the outer circumference of the first pattern formation area SA1 of the first mask M1, and a second light-shielding zone SB2 is provided at the outer circumference of the second pattern formation area SA2 of the second mask M2. In order to avoid any unnecessary exposure of the substrate P with the first exposure light beam EL1 and the second exposure light beam EL2, the movable blind 10 shields the radiation of the first and second exposure light beams EL1, EL2 onto the outside of the first and second light-shielding zones SB1, SB2 of the first and second masks M1, M2. The movable blind 10 is arranged on the plane which is substantially conjugate with the pattern formation surfaces of the first and second masks M1, M2, and the movable blind 10 is provided movably in synchronization with the movement of at least one of the first mask M1 having the first pattern PA1, the second mask M2 having the second pattern PA2, and the substrate P, between the light source unit 1 and the splitting optical system 13.

Figure 12:
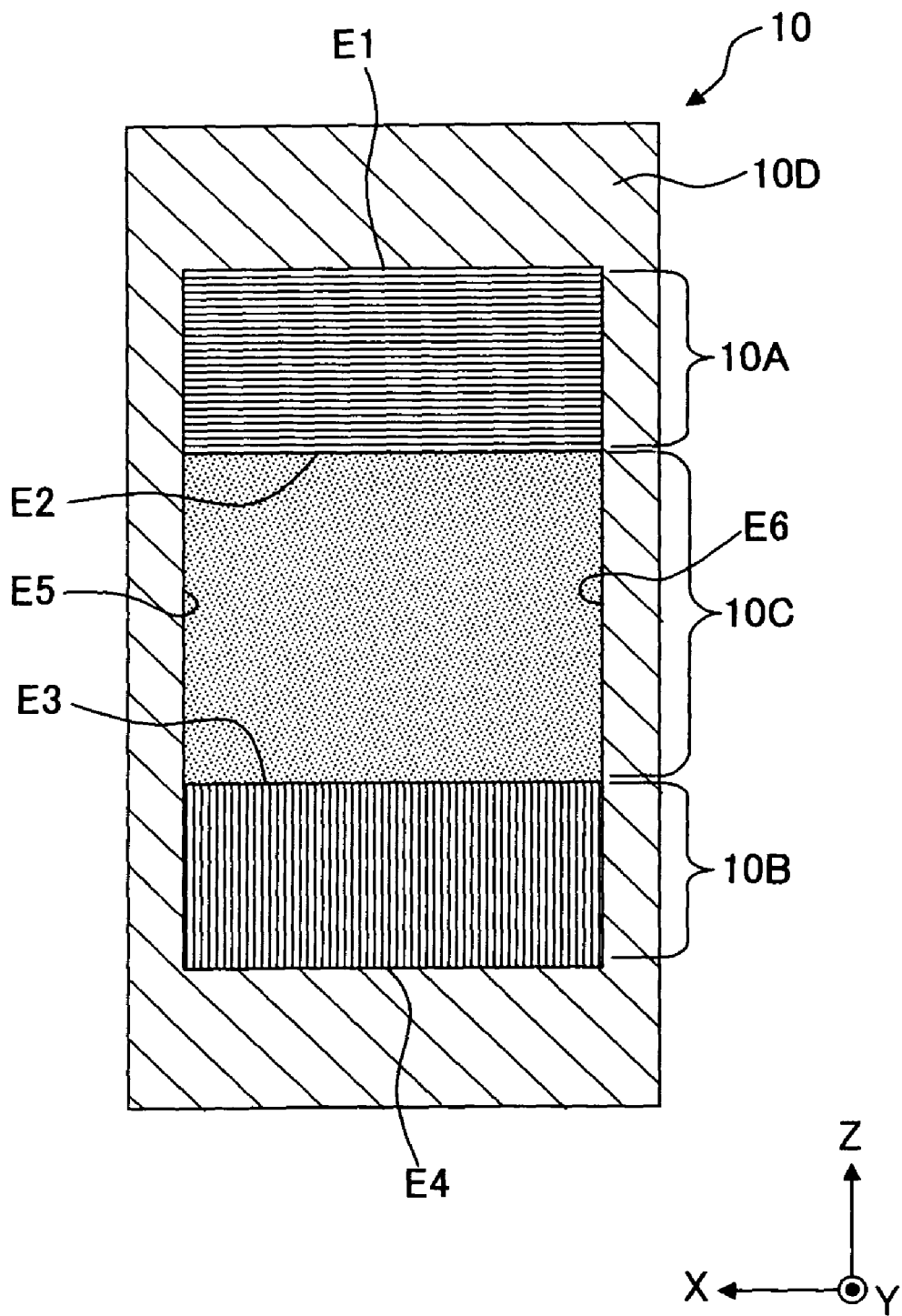
FIG. 12 illustrates an example of a movable blind according to the first embodiment.

FIG. 12 shows an example of the movable blind 10. With reference to FIG. 12, the movable blind 10 includes a first passing area 10A through which the first exposure light beam EL1 in the S-polarization state is allowed to pass, a second passing area 10B through which the second exposure light beam EL2 in the P-polarization state is allowed to pass, and a third passing area 10C through which the first exposure light beam EL1 and the second exposure light beam EL2 are allowed to pass. The first, second, and third passing areas 10A, 10B, 10C are arranged and aligned in the direction corresponding to the scanning direction of the first mask M1 having the first pattern PA1 and the second mask M2 having the second pattern PA2. In this embodiment, the first, second, and third passing areas 10A, 10B, 10C are arranged and aligned in the Z axis direction as shown in FIG. 12. The third passing area 10C is provided between the first passing area 10A and the second passing area 10B.

Each of the first, second, and third passing areas 10A, 10B, 10C is formed of an optical member through which a predetermined light beam is transmissive. The first passing area 10A is formed of an optical member including a polarization element through which the first exposure light beam EL1 in the S-polarization state is allowed to pass and through which the light (exposure light beam) in any other polarization state including the P-polarization state is hardly allowed to pass. The second passing area 10B is formed of an optical member including a polarization element through which the second exposure light beam EL2 in the P-polarization state is allowed to pass and through which the light (exposure light beam) in any other polarization state including the S-polarization state is hardly allowed to pass. The third passing area 10C is formed of an optical member through which each of the first exposure light beam EL1 in the S-polarization state and the second exposure light beam EL2 in the P-polarization state are allowed to pass. The optical members are supported by a support member 10D made of, for example, metal. The light (exposure light beam) is not allowed to pass through the support member 10D. The blind unit 11 is provided with a driving unit such as a linear motor which is capable of moving the movable blind 10. The control unit 30 is capable of moving the movable blind 10 substantially in the Z axis direction (direction corresponding to the scanning direction (Y axis direction) of the first and second masks M1, M2) in FIG. 12 by using the driving unit. Further, the blind unit 11 is provided with a position-detecting unit such as an encoder which is capable of detecting the position of the movable blind 10. The control unit 30 is capable of monitoring the detection result obtained by the position-detecting unit.

The control unit 30 avoids any unnecessary exposure for the substrate P with the first exposure light beam EL1 and the second exposure light beam EL2 by shielding any unnecessary radiations of the first and second exposure light beams EL1, EL2 onto the portions other than the first and second pattern formation areas SA1, SA2 of the first and second masks M1, M2 by moving the movable blind 10 in synchronization with the movement of the first and second masks M1, M2 while monitoring the detection result of the position-detecting unit as described above, if necessary, on the basis of the measurement result of the laser interferometer 74 of the measuring system 70 before the start of the scanning exposure, during the scanning exposure, and after the completion of the scanning exposure for the shot area SH on the substrate P.

In the following description, an edge of the first passing area 10A on the +Z side in FIG. 12, i.e., the boundary between the first passing area 10A and the support member 10D is appropriately referred to as "first edge E1". An edge of the first passing area 10A on the −Z side, i.e., the boundary between the first passing area 10A and the third passing area 10C is appropriately referred to as "second edge E2". An edge of the third passing area 10C on the −Z side, i.e., the boundary between the third passing area 10C and the second passing area 10B is appropriately referred to as "third edge E3". An edge of the second passing area 10B on the −Z side, i.e., the boundary between the second passing area 10B and the support member 10D is appropriately referred to as "fourth edge E4". Edges of the first, second, and third passing areas 10A, 10B, 10C on the +X side are each appropriately referred to as "fifth edge E5". Edges of the first, second, and third passing areas 10A, 10B, 10C on the −X side are each appropriately referred to as "sixth edge E6".

Figure 13:
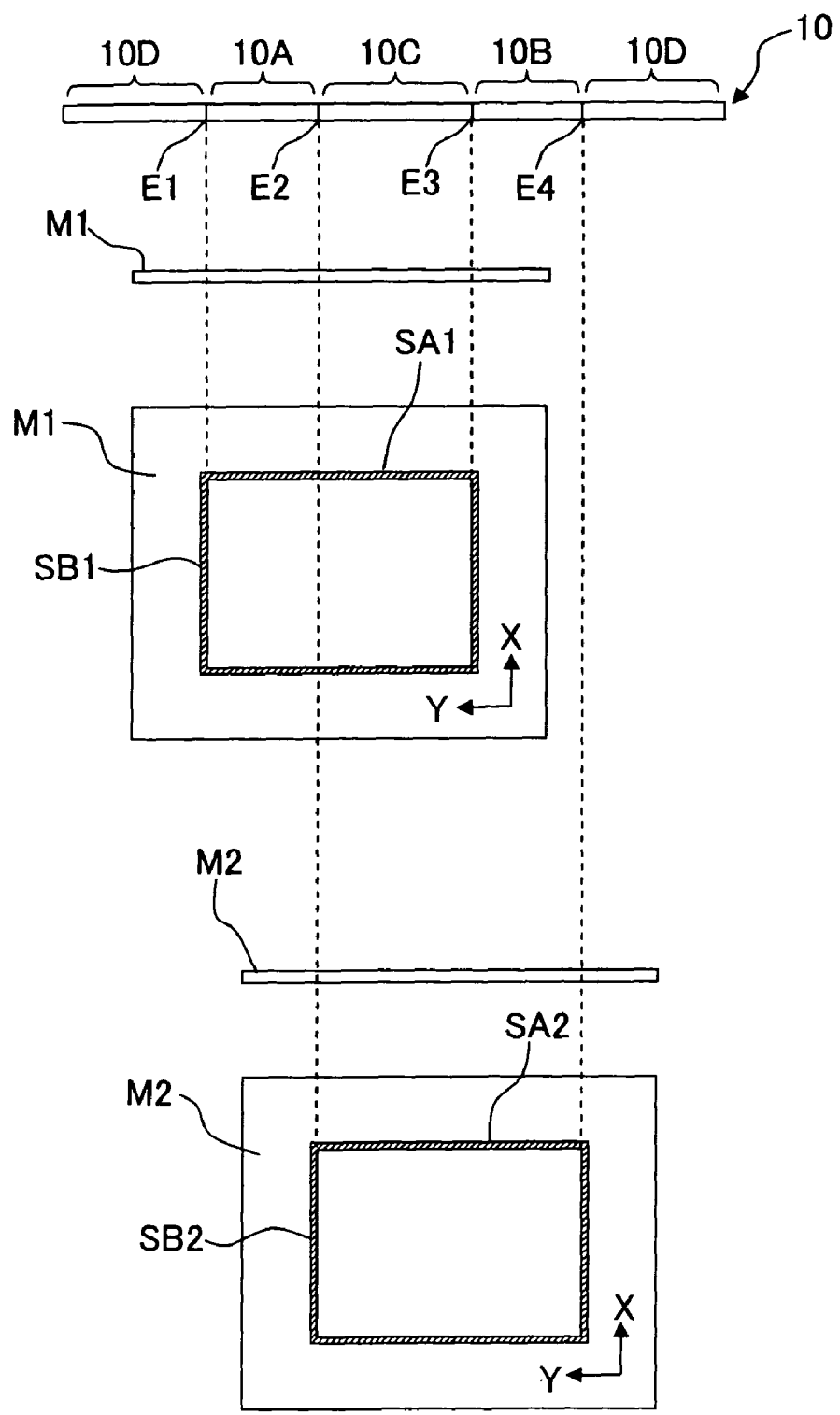
FIG. 13 schematically illustrates function of the movable blind.

FIG. 13 schematically shows the relationship between the movable blind 10 and the first and second pattern formation areas SA1, SA2 of the first and second masks M1, M2. In order to avoid any unnecessary exposure of the substrate P with the first exposure light beam EL1 and the second exposure light beam EL2, the movable blind 10 shields the radiations of the first and second exposure light beams EL1, EL2 onto the outside of the first and second light-shielding zones SB1, SB2 of the first and second masks M1, M2.

The first passing area 10A and the third passing area 10C are light passing areas for allowing the first exposure light beam EL1 in the S-polarization state to pass therethrough, and have the size corresponding to the first pattern formation area SA1 surrounded by the first light-shielding zone SB1 on the first mask M1. The second passing area 10B and the third passing area 10C are light passing areas for allowing the second exposure light beam EL2 in the P-polarization state to pass therethrough, and have the size corresponding to the second pattern formation area SA2 surrounded by the second light-shielding zone SB2 on the second mask M2. That is, the movable blind 10 includes, in an overlapping form in the predetermined range (third passing area 10C), the light passing area corresponding to the first pattern formation area SA1 and the light passing area corresponding to the second pattern formation area SA2.

When the first pattern PA1 is arranged at a scanning start position in order to illuminate the first pattern PA1 of the first mask M1 with the first exposure light beam EL1, the control unit 30 adjusts the positional relationship between the first mask M1 and the movable blind 10 so that the images of the first edge E1 and the third edge E3 are accommodated in the first light-shielding zone SB1 provided on the +Y side and the −Y side of the first pattern formation area SA1 when it is assumed that the images of the first edge E1 and the third edge E3 of the movable blind 10 are projected onto the first mask M1. When the assumption is made similarly, the adjustment is effected so that the images of the fifth edge E5 and the sixth edge E6 of the movable blind 10 are accommodated in the first light-shielding-zone SB1 provided on the +X side and the −X side of the first pattern formation area SA1. By synchronously moving the first mask M1 and the movable blind 10 while maintaining the positional relationship between the first mask M1 and the movable blind 10, a part of the exposure light beam EL allowed to pass through the fixed blind 9 is especially shielded by the first edge E1 before the start of the scanning exposure. Thus, it is possible to avoid any unnecessary radiation of the first exposure light beam EL1 onto the portion other than the first pattern formation area SA1 and consequently any unnecessary exposure of the substrate P with the first exposure light beam EL1. In addition, since the movable blind 10 is also moved in synchronization with the movement of the first mask M1 during the scanning exposure, a part of the exposure light beam EL allowed to pass through the fixed blind 9 is especially shielded by the fifth edge E5 and the sixth edge E6. Thus, it is possible to avoid any unnecessary radiation of the first exposure light beam EL1 onto the portion other than the first pattern formation area SA1. Further, a part of the exposure light beam EL allowed to pass through the fixed blind 9 is also shielded by the movable blind 10 moving in synchronization with the first mask M1, especially by the third-edge E3 after the completion of the scanning exposure. Thus, it is possible to avoid any unnecessary radiation of the first exposure light beam EL1 onto the portion other than the first pattern formation area SA1 and consequently any unnecessary exposure of the substrate P with the first exposure light beam EL1.

The movement of the second mask M2 in the Y axis direction is started after the start of the movement of the first mask M1 in the Y axis direction. When the second pattern PA2 of the second mask M2 is arranged at the scanning start position, the setting is made so that the images of the second edge E2 and the fourth edge E4 are accommodated in the second light-shielding zone SB2 provided on the +Y side and the −Y side of the second pattern formation area SA2 when it is assumed that the images of the second edge E2 and the fourth edge E4 of the movable blind 10 are projected onto the second mask M2. When the assumption is made similarly, the adjustment is effected so that the images of the fifth edge E5 and the sixth edge E6 of the movable blind 10 are accommodated in the second light-shielding zone SB2 provided on the +X side and the −X side of the second pattern formation area SA2. By synchronously moving the second mask M2 and the movable blind 10 while maintaining the positional relationship between the second mask M2 and the movable blind 10, a part of the exposure light beam EL allowed to pass through the fixed blind 9 is especially shielded by the second edge E2 of the movable blind 10 before the start of the scanning exposure. Thus, it is possible to avoid any unnecessary radiation of the second exposure light beam EL2 onto the portion other than the second pattern formation area SA2 and consequently any unnecessary exposure of the substrate P with the second exposure light beam EL2. In addition, the movable blind 10 is also moved in synchronization with the movement of the second mask M2 during the scanning exposure. Therefore, a part of the exposure light beam EL allowed to pass through the fixed blind 9 is shielded by the fifth edge E5 and the sixth edge E6 of the movable blind 10. Thus, it is possible to avoid any unnecessary radiation of the second exposure light beam EL2 onto the portion other than the second pattern formation area SA2. Further, a part of the exposure light beam EL allowed to pass through the fixed blind 9 is also shielded by the movable blind 10 moving in synchronization with the second mask M1, especially by the third edge E3 after the completion of the scanning exposure. Thus, it is possible to avoid any unnecessary radiation of the second exposure light beam EL2 onto the portion other than the second pattern formation area SA2 and consequently any unnecessary exposure of the substrate P with the second exposure light beam EL2.

As described above, in this embodiment, the exposure light beam EL allowed to pass through the fixed blind 9 is restricted by using the movable blind 10 especially upon the start and the completion of the scanning exposure. Accordingly, it is possible to restrict the radiations of the first and second exposure light beams EL1, EL2 onto the first and second masks M1, M2, and it is thus possible to avoid any unnecessary exposure of the substrate P with the first exposure light beam EL1 and the second exposure light beam EL2.

In particular, in this embodiment, the movable blind 10 is provided with the first passing area 10A and the second passing area 10B, each of which is capable of allowing one of the exposure light beams EL1, ELS to pass therethrough and each of which is capable of substantially shielding the other of the exposure light beams EL1, ELS by utilizing the difference in the polarization state between the first exposure light beam EL1 and the second exposure light beam EL2. Therefore, even when the positional relationship between the first pattern formation area PA1 and the first illumination area IA1 is different from the positional relationship between the second pattern formation area PA2 and the second illumination area IA2, the single movable blind 10 can be used to reliably avoid any unnecessary exposure for the substrate P. Accordingly, it is possible to provide the compact illumination system of the exposure apparatus capable of performing the multiple exposure, and it is possible to reduce the apparatus cost.

In this embodiment, the third passing area 10C may be formed of an optical member which is capable of adjusting the intensity of the light allowed to pass therethrough, in order that the first exposure light beam EL1 allowed to pass through the first passing area 10A and the first exposure light beam EL1 allowed to pass through the third passing area 10C are radiated onto the substrate P at a same intensity, and that the second exposure light beam EL2 allowed to pass through the second passing area 10B and the second exposure light beam EL2 allowed to pass through the third passing area 10C are radiated onto the substrate P at a same intensity. In this case, the optical member of the third passing area 10C includes an optical member (filter member) capable of adjusting the transmittance, which may be, for example, an ND filter (neutral density filter) or the like. The first exposure light beam EL1 in the S-polarization state, which is emitted from the light source unit 1 and which is allowed to pass through the first optical system 2, passes through the first passing area 10A and the third passing area 10C of the movable blind 10, and is radiated onto the first mask M1 via the splitting optical system 13. The second exposure light beam EL2 in the P-polarization state passes through the second passing area 10B and the third passing area 10C of the movable blind 10, and is radiated onto the second mask M2 via the splitting optical system 13. In this case, when the first passing area 10A has a first transmittance, it is necessary that the transmittance of the third passing area 10C with respect to the first exposure light beam EL1 is set to have a value adapted to the first transmittance. Similarly, when the second passing area 10B has a second transmittance, it is necessary that the transmittance of the third passing area 10C with respect to the second exposure light beam EL2 is set to have a value adapted to the second transmittance. In this embodiment, the optical member, which has the function capable of adjusting the transmittance, is used as the optical member for the third passing area 10C. Accordingly, it is possible to allow the transmittance of the first passing area 11A to coincide with the transmittance of the third passing area 10C, and it is possible to allow the transmittance of the second passing area 10B to coincide with the transmittance of the third passing area 10C. Therefore, it is possible to provide a same value of the intensity on the substrate P for the first exposure light beam EL1 allowed to pass through the first passing area 10A and for the first exposure light beam EL1 allowed to pass through the third passing area 10C. Further, it is possible to provide a same value of the intensity on the substrate P for the second exposure light beam EL2 allowed to pass through the second passing area 10B and for the second exposure light beam EL2 allowed to pass through the third passing area 10C.

In the movable blind 10, the optical member forming the first passing area 10A and the optical member forming the second passing area 10B may be separated (detached) from the support member 10D on which the optical member forming the third passing area 10C is fixed so that the optical member forming the first passing area 10A and the optical member forming the second passing area 10B can be moved independently from each other. Accordingly, it is possible to change the positions in the Z axis direction of the second edge E2 and the third edge E3. Therefore, it is possible to change the size of the area through which the first exposure light beam EL1 is allowed to pass and the size of the area through which the second exposure light beam EL2 is allowed to pass. Therefore, even when the sizes of the first and second pattern formation areas PA1, PA2 on the first and second masks M1, M2 are changed and/or the relative positional relationship between the first mask M1 and the second mask M2 is changed upon performing the scanning exposure for the shot area SH, then it is possible to restrict the radiations of the first and second exposure light beams EL1, EL2 onto the first and second masks M1, M2 in response to the change, and it is possible to reliably avoid any unnecessary exposure of the substrate P. Of course, the movable blind 10 may be provided with a movable light-shielding member for adjusting the positions of the fifth and sixth edges E5, E6. When the first exposure light beam EL1 and the second exposure light beam EL2 are capable of passing through the first passing area 10A and the second passing area 10B by approximately 100% respectively, it is also allowable that the optical member is not provided for the third passing area 10C.

Next, an explanation will be made with reference to a flow chart shown in FIG. 22 about a method for exposing the substrate P by using the exposure apparatus EX constructed as described above.

As described above, in this embodiment, when the shot area SH of the substrate P is subjected to the exposure, the control unit 30 illuminates the first pattern PA1 and the second pattern PA2 with the first exposure light beam EL1 and the second exposure light beam EL2 respectively while moving the first mask M1 and the second mask M2 in a same scanning direction (for example, in the +Y direction) by using the mask stage 60. The control unit 30 moves the shot area SH on the substrate P in a scanning direction (for example, in the −Y direction) opposite to that of the first and second masks M1, M2 by using the substrate stage 80 in synchronization with the movement of the mask stage 60 in the predetermined scanning direction.

The following description will be made as exemplified by a case in which the shot area SH on the substrate P is subjected to the exposure while moving the shot area SH on the substrate P in the −Y direction by using the substrate stage 80 with respect to the first exposure area AR1 and the second exposure area AR2 in synchronization with the movement of the first mask M1 and the second mask M2 in the +Y direction by the mask stage 60.

At first, the control unit 30 determines a movement velocity (scanning velocity) of the substrate stage 80 when the shot area SH on the substrate P is exposed, on the basis of, for example, the sensitivity of photosensitive material of the substrate P before starting the exposure for the substrate P. Further, the control unit 30 determines a movement velocity (scanning velocity) of the mask stage 60 (main stage 61) on the basis of the projection magnification of the projection optical system PL and a scanning velocity of the substrate P. The storage unit 31 previously stores the positional information about each of the first exposure area AR1 and the second exposure area AR2 in the XY coordinate system defined by the laser interferometer 75.

Figure 22:
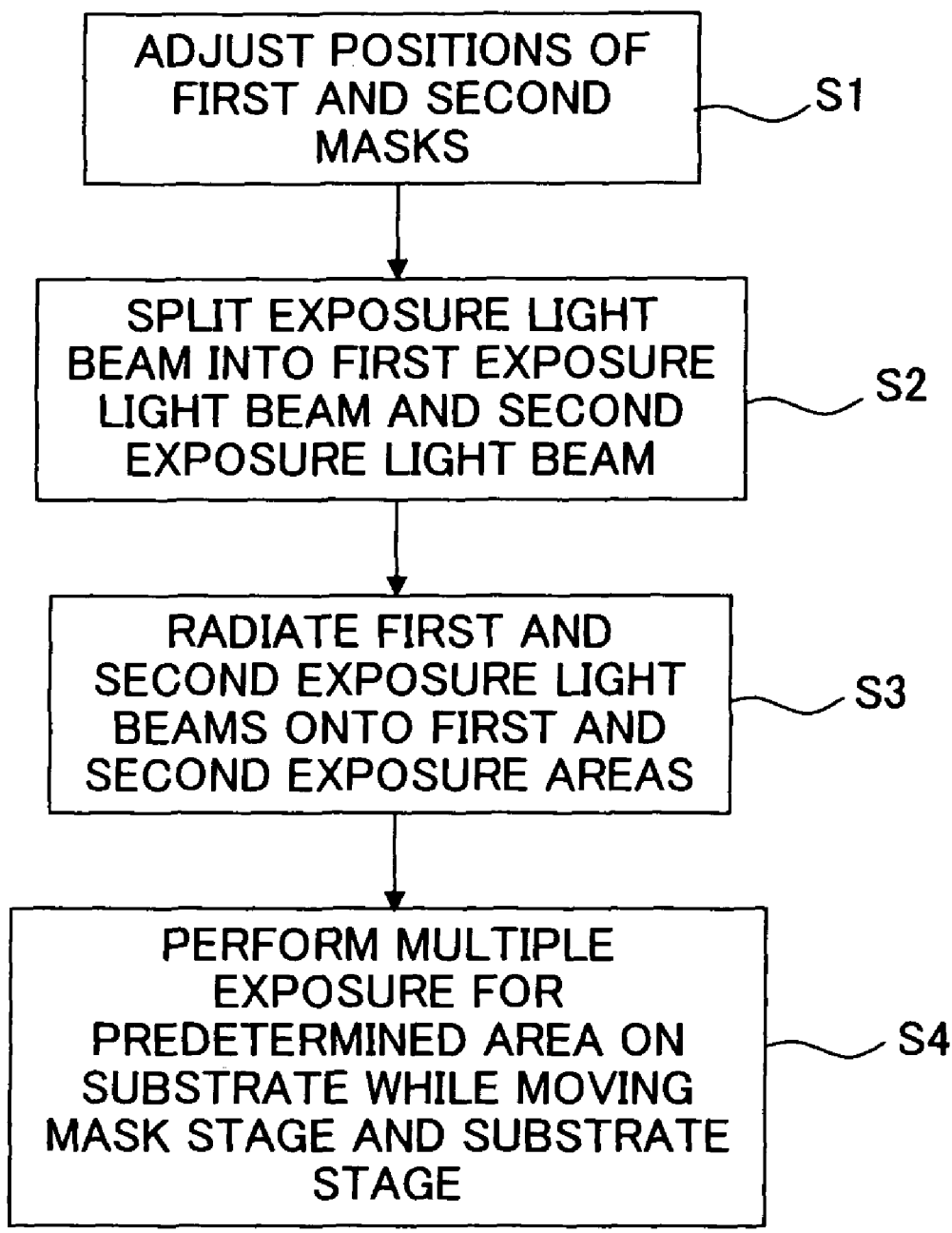
FIG. 22 shows a flow chart illustrating a method for exposing the substrate by using the exposure apparatus of the first embodiment.

The control unit 30 adjusts the respective positions of the first mask M1 and the second mask M2 on the main stage 61 (relative positional relationship between the first mask M1 and the second mask M2) so as to start, at predetermined timings, the projection of the image of the first pattern PA1 of the first mask M1 onto the first exposure area AR1 and the projection of the image of the second pattern PA2 of the second mask M2 onto the second exposure area AR2 respectively by the movement of the main stage 61 in the Y axis direction (S1 shown in FIG. 22).

As described above, the relative positional relationship between the first mask M1 and the second mask M2 on the basis of the first and second exposure light beams EL1, EL2 on the main stage 61 (position of the first mask M1 with respect to the first illumination area IA1, and position of the second mask M2 with respect to the second illumination area IA2) is determined depending on the position information about the first exposure area AR1 and the second exposure area AR2 with respect to the shot area SH on the substrate P, and consequently the position information about the first exposure area AR1 and the second exposure area AR2 in the XY coordinate system defined by the laser interferometer 75.

The storage unit 31 previously stores the position information about each of the first exposure area AR1 and the second exposure area AR2 in the XY coordinate system defined by the laser interferometer 75. The position information about the shot area SH in the XY coordinate system, which is defined by the laser interferometer 75, is previously determined as well.

The control unit 30 adjusts the positions of the first mask M1 and the second mask M2 on the main stage 61 (relative positional relationship between the first mask M1 and the second mask M2) by using the first and second substages 62, 63 on the basis of the position information about the first exposure area AR1 and the second exposure area AR2 (for example, the distance between the first exposure area AR1 and the second exposure area AR2) stored in the storage unit 31.

As described above, in this embodiment, the control unit 30 previously adjusts the positions of the first mask M1 and the second mask M2 on the main stage 61 (relative positional relationship between the first mask M1 and the second mask M2) on the basis of the relative positional relationship between the first exposure area AR1 and the second exposure area AR2.

After the completion of the adjustment as described above, the control unit 30 starts the exposure for the shot area SH on the substrate P. In order to start the exposure for the substrate P, the control unit 30 makes the exposure light beam EL to be emitted from the light source unit 1. The exposure light beam EL, emitted from the light source unit 1, comes into the first optical system 2. As described above, the first optical system 2 includes the polarization conversion element 5. The zonal secondary light source 7, which emits the exposure light beam EL in the polarization state in the circumferential direction, is formed on the light-exit surface of the optical integrator 6. The exposure light beam EL, emitted from the secondary light source 7, is restricted by the aperture diaphragm 8, and is converted into the exposure light beam EL containing the S-polarized light component and the P-polarized light component.

The exposure light beam EL, which is emitted from the first optical system 2 and which mainly contains the S-polarized light component and the P-polarized light component, passes through the blind unit 11, and then comes into the splitting optical system 13. The exposure light beam EL, emitted from the light source unit 1 and passed through the first optical system 2 and the blind unit 11, is split or separated by the splitting optical system 13 into the first exposure light beam EL1 in the S-polarization state and the second exposure light beam EL2 in the P-polarization state which are different from each other in the polarization state (S2 shown in FIG. 22). The first exposure light beam EL1, split by the splitting optical system 13, illuminates the first mask M1, held by the first substage 62, with the first illumination area IA1; and the second exposure light beam EL2 illuminates the second mask M2, held by the second substage 63, with the second illumination area IA2 (S3 shown in FIG. 22).

The first exposure light beam EL1 from the first pattern PA1, patterned by passing through the first mask M1, comes into the first reflecting surface 40A of the intermediate optical member 40 via the first guiding optical system 41. The first exposure light beam EL1, reflected by the first reflecting surface 40A of the intermediate optical member 40, comes into the third guiding optical system 43, and then is radiated onto the first exposure area AR1 defined on the side of the image plane of the projection optical system PL via the final optical element FL of the third guiding optical system 43. On the other hand, the second exposure light beam EL2 from the second pattern PA2, patterned by passing through the second mask M2, comes into the second reflecting surface 40B of the intermediate optical member 40 via the second guiding optical system 42. The second exposure light beam EL2, reflected by the second reflecting surface 40B of the intermediate optical member 40, comes into the third guiding optical system 43, and then is radiated onto the second exposure area AR2 defined at a position different from that of the first exposure area AR1 (position separated and away from the first exposure area AR1 in the Y axis direction) on the side of the image plane of the projection optical system PL via the final optical element FL of the third guiding optical system 43.

The control unit 30 illuminates the first pattern PA1 of the first mask M1 and the second pattern PA2 of the second mask M2 with the first exposure light beam EL1 and the second exposure light beam EL2 respectively while moving the first mask M1 and the second mask M2 in the +Y direction by using the mask stage 60 while monitoring the position information about the mask stage 60 by using the laser interferometer 74 of the measuring system 70. The control unit 30 radiates the first exposure light beam EL1 and the second exposure light beam EL2 onto the first exposure area AR1 and the second exposure area AR2 respectively while moving the substrate P in the −Y direction by using the substrate stage 80 while monitoring the position information about the substrate stage 80 by using the laser interferometer 75 of the measuring system 70 in synchronization with the movement of the first mask M1 and the second mask M2 in the +Y direction by the mask stage 60. As described above, the radiation is distinctly effected for the first exposure area AR1 and the second exposure area AR2 while moving the first and second masks M1, M2 and the substrate P. Accordingly, the predetermined area (shot area) of the substrate P is subjected to the double exposure in accordance with the execution of processes as described in detail later on (S4 shown in FIG. 22).

In this embodiment, when the shot area SH on the substrate P is exposed, the control unit 30 starts the illumination with the first exposure light beam EL1 for the first pattern PA1 and then starts the illumination with the second exposure light beam EL2 for the second pattern PA2, and the control unit 30 completes the illumination with the first exposure light beam EL1 for the first pattern PA1 and then completes the illumination with the second exposure light beam EL2 for the second pattern PA2. The control unit 30 starts the projection of the pattern PA1 with the first exposure light beam EL1 onto the shot area SH and then starts the projection of the second pattern PA2 with the second exposure light beam EL2 onto the shot area SH, and the control unit 30 completes the projection of the first pattern PA1 with the first exposure light beam EL1 onto the shot area SH and then completes the projection of the second pattern PA2 with the second exposure light beam EL2 onto the shot area SH.

Next, an explanation will be made with reference to FIGS. 10 and 11 about an example of sequence when the first and second exposure light beams EL1, EL2 are radiated onto the shot area SH on the substrate P.

In FIG. 10, the control unit 30 starts the illumination with the first exposure light beam EL1 for the first pattern PA1 at a point of time (at a timing) at which the edge on the +Y side of the first pattern formation area SA1 formed with the first pattern PA1 of the first mask M1 arrives at the first illumination area IA1. In FIG. 11, the setting is made such that an edge G1 on the −Y side of the shot area SH on the substrate P arrives at the first exposure area AR1 at the point of time at which the edge on the +Y side of the first pattern formation area SA1 of the first mask M1 arrives at the first illumination area IA1, and the radiation of the first exposure light beam EL1 onto the first exposure area AR1 is started. The width of the first exposure area AR1 on the substrate P in the scanning direction is made zero by the movable blind 10 before the start of the illumination with the first exposure light beam EL1 for the first pattern PA1. However, the width is gradually widened from the point of time of the start of the scanning exposure with the first pattern PA1 (first scanning exposure) is started, i.e., from the point of time at which the edge G1 of the shot area SH on the substrate P arrives at the edge of the first exposure area AR1 on the +Y side. The width is maintained to be constant at and after a point of time at which the width reaches a predetermined preset value. Accordingly, it is possible to avoid any unnecessary exposure for a shot area in the −Y direction with respect to the shot area SH on the substrate P. The width of the second exposure area AR2 in the scanning direction is made zero by the movable blind 10 immediately after the start of the first scanning exposure.

The control unit 30 continuously illuminates the first pattern PA1 of the first mask M1 with the first exposure light beam EL1 by continuing the movement of the mask stage 60 (main stage 61) in the +Y direction. The first pattern PA1 of the first mask M1 passes across the first illumination area IA1 by continuing the movement of the mask stage 60 in the +Y direction.

The control unit 30 continuously projects the image of the first pattern PA1 with the first exposure light beam EL1 onto the shot area SH on the substrate P by continuing the movement of the substrate stage 80 in the −Y direction in synchronization with the movement of the mask stage 60 in the +Y direction. The shot area SH on the substrate P passes across the first exposure area AR1 by continuing the movement of the substrate stage 80 in the −Y direction.

The illumination with the first exposure light beam EL1 for the first pattern PA1 of the first mask M1 is completed at the point of time at which the edge, of the first pattern formation area SA1, on the −Y side of the first mask M1 arrives at edge of the first illumination area IA1 on the +Y side. In FIG. 11, the setting is made such that the edge G2 of the shot area SH on the substrate P on the +Y side arrives at the edge of the first exposure area AR1 on the −Y side at the point of time at which the edge on the −Y side of the first pattern formation area SA1 of the first mask M1 arrives at the edge, of the first illumination area IA1, on the +Y side; and the radiation of the first exposure light beam EL1 onto the first exposure area AR1 is stopped at the point of time at which the edge G2, of the shot area SH, on the +Y side arrives at the edge of the first exposure area AR1 on the −Y side. Accordingly, the exposure of the shot area SH with the first exposure light beam EL1 radiated onto the first exposure area AR1, i.e., the projection of the image of the first pattern PA1 with the first exposure light beam EL1 onto the shot area SH comes to an end. As described above, the movable blind 10 is moved in synchronization with the first mask M1. Therefore, the first illumination area IA1 begins to be restricted by the edge E3 of the movable blind at the point of time at which the edge on the −Y side of the first pattern formation area SA1 of the first mask M1 arrives at the edge on the −Y side of the first illumination area IA1, and the width of the first illumination area IA1 is made zero at the point of time at which the edge on the −Y side of the first pattern formation area SA1 arrives at the edge, of the first illumination area IA1, on the +Y side. Corresponding to this, the width of the first exposure area AR1 is gradually narrowed from the point of time at which the edge G2 of the shot area SH arrives at the edge of the first exposure area AR1 on the +Y side; and the width is made zero at the point of time at which the edge G2 arrives at the edge of the first exposure area AR1 on the −Y side. Accordingly, it is possible to avoid any unnecessary exposure for the shot area in the +Y direction with respect to a shot area SH on the substrate P before the completion of the first scanning exposure.

The edge on the +Y side of the second pattern formation area SA2 formed with the second pattern PA2 of the second mask M2 arrives at the second illumination area IA2 at a predetermined timing during a period of time in which a part of the area of the first pattern formation area SA1 of the first mask M1 passes across the first illumination area IA1; and the illumination with the second exposure light beam EL2 for the second pattern PA2 is started. In FIG. 11, the setting is made such that the edge G1 on the −Y side of the shot area SH on the substrate P arrives at the second exposure area AR2 at a point of time at which the edge on the +Y side of the second pattern formation area SA2 of the second mask M2 arrives at the second illumination area IA2; and the radiation of the second exposure light beam EL2 onto the second exposure area AR2 is started. That is, the edge G1 on the −Y side of the shot area SH arrives at the second exposure area AR2 at a predetermined timing during a period of time in which a part of the area of the shot area SH on the substrate P passes across the first exposure area AR1; and the projection of the image of the second pattern PA2 with the second exposure light beam EL2 onto the shot area SH is started. The width of the second exposure area AR2 on the substrate P in the scanning direction is made zero by the movable blind 10 before the start of the illumination with the second exposure light beam EL2 for the second pattern PA2. However, the width is gradually widened from the point of time at which the scanning exposure with the second pattern PA2 (second scanning exposure) is started, i.e., from the point of time at which the edge G1 of the shot area SH on the substrate P arrives at the edge on the +Y side of the second exposure area AR2; and the width is maintained to be constant at and after the point of time at which the width reaches a predetermined preset value. Accordingly, it is possible to avoid any unnecessary exposure for the shot area in the −Y direction with respect to the shot area SH on the substrate P before the start of the second scanning exposure.

As described above, the position of the first mask M1 and the position of the second mask M2 with respect to the main stage 61, i.e., the relative positional relationship between the first mask M1 and the second mask M2 on the main stage 61 is previously adjusted on the basis of the relative positional relationship (distance in the Y axis direction) between the first exposure area AR1 and the second exposure area AR2, and the projection of the second pattern PA2 of the second mask M2 can be started when the edge G1 on the −Y side of the shot area SH on the substrate P arrives at the second exposure area AR2 by synchronously moving the main stage 61 and the substrate stage 80.

The control unit 30 continuously illuminates the second pattern PA2 of the second mask M2 with the second exposure light beam EL2 by continuing the movement of the mask stage 60 (main stage 61) in the +Y direction. The second pattern PA2 of the second mask M2 passes across the second illumination area IA2 by continuing the movement of the mask stage 60 in the +Y direction.

The control unit 30 continuously projects the image of the second pattern PA2 with the second exposure light beam EL2 onto the shot area SH on the substrate P by continuing the movement of the substrate stage 80 in the −Y direction in synchronization with the movement of the mask stage 60 in the +Y direction. The shot area SH on the substrate P passes across the second exposure area AR2 by continuing the movement of the substrate stage 80 in the −Y direction.

The illumination with the second exposure light beam EL2 for the second pattern PA2 of the second mask M2 is completed at the point of time at which the edge on the −Y side of the second pattern formation area SA2 of the second mask M2 arrives at edge on the +Y side of the second illumination area IA2. In FIG. 11, the setting is made such that the edge G2 on the +Y side of the shot area SH on the substrate P arrives at the edge on the −Y side of the second exposure area AR2 at the point of time at which the edge on the −Y side of the second pattern formation area SA2 of the second mask M2 arrives at the edge on the +Y side of the second illumination area IA2, and the radiation of the second exposure light beam EL2 onto the second exposure area AR2 is stopped at the point of time at which the edge G2 on the +Y side of the shot area SH arrives at the edge on the −Y side of the second exposure area AR2. Accordingly, the exposure of the shot area SH with the second exposure light beam EL2 radiated onto the second exposure area AR2, i.e., the projection of the image of the second pattern PA2 with the second exposure light beam EL2 onto the shot area SH comes to an end. As described above, the movable blind 10 is moved in synchronization with the second mask M2. Therefore, the second illumination area IA2 begins to be restricted by the edge E4 of the movable blind at the point of time at which the edge on the −Y side of the second pattern formation area SA2 of the second mask M2 arrives at the edge on the −Y side of the second illumination area IA2, and the width of the second illumination area IA2 is made zero at the point of time at which the edge on the −Y side of the second pattern formation area SA arrives at the edge on the +Y side of the second illumination area IA2. Corresponding to this, the width of the second exposure area AR2 is gradually narrowed from the point of time at which the edge G2 of the shot area SH arrives at the edge on the +Y side of the second exposure area AR2, and the width is made zero at the point of time at which the edge G2 arrives at the edge on the −Y side of the second exposure area AR2. Accordingly, it is possible to avoid any unnecessary exposure for the shot area in the +Y direction with respect to the shot area SH on the substrate P before the completion of the second scanning exposure.

Thus, a photosensitive material layer of the shot area SH on the substrate P, which is exposed with the first exposure light beam EL1 radiated onto the first exposure area AR1, is exposed again (subjected to the double exposure) with the second exposure light beam EL2 radiated onto the second exposure area AR2 without performing the developing step etc.

The illumination with the first exposure light beam EL1 for the first pattern PA1 of the first mask M1 is completed at the predetermined timing during the period of time in which a part of the area of the second pattern formation area SA2 passes across the second illumination area IA2. The radiation of the first exposure light beam EL1 onto the shot area SH is completed at the predetermined timing during the period of time in which a part of the area of the shot area SH on the substrate P passes across the second exposure area AR2.

As described above, in this embodiment, one shot area SH on the substrate P can be subjected to the multiple exposure (double exposure) with the image of the first pattern PA1 and the image of the second pattern PA2 by one time of the scanning operation.

A plurality of the shot areas SH are provided on the substrate P. The control unit 30 successively performs the exposure for each of the shot areas SH. The control unit 30 successively performs the multiple exposure for the plurality of shot areas SH on the substrate P by repeating the scanning operation in the −Y direction and the scanning operation in the +Y direction for the substrate P.

The control unit 30 moves the movable blind 10, in synchronization with the movement of the first and second masks M1, M2, during the movement of the first and second masks M1, M2 and the substrate P. Therefore, it is possible to shield any unnecessary radiation of the first and second exposure light beams EL1, EL2 onto the portions other than the first and second pattern formation areas SA1, SA2 of the first and second masks M1, M2. Therefore, any unnecessary exposure is avoided for the substrate P by the first exposure light beam EL1 and the second exposure light beam EL2. In particular, any radiation of the exposure light beam is avoided for the portions other than the first and second pattern formation areas SA1, SA2 by using the single movable blind. Therefore, it is possible to suppress the increase in the apparatus cost of the exposure apparatus for performing the multiple exposure, and it is possible to suppress the increase in the size of the apparatus.

The splitting optical system 13 is provided to split or divide the exposure light beam EL emitted from the light source unit 1. Therefore, it is possible to suppress the increase in the apparatus cost and the increase in the size of the apparatus, and it is possible to efficiently perform the multiple exposure for the substrate P. In particular, the first exposure light beam EL1 and the second exposure light beam EL2 are obtained from the exposure light beam EL which is generated from the single light source unit. Therefore, the first exposure light beam EL1 and the second exposure light beam EL2 have a common beam quality (for example, the wavelength characteristic) except that the direction of polarization differs. Therefore, it is unnecessary to perform any adjustment for the exposure light beams, as compared with a case in which the first exposure light beam and the second exposure light beam are generated from two different light sources. It is thus possible to maintain the satisfactory exposure quality in the multiple exposure more easily.

The exposure light beams EL are radiated onto the first exposure area AR1 and the second exposure area AR2 defined at the different positions in the Y axis direction. Further, the substrate P is moved in the Y axis direction so that the shot area SH on the substrate P passes across the first exposure area AR1 and the second exposure area AR2. Accordingly, the shot area SH on the substrate P can be efficiently subjected to the multiple exposure. In this embodiment, when a plurality of shot areas SH on the substrate P are subjected to the multiple exposure (double exposure), one shot area SH can be exposed with the image of the first pattern PA1 and the image of the second pattern PA2 by performing the scanning operation once, thereby improving the throughput. The plurality of shot areas SH on the substrate P can be efficiently subjected to the multiple exposure by repeating the scanning operation in the −Y direction and the scanning operation in the +Y direction for the substrate P. The image of the first pattern PA1 and the image of the second pattern PA2 can be formed in the desired positional relationship in each of the shot areas SH, because one piece of the shot areas SH can be subjected to the multiple exposure by one time of the scanning operation.

In this embodiment, the splitting optical system 13 splits the exposure light beam EL into the first exposure light beam EL1 in the S-polarization state and the second exposure light beam EL2 in the P-polarization state, and the linearly polarized illumination is effected for the first and second patterns PA1, PA2 including the line patterns. The exposure light beam, which has the direction of polarization substantially parallel to the longitudinal direction of the line pattern, contributes to the improvement in the contrast of the image of the line pattern. Therefore, it is possible to improve the optical performance (for example, the depth of focus) of the projection optical system PL, and it is possible to obtain the images of the first and second patterns PA1, PA2 having the high contrast on the substrate P. When the numerical aperture NA of the projection optical system PL is large, for example, about 0.9, there is such a possibility that the imaging characteristic may be deteriorated due to the polarization effect in the case of the random polarized light. In this embodiment, it is possible to obtain the satisfactory image of the pattern, because the polarized illumination is used.

In this embodiment, the first exposure light beam EL1 to be radiated onto the first exposure area AR1 and the second exposure light beam EL2 to be radiated onto the second exposure area AR2 are radiated onto the substrate P via one final optical element FL. Therefore, it is possible to simplify the construction of the projection optical system PL. Further, the first exposure area AR1 and the second exposure area AR2 are defined at the different positions. Therefore, the first exposure light beam EL1 from the first mask M1 and the second exposure light beam EL2 from the second mask M2 can be guided to the third guiding optical system 43 by arranging the reflecting surfaces 40A, 40B in the vicinity of the position optically conjugate with the first and second exposure areas AR1, AR2, so that the first exposure light beam EL1 and the second exposure light beam EL2 can be radiated onto the first and second exposure areas AR1, AR2 respectively.

In the projection optical system PL of this embodiment, the first exposure light beam EL1 from the first mask M1 and the second exposure light beam EL2 from the second mask M2, which are reflected by the intermediate optical member 40, are allowed to come into the third guiding optical system 43 symmetrically with respect to the optical axis of the third guiding optical system 43. Therefore, the temperature distribution in the respective elements included in the third guiding optical system 43 can be also made symmetrical with respect to the optical axis. Therefore, any temperature change (including any temperature distribution change) arises in the respective elements included in the third guiding optical system 43, the optical performance of the projection optical system PL can be maintained to be in a desired state, for example, by moving and/or inclining a part or parts of the optical elements (for example, a part or parts of the lenses included in the third guiding optical system 43) in the projection optical system PL.

In this embodiment, the control unit 30 previously adjusts the positions of the first mask M1 and the second mask M2 on the main stage 61 (relative positional relationship between the first mask M1 and the second mask M2) on the basis of, for example, the relative positional relationship between the first exposure area AR1 and the second exposure area AR2. Further, the exposure is performed while moving the first and second masks M1, M2 and the substrate P while monitoring the position information about the mask stage 60 and the substrate stage 80 by using the measuring system 70. Therefore, the projection of the image of the first pattern PA1 of the first mask M1 and the projection of the image of the second pattern PA2 of the second mask M2 can be executed at desired timings respectively, thereby making it possible to form the image of the first pattern PA1 of the first mask M1 and the image of the second pattern PA2 of the second mask M2 in the desired positional relationship in each of the shot areas SH.

There is such a possibility that the relative positions of the main stage 61 and the substrate stage 80 may be deviated from target relative positions when one shot area SH on the substrate P is subjected to the multiple exposure. The deviation of the relative positions of the main stage 61 and the substrate stage 80 can be detected on the basis of the measurement results of the laser interferometers 74, 75. Therefore, when the deviation of the relative positions of the main stage 61 and the substrate stage 80 is detected, the control unit 30 moves at least one of the first substage 62 and the second substage 63 on the basis of the measurement results of the laser interferometers 74, 75 to adjust at least one of the positions of the first mask M1 and the second mask M2. Accordingly, the respective positional relationships among the first and second masks M1, M2 and the shot area SH are always adjusted to be in the desired state. Thus, the image of the first pattern PA1 and the image of the second pattern PA2 can be formed in the desired positional relationship in the shot area SH.

In this embodiment, the measuring system 70 obtains the position information about the main stage 61 by using the reflecting member 71 provided for the main stage 61. The control unit 30 controls the position of the main stage 61 on the basis of the obtained position information. However, the reflecting member 71 may be omitted, and the movement of the main stage 61 may be controlled by using at least one of the position information about the first substage 62 obtained by using the reflecting member 72 and the position information about the second substage 63 obtained by using the reflecting member 73. The measuring system 70 may detect, for example, the information in relation to the relative positional relationship between the first and second masks M1, M2, for example, the position information about (position or displacement of) the first and second masks M1, M2 by using any sensor other then the laser interferometer, including, for example, an encoder or the like.

In this embodiment, the first and second substages 62, 63 are provided as the mechanisms for moving the first and second masks M1, M2; and the reflecting members 72, 73, which are used for the position measurement by the laser interferometer 74, are provided in order to obtain the position information about the first and second substages 62, 63. However, they may be omitted when it is possible to permit the change of the relative positions of the first exposure area AR1 and the second exposure area AR2 and the synchronization error (position error) between the main stage 61 and the substrate stage 80. In this case, the first mask M1 and the second mask M2 may be fixed at predetermined positions respectively on the main stage 61; and the main stage 61 and the substrate stage 80 may be synchronously moved on the basis of the position information about the substrate stage 80 obtained by the laser interferometer 75 and the position information about the main stage 61 obtained by the laser interferometer 74 by using the reflecting member 71.

There is such a possibility that the optical characteristic of the projection optical system PL may be changed to cause any change in the relative positional relationship between the first exposure area AR1 and the second exposure area AR2, for example, due to the radiation of the first and second exposure light beams EL1, EL2 onto the projection optical system PL and the environment change around the projection optical system PL (including, for example, the temperature change and the pressure change, and the like). In such a situation, at least one of the first substage 62 and the second substage 63 may be moved to adjust at least one of the positions of the first mask M1 and the second mask M2 so that the image of the first pattern PA1 of the first mask M1 and the image of the second pattern PA2 of the second mask M2 may be formed at the desired positions in the shot area SH respectively. For example, the control unit 30 can monitor, for example, the radiation amounts of the first and second exposure light beams EL1, EL2 onto the projection optical system PL and the environment change around the projection optical system PL to move at least one of the first substage 62 and the second substage 63 on the basis of the monitoring result so that the image of the first pattern PA1 of the first mask M1 and the image of the second pattern PA2 of the second mask M2 are formed at the desired positions in the shot area SH respectively. It is also allowable that at least one of the first guiding optical system 41, the second guiding optical system 42, and the third guiding optical system 43 is adjusted to correct the relative positional relationship (for example, the distance in the Y axis direction and the like) between the first exposure area AR1 and the second exposure area AR2. Further, the imaging characteristic of the projection optical system PL is also fluctuated resulting from the radiation amount and the environment change as described above. Accordingly, it is preferable to perform, for example, at least one of the adjustment of the projection optical system PL (including the movement of the optical element), the adjustment of the wavelength characteristic of the exposure light beam (for example, the center wavelength, the spectral width and the like), and the movement of the substrate P (positional adjustment in the Z axis direction, the θX direction, and the θY direction). Accordingly, it is possible to suppress (correct) the fluctuation of the imaging characteristic, and/or it is possible to avoid the deterioration of the exposure accuracy resulting from the fluctuation.

As described above, in this embodiment, the control unit 30 illuminates the first pattern PA1 of the first mask M1 and the second pattern PA2 of the second mask M2 with the first exposure, light beam EL1 and the second exposure light beam EL2 respectively while moving the first mask M1 and the second mask M2 in the same scanning direction. However, as described later on, the first mask M1 and the second mask M2 are moved in mutually opposite directions in some cases during the scanning exposure for the shot area SH depending on the construction of the optical unit U. In such a case, the optical characteristic, which includes, for example, the number of times of imaging operations to be performed by each of the third, fourth, and fifth optical systems 14, 15, 17 arranged between the splitting optical system 13 and the first pattern PA1 and the second pattern PA2, may be set so that any unnecessary radiation of the first and second exposure light beams EL1, EL2 onto the portions other than the first and second pattern formation areas SA1, SA2 of the first and second masks M1, M2 as well as to avoid any unnecessary exposure for the substrate P with the first exposure light beam EL1 and the second exposure light beam EL2 by the movement of the movable blind 10 in one direction (in the +Z direction or the −Z direction) in relation to the scanning exposure for one shot area SH.

Second Embodiment

A second embodiment will be explained. In the following description, the constitutive components, which are the same as or equivalent to those of the embodiment described above, are designated by the same reference numerals, any explanation of which will be simplified or omitted.

Figure 14:
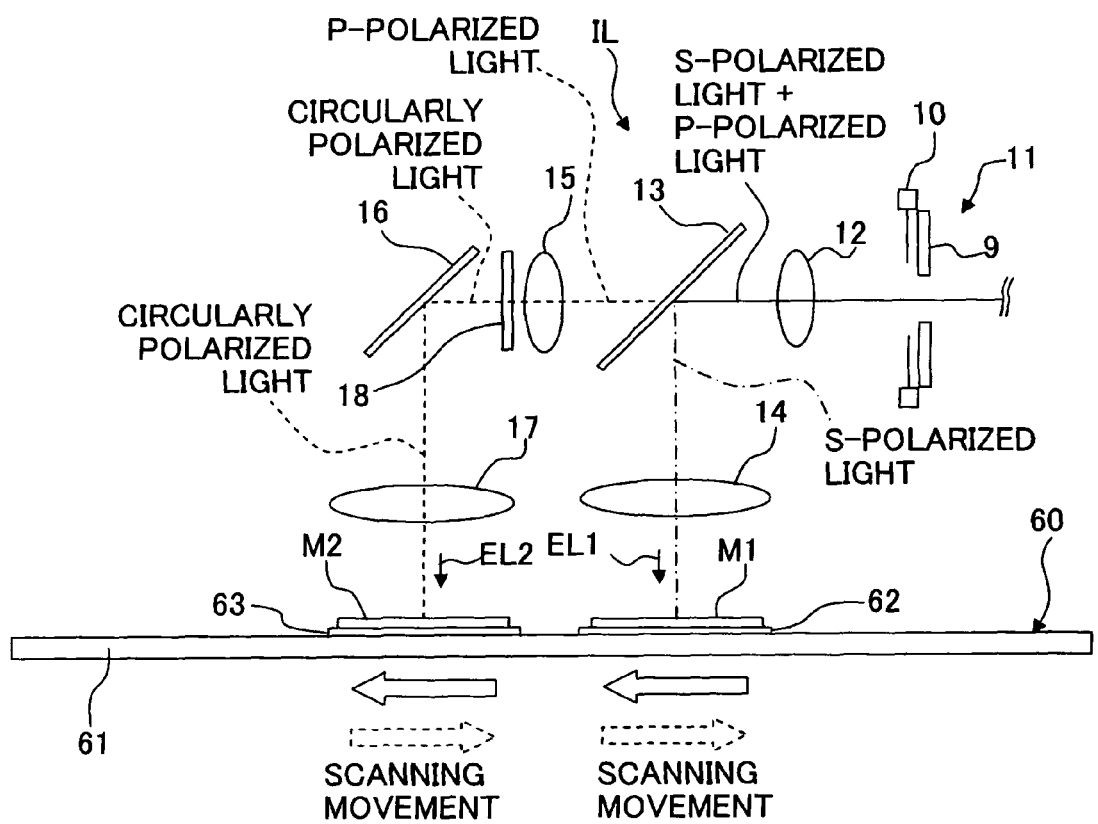
FIG. 14 shows main components of an illumination system according to a second embodiment.

FIG. 14 shows main components of an illumination system IL according to the second embodiment. The feature of the second embodiment, which is different from that of the first embodiment described above, is that the illumination system IL includes a conversion element 18 which changes the polarization state of at least one of the first exposure light beam EL1 and the second exposure light beam EL2 generated by the splitting optical system (polarization splitting optical system) 13.

The illumination system IL of this embodiment includes the light source unit 1 which emits the exposure light beam EL, the first optical system 2 which converts the exposure light beam EL from the light source unit 1 into the exposure light beam EL mainly containing the S-polarized light component and the P-polarized light component and emits the converted exposure light beam EL, the blind unit 11, and the splitting optical system (polarization splitting optical system) 13 which splits the exposure light beam EL into the first exposure light beam EL1 in the S-polarization state and the second exposure light beam EL2 in the P-polarization state, in the same manner as in the first embodiment described above. The light source unit 1 and the first optical system 2 are not shown in FIG. 14. In this embodiment, the conversion element 18, which converts the polarization state of the second exposure light beam EL2, is arranged on the optical path between the splitting optical system 13 and the second mask M2. The conversion element 18 includes a phase difference plate. In this embodiment, the conversion element 18 is a λ/4 plate.

The first exposure light beam EL1 in the S-polarization state, split by the splitting optical system 13, is radiated onto the first mask M1 via the third optical system 14. On the other hand, the second exposure light beam EL2 in the P-polarization state, split by the splitting optical system 13, comes into the conversion element 18 via the fourth optical system 15. The conversion element 18, which is composed of the λ/4 plate, converts the incoming second exposure light beam EL2, mainly composed of the P-polarized light, into the second exposure light beam EL2 mainly composed of a circularly polarized light. The second exposure light beam EL2, in which the polarization state has been converted by the conversion element 18, is radiated onto the second mask M2 via the reflecting mirror 16 and the fifth optical system 17.

The first optical element 2 includes the diffraction optical element 4 which diffracts the exposure light beam EL from the light source unit 1 at a desired angle, in the same manner as in the embodiment described above. In this embodiment, the diffraction optical element 4 is capable of illuminating the light-incident surface of the optical integrator 6 with the circular illumination area including the optical axis AX of the illumination system IL and the zonal illumination area disposed about the center of the optical axis AX. As described above, the desired illumination area can be formed by adjusting the structure condition of the diffraction optical element 4. Accordingly, the circular secondary light source including the optical axis AX and the zonal secondary light source disposed about the center of the optical axis AX are formed on the light-exit surface of the optical integrator 6.

The polarization conversion element 5 is arranged just before the optical integrator 6 (in the vicinity of the light-incident surface) in the same manner as in the first embodiment described above. The polarization conversion element 5 of this embodiment converts the exposure light beam EL emitted from the circular secondary light source into the exposure light beam EL in the P-polarization state, and it converts the exposure light beam EL emitted from the zonal secondary light source into the exposure light beam EL in the polarization state in the circumferential direction. As described above, the exposure light beam having the desired polarization state can be generated by adjusting, for example, the thickness, the optical rotary power of the polarization conversion element 5, and the like.

Figure 15:
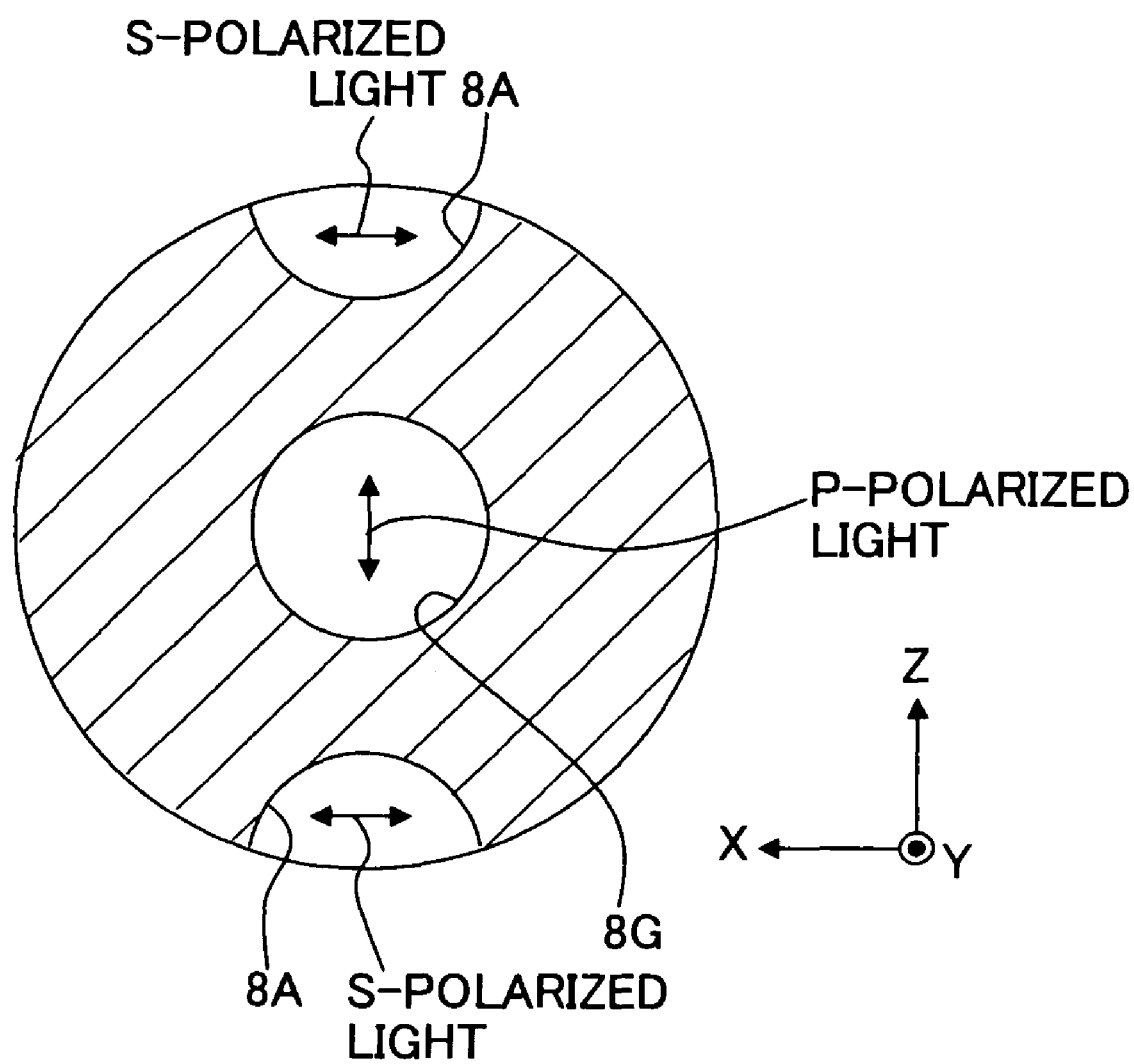
FIG. 15 illustrates an example of an aperture diaphragm of the illumination system according to the second embodiment.

FIG. 15 shows an aperture diaphragm 8 according to this embodiment. The aperture diaphragm 8 is arranged in the vicinity of the light-exit surface of the optical integrator 6, i.e., just after the secondary light source 7. With reference to FIG. 15, the aperture diaphragm 8 has two first apertures 8A and a third aperture 8G each allowing the exposure light beam EL to pass therethrough. The two first apertures 8A are provided at opposite positions with the optical axis AX intervening therebetween, in the same manner as in the first embodiment described above. The exposure light beam EL in the S-polarization state is emitted from the two first apertures 8A. The third aperture 8G is circular, and the single third aperture 8G is provided on the optical axis AX. The third aperture 8G is formed so that the third aperture 8G is adapted to the circular secondary light source. The exposure light beam EL in the P-polarization state is emitted from the third aperture 8G. As described above, also in this embodiment, the exposure light beam EL, which is emitted from the light source unit 1 and which is allowed to pass through the aperture diaphragm 8, mainly includes the S-polarized light component and the P-polarized light component.

The exposure light beam EL, which has passed through the apertures 8A, 8G of the aperture diaphragm 8, comes into the blind unit 11, for example, via a condenser optical system. The exposure light beam EL, which has passed through the light passing area of the blind unit 11 and which mainly contains the S-polarized light component and the P-polarized light component, comes into the splitting optical system 13 via the second optical system 12.

The splitting optical system 13 splits the exposure light beam EL into the first exposure light beam EL1 in the S-polarization state and the second exposure light beam EL2 in the P-polarization state. The first exposure light beam EL1 in the S-polarization state, which has been split by the splitting optical system 13, is supplied to the third optical system 14, and is radiated onto the first mask M1 via the third optical system 14. The second exposure light beam EL2 in the P-polarization state, which has been split by the splitting optical system 13, is supplied to the fourth optical system 15, and is converted into the second exposure light beam EL2 in the circular polarization state by the conversion element 18. After that, the second exposure light beam EL2 is radiated onto the second mask M2 via the reflecting mirror 16 and the fifth optical system 17.

The first exposure light beam EL1, which has passed through the two first apertures 8A arranged at the mutually opposite positions with respect to the optical axis AX, is radiated onto the first mask M1. The first pattern PA1 of the first mask M1 is subjected to the dipole illumination (two-spot illumination) with the first exposure light beam EL1 mainly composed of the S-polarized light. The first pattern PA1 of the first mask M1 is mainly composed of a plurality of line-and-space patterns in which the X axis direction is the longitudinal direction, in the same manner as in the first embodiment described above. The longitudinal direction of the line patterns of the line-and-space patterns contained in the first pattern PA1 is substantially parallel to the direction of polarization of the first exposure light beam EL1 mainly composed of the S-polarized light. As described above, the illumination system IL performs the oblique incidence illumination (dipole illumination) adjusted to the longitudinal direction of the line pattern of the line-and-space pattern of the first mask M1 by using the two light fluxes (first exposure light beam EL1) in the linear polarization state (S-polarization state) adjusted to the longitudinal direction of the line pattern of the line-and-space pattern of the first mask M1.

On the other hand, the second exposure light beam EL2, which has passed through the third aperture 8G arranged at the position including the optical axis AX, is radiated onto the second mask M2. The second pattern PA2 of the second mask M2 is illuminated with the second exposure light beam EL2 mainly composed of the circularly polarized light. In this embodiment, the second pattern PA2 of the second mask M2 is, for example, a pattern in which line patterns extending in a plurality of different directions exist in a mixed manner. The pattern of the second mask M2 is perpendicularly illuminated by the illumination system IL. In the following description, the illumination for the second pattern PA2 of the second mask M2 effected with the second exposure light beam EL2 is referred to as "ordinary illumination".

In this embodiment, the illumination condition, in which the illumination σ value (coherence factor) is small, can be set by decreasing the aperture 8G of the aperture diaphragm 8. Therefore, this is effective, for example, for such a case that the second mask M2 is a phase shift mask in which, for example, a contact hole pattern is formed.

In this embodiment, the illumination system IL effects the dipole illumination for the first mask M1, and effects the ordinary illumination for the second mask M2. For example, when a fine pattern is formed as the first pattern PA1 of the first mask M1, and a rough pattern, which is rougher than the first pattern PA1, is formed as the second pattern PA2 of the second mask M2, then the illumination can be performed under the illumination condition adapted to each of the patterns.

In this embodiment, the illumination system IL is operated such that the exposure light beam EL, which is emitted from the secondary light source 7, is converted by the aperture diaphragm 8 into the exposure light beam EL mainly containing the S-polarized light component and the P-polarized light component, and then the exposure light beam EL is allowed to come into the splitting optical system 13; and then the first mask M1 is subjected to the dipole illumination (two-spot illumination) with the first exposure light beam EL1 in the S-polarization state, and the second mask M2 is subjected to the ordinary illumination with the second exposure light beam EL2 in the circular polarization state. In this case, it is possible that the structure of the diffraction optical element is adjusted; that one diffraction optical element is allowed to possess the function as the diffraction optical element for the dipole illumination and the function as the diffraction optical element for the ordinary illumination; and that the predetermined polarization conversion element is arranged on the optical path for the exposure light beam EL. This makes it possible that the first mask M1 is subjected to the dipole illumination with the first exposure light beam EL1 in the S-polarization state, and the second mask M2 is subjected to the ordinary illumination with the second exposure light beam EL2 in the circular polarization state, without providing the aperture diaphragm.

Next, an explanation will be made about a method for exposing the substrate P by using the exposure apparatus EX according to this embodiment. The control unit CONT 30 adjusts the relative positional relationship between the first mask M1 and the second mask M2 on the main stage 61 by using the first and second substages 62, 63 on the basis of, for example, the position information about the first exposure area AR1 and the second exposure area AR2 before exposing the substrate P, in the same manner as in the first embodiment described above.

After completing the adjustment of the relative positional relationship between the first mask M1 and the second mask M2, the control unit 30 makes the exposure light beam EL to be emitted from the light source unit 1. The exposure light beam EL, which is emitted from the light source unit 1, is converted to be in the predetermined polarization state by the first optical system 2. The exposure light beam EL then passes through the blind unit 11, and comes into the splitting optical system 13. The splitting optical system 13 splits the incoming exposure light beam EL into the first exposure light beam EL1 in the S-polarization state and the second exposure light beam EL2 in the P-polarization state. The first exposure light beam EL1 in the S-polarization state illuminates the first pattern PA1 of the first mask M1. The second exposure light beam EL2 in the P-polarization state is converted by the conversion element 18 into the second exposure light beam EL2 in the circular polarization state, and illuminates the second mask M2.

Also in this embodiment, the control unit 30 illuminates the first pattern PA1 and the second pattern PA2 with the first exposure light beam EL1 and the second exposure light beam EL2 respectively while moving the first mask M1 and the second mask M2 in the same scanning direction (for example, in the +Y direction) by using the mask stage 60 having the main stage 61. The control unit 30 moves the substrate stage 80 which holds the substrate P in the scanning direction (for example, in the −Y direction) opposite to that of the first mask M1 and the second mask M2, in synchronization with the movement of the first mask M1 and the second mask M2 during the exposure for the shot area SH on the substrate P. Further, the control unit 30 moves the movable blind 10 in synchronization with the movement of the first and second masks M1, M2. Accordingly, any unnecessary exposure by the first exposure light beam EL1 and the second exposure light beam EL2 is avoided for the substrate P.

The shot area SH on the substrate P is subjected to the multiple exposure with the image of the first pattern PA1 formed with the first exposure light beam EL1 radiated onto the first exposure area AR1 via the first pattern PA1 and the projection optical system PL and the image of the second pattern PA2 formed with the second exposure light beam EL2 radiated onto the second exposure area AR2 via the second pattern PA2 and the projection optical system PL. Also in this embodiment, the photosensitive material layer on the substrate P, which is exposed with the first exposure light beam EL1 radiated onto the first exposure area AR1, is exposed again (subjected to the double exposure) with the second exposure light beam EL2 radiated onto the second exposure area AR2 without being subjected to the developing step etc. One of the shot areas SH is subjected to the multiple exposure (double exposure) with the image of the first pattern PA1 and the image of the second pattern PA2 by one time of the scanning operation.

Third Embodiment

Figure 16:
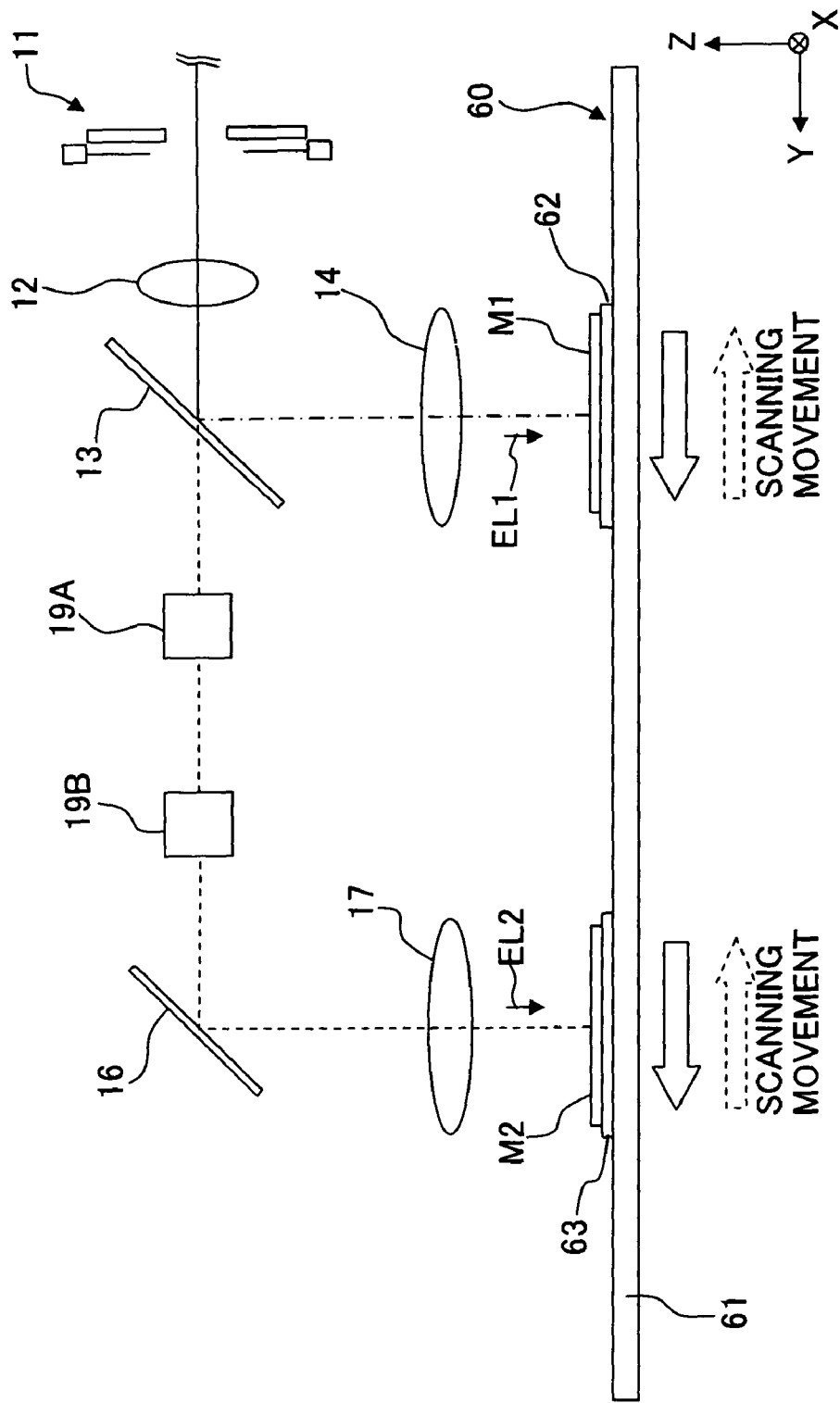
FIG. 16 shows main components of an illumination system according to a third embodiment.

A third embodiment will be explained. FIG. 16 shows main components of an illumination system IL according to the third embodiment. In the following description, the constitutive components, which are the same as or equivalent to those of the first embodiment described above, are designated by the same reference numerals, any explanation of which will be simplified or omitted.

The illumination system IL of this embodiment includes the light source unit 1 which emits the exposure light beam EL, the first optical system 2 which converts the exposure light beam EL from the light source unit 1 into the exposure light beam EL mainly containing the S-polarized light component and the P-polarized light component to be emitted, the blind unit 11, and the splitting optical system 13 which splits the exposure light beam EL into the first exposure light beam EL1 in the S-polarization state and the second exposure light beam EL2 in the P-polarization state, in the same manner as in the first embodiment described above. The light source unit 1 and the first optical system 2 are not shown in FIG. 16. In this embodiment, imaging optical systems (relay optical systems) 19A, 19B are arranged on the optical path between the splitting optical system 13 and the second mask M2.

In this embodiment, the number of times of imaging or image formation performed by the optical systems 14, 17, 19A, 19B arranged between the splitting optical system 13 and the first pattern PA1 and the second pattern PA2 is set so as to avoid, by moving the movable blind 10, any unnecessary radiation of the first and second exposure light beams EL1, EL2 onto portions other than the first and second pattern formation areas SA1, SA2 of the first and second masks M1, M2 as well as to avoid any unnecessary exposure for the substrate P with the first exposure light beam EL1 and the second exposure light beam EL2. In this embodiment, the two imaging optical systems (relay optical systems) 19A, 19B are arranged on the optical path between the splitting optical system 13 and the second mask M2. Each of the imaging optical systems 19A, 19B has the function to invert the image of the object once. Therefore, the image of the blind unit 11, i.e., the image of the light passing area of the movable blind 10 (image of each of the edges E1 to E6) is inverted twice, namely once by each of the two imaging optical systems 19A, 19B between the splitting optical system 13 and the second mask M2. That is, in this embodiment, the number of times of imaging (number of times of image inversion) is two (even number of times) for the image of the light passing area of the movable blind 10 (image of each of the edges E1 to E6) between the splitting optical system 13 and the second mask M2. On the other hand, in this embodiment, the number of times of imaging (number of times of image inversion) is zero (even number of times) for the image of the light passing area of the movable blind 10 (image of each of the edges E1 to E6) between the splitting optical system 13 and the first mask M1.

The first exposure light beam EL1 in the S-polarization state, split by the splitting optical system 13, is radiated onto the first mask M1 via the third optical system 14. On the other hand, the second exposure light beam EL2 in the P-polarization state, split by the splitting optical system 13, comes into the reflecting mirror 16 via the two imaging optical systems 19A, 19B, and is reflected by the reflecting mirror 16. After that, the second exposure light beam EL2 is radiated onto the second mask M2 via the fifth optical system 17.

Also in this embodiment, the control unit 30 illuminates the first pattern PA1 of the first mask M1 and the second pattern PA2 of the second mask M2 with the first exposure light beam EL1 and the second exposure light beam EL2 respectively while moving the first mask M1 and the second mask M2 in the same scanning direction (for example, in the −Y direction) by using the main stage 61 of the mask stage 60, in the same manner as in the embodiment described above. The control unit 30 moves the substrate stage 80 which holds the substrate P in the scanning direction (for example, in the +Y direction) opposite to that of the first mask M1 and the second mask M2 during the exposure for the shot area SH on the substrate P. The control unit 30 moves the movable blind 10 in synchronization with the movement of the first and second masks M1, M2. The shot area SH on the substrate P is subjected to the multiple exposure with the image of the first pattern PA1 formed with the first exposure light beam EL1 radiated onto the first exposure area AR1 via the first pattern PA1 and the projection optical system PL and the image of the second pattern PA2 formed with the second exposure light beam EL2 radiated onto the second exposure area AR2 via the second pattern PA2 and the projection optical system PL.

Also in this embodiment, the number of times of imaging performed by the optical system arranged between the splitting optical system 13 and the first pattern PA1 and the second pattern PA2 is set so that any unnecessary exposure is avoided for the substrate P with the first exposure light beam EL1 and the second exposure light beam EL2, by moving the movable blind 10 in one direction (in the +Z direction or the −Z direction) during the exposure operation for one shot area SH. Therefore, even when the first pattern PA1 and the second pattern PA2 are illuminated with the first exposure light beam EL1 and the second exposure light beam EL2 respectively while moving the first mask M1 and the second mask M2 in the same scanning direction, one movable blind 10 can be used to shield any unnecessary radiation of the first and second exposure light beams EL1, EL2 onto the portions other than the first and second pattern formation areas SA1, SA2 of the first and second masks M1, M2. Accordingly, it is possible to avoid any unnecessary exposure for the substrate P with the first exposure light beam EL1 and the second exposure light beam EL2.

In this embodiment, the imaging optical systems 19A, 19B are arranged as the relay optical systems on the optical path for the second exposure light beam EL2 between the splitting optical system 13 and the second mask M2. Therefore, even when the distance between the first mask M1 (first substage 62) and the second mask M2 (second substage 63) is long, the first and second masks M1, M2 can be satisfactorily illuminated with the first and second exposure light beams EL1, EL2 respectively.

Fourth Embodiment

Figure 17:
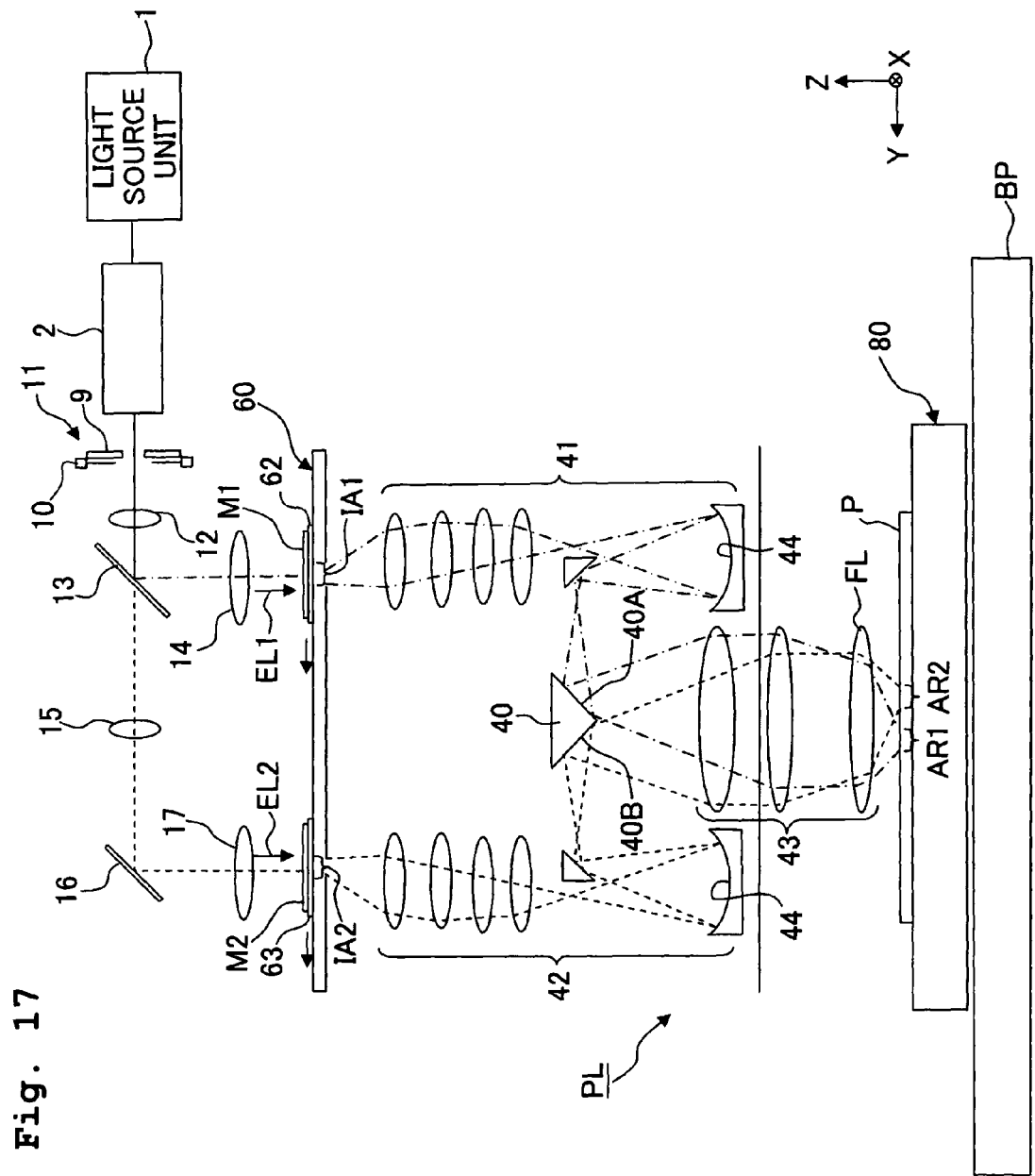
FIG. 17 shows a schematic arrangement view illustrating an exposure apparatus according to a fourth embodiment.

A fourth embodiment will be explained. FIG. 17 shows a schematic arrangement view illustrating the fourth embodiment. The feature of this embodiment, which is different from that of the first embodiment described above, is that each of the first guiding optical system 41 and the second guiding optical system 42 has a concave mirror 44. The difference will be mainly described below. The constitutive components, which are the same as or equivalent to those of the first embodiment described above, are designated by the same reference numeral, any explanation of which will be simplified or omitted.

As shown in FIG. 17, the projection optical system PL of this embodiment has the single final optical element arranged opposite to the surface of the substrate P in the same manner as in the embodiment described above. The first exposure light beam EL1 and the second exposure light beam EL2 are radiated onto the first exposure area AR1 and the second exposure area AR2 respectively via the single final optical element FL. The projection optical system PL has the intermediate optical member 40 which is arranged in the vicinity of the position optically conjugate with the first exposure area AR1 and the second exposure area AR2 and which guides the first exposure light beam EL1 from the first mask M1 and the second exposure light beam EL2 from the second mask M2 to the third guiding optical system 43.

The first guiding optical system 41, which guides the first exposure light beam EL1 from the first mask M1 to the intermediate optical member 40, has the concave mirror 44. Similarly, the second guiding optical system 42, which guides the second exposure light beam EL2 from the second mask M2 to the intermediate optical member 40, also has the concave mirror 44.

The first and second exposure light beams EL1, EL2, which are patterned by the first and second masks M1, M2 respectively, are guided to the intermediate optical member 40 by the first and second guiding optical systems 41, 42, respectively. Subsequently, the first exposure light beam EL1 and the second exposure light beam EL2 are reflected by the first and second reflecting surfaces 40A, 40B of the intermediate optical member 40, respectively, and then are radiated onto the first exposure area AR1 and the second exposure area AR2 respectively via the third guiding optical system 43 including the final optical element FL.

Also in this embodiment, the control unit 30 illuminates the first pattern PA1 of the first mask M1 and the second pattern PA2 of the second mask M2 with the first exposure light beam EL1 and the second exposure light beam EL2 respectively while moving the first mask M1 and the second mask M2 in the same scanning direction (for example, in the −Y direction) by using the main stage 61 of the mask stage 60. The control unit 30 moves the substrate stage 80 which holds the substrate P in the scanning direction (for example, in the +Y direction) opposite to that of the first mask M1 and the second mask M2 during the exposure for the shot area SH on the substrate P. The control unit 30 moves the movable blind 10 in synchronization with the movement of the first and second masks M1, M2. The shot area SH on the substrate P is subjected to the multiple exposure with the image of the first pattern PA1 formed with the first exposure light beam EL1 radiated onto the first exposure area AR1 via the first pattern PA1 and the projection optical system PL and the image of the second pattern PA2 formed with the second exposure light beam EL2 radiated onto the second exposure area AR2 via the second pattern PA2 and the projection optical system PL.

Also in this embodiment, each of the shot areas SH on the substrate P can be subjected to the multiple exposure by one time of the scanning operation without causing the decrease in the throughput.

In the first to fourth embodiments described above, a part or parts of the optical elements of the first guiding optical system 41 via which the first exposure light beam EL1 from the first mask M1 is allowed to pass and a part or parts of the optical elements of the second guiding optical system 42 via which the second exposure light beam EL2 from the second mask M2 is allowed to pass may be movable (and/or tiltable) to independently adjust the image of the first pattern PA1 projected onto the first exposure area AR1 and the image of the second pattern PA2 projected onto the second exposure area AR2 respectively.

Fifth Embodiment

Figure 18:
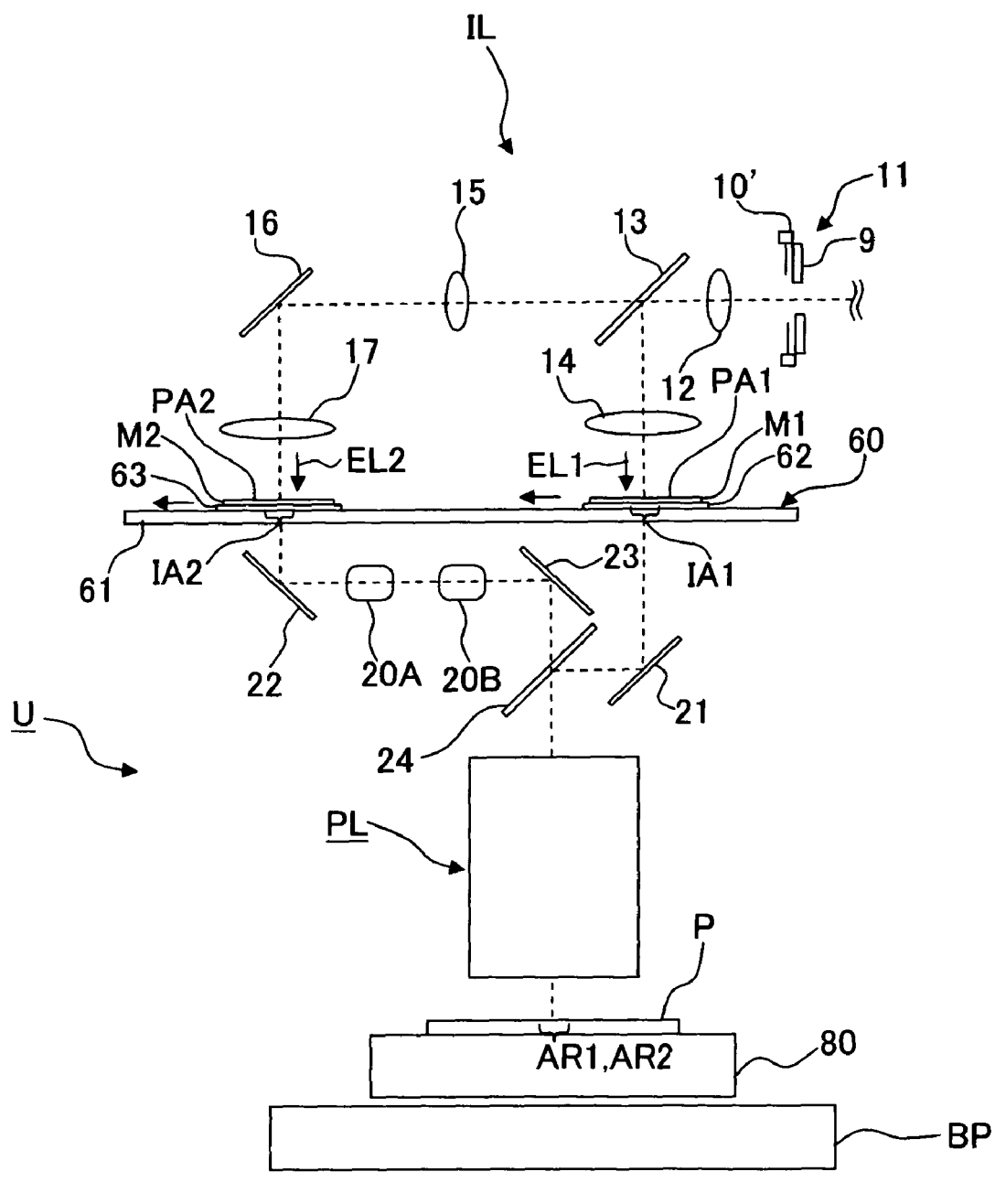
FIG. 18 shows a schematic arrangement view illustrating an exposure apparatus according to a fifth embodiment.

A fifth embodiment will be explained. FIG. 18 shows a schematic arrangement view illustrating the fifth embodiment. The feature of this embodiment, which is different from those of the respective embodiments described above, is that the optical unit U has predetermined imaging optical systems (relay optical systems) 20A, 20B on the optical path for the second exposure light beam EL2 between the second mask M2 and the substrate P. The difference will be mainly described below. The constitutive components, which are the same as or equivalent to those of the embodiments described above, are designated by the same reference numeral, any explanation of which will be simplified or omitted.

The illumination system IL of this embodiment includes the light source unit 1 which emits the exposure light beam EL, the first optical system 2 which converts the polarization state of the exposure light beam EL from the light source unit 1 and emits the exposure light beam EL with the converted polarization state, the blind unit 11, and the splitting optical system (polarization splitting optical system) 13 which splits the exposure light beam EL into the first exposure light beam EL1 in the first polarization state and the second exposure light beam EL2 in the second polarization state, in the same manner as in the embodiments described above. The first mask M1 is illuminated with the first exposure light beam EL1 in the first polarization state (for example, in the S-polarization state), and the second mask M2 is illuminated with the second exposure light beam EL2 in the second polarization state (for example, in the P-polarization state).

Also in this embodiment, the control unit 30 illuminates the first pattern PA1 and the second pattern PA2 with the first exposure light beam EL1 and the second exposure light beam EL2 respectively while moving the first mask M1 and the second mask M2 in the same scanning direction (for example, in the +Y direction) by using the mask stage 60 having the main stage 61. In this embodiment, the first exposure area AR1 and the second exposure area AR2 are set to be at a same position. The control unit 30 moves the substrate stage 80 which holds the substrate P in the scanning direction (for example, in the −Y direction) opposite to that of the first mask M1 and the second mask M2 in synchronization with the movement of the first mask M1 and the second mask M2 during the exposure for the shot area SH on the substrate P. The control unit 30 moves a movable blind 10' in synchronization with the movement of the first and second masks M1, M2. However, in this embodiment, the first and second exposure areas AR1, AR2 are set at the same position. Therefore, the positional relationship between the first pattern formation area SA1 and the first illumination area IA1 is substantially same with the positional relationship between the second pattern formation area SA2 and the second illumination area IA2. Therefore, it is enough that the movable blind 10' has the light passing area of a size corresponding to the first and second pattern formation areas SA1, SA2. The shot area SH on the substrate P is subjected to the multiple exposure with the image of the first pattern PA1 formed with the first exposure light beam EL1 radiated onto the first exposure area AR1 and the image of the second pattern PA2 formed with the second exposure light beam EL2 radiated onto the second exposure area AR2.

Also in this embodiment, the number of times of imaging effected by the optical systems 14, 15, 17 arranged between the splitting optical system 13 and the first pattern PA1 and the second pattern PA2 is set so as to avoid any unnecessary radiation of the first and second exposure light beams EL1, EL2 onto the portions other than the first and second pattern formation areas SA1, SA2 of the first and second masks M1, M2 as well as to avoid any unnecessary exposure for the substrate P with the first exposure light beam EL1 and the second exposure light beam EL2, by the movement of the movable blind 10I in one direction during the exposure operation for one shot area SH.

The optical unit U is provided with a beam splitter 24 which is provided on a side of an object plane of the projection optical system PL (between the projection optical system PL and the mask stage 60) and into which the first exposure light beam EL1 from the first mask M1 and the second exposure light beam EL2 from the second mask M2 are allowed to come. The optical unit U includes the two imaging optical systems 20A, 20B which are provided on the optical path for the second exposure light beam EL2 between the second mask M2 and the substrate P (second exposure area AR2). In this embodiment, the imaging optical systems 20A, 20B are provided between the second mask M2 and the projection optical system PL in the optical path for the second exposure light beam EL2 between the second mask M2 and the second exposure area AR2. The imaging optical systems 20A, 20B of this embodiment are 1× magnification imaging optical systems. Each of the imaging optical systems 20A, 20B has the function to invert the image of the object once.

A first reflecting mirror 21 is provided between the first mask M1 and the beam splitter 24. The first exposure light beam EL1 from the first mask M1 is reflected by the first reflecting member 21, and then comes into the beam splitter 24. A second reflecting mirror 22, the imaging optical systems 20A, 20B, and a third reflecting member 23 are provided between the second mask M2 and the beam splitter 24. The second exposure light beam EL2 from the second mask M2 is reflected by the second reflecting mirror 22, and then passes through the imaging optical systems 20A, 20B. Afterwards, the second exposure light beam EL2 is reflected by the third reflecting mirror 23, and then comes into the beam splitter 24. The first exposure light beam EL1 and the second exposure light beam EL2, which are allowed to come into the beam splitter 24, are allowed to come into the projection optical system PL via the beam splitter 24.

In the optical unit U of this embodiment, the image of the first pattern PA1 is inverted a certain number of times, i.e., any one of an even number of times and an odd number of times between the first mask M1 and the first exposure area AR1; and the image of the second pattern PA2 is inverted the one of the odd and even number of times between the second mask M2 and the second exposure area AR2. That is, when the image of the first pattern PA1 is inverted an even number of times between the first mask M1 and the first exposure area AR1 by the optical unit U, then the image of the second pattern PA2 is inverted an even number of times between the second mask M2 and the second exposure area AR2. On the other hand, when the image of the first pattern PA1 is inverted an odd number of times between the first mask M1 and the first exposure area AR1, then the image of the second pattern PA2 is inverted an odd number of times between the second mask M2 and the second exposure area AR2.

In this embodiment, the imaging optical systems 20A, 20B, which have the function to invert the image of the object, are provided on the optical path for the second exposure light beam EL2 between the second mask M2 and the projection optical system PL. Therefore, the image of the second pattern PA2 is inverted twice by the two imaging optical systems 20A, 20B between the second mask M2 and the projection optical system PL. In this embodiment, the projection optical system PL inverts the image of the object once. Therefore, the image of the second pattern PA2 is inverted three times (odd number of times) between the second mask M2 and the second exposure area AR2. The image of the first pattern PA1 is inverted once (odd number of times) between the first mask M1 and the first exposure area AR1.

As described above, in the optical unit U of this embodiment, the image of the first pattern PA1 is inverted an odd number of times between the first mask M1 and the first exposure area AR1, and the image of the second pattern PA2 is inverted an odd number of times between the second mask M2 and the second exposure area AR2. Therefore, even when the first pattern PA1 and the second pattern PA2 are illuminated with the first exposure light beam EL1 and the second exposure light beam EL2 respectively while moving the first mask M1 and the second mask M2 in the same scanning direction (for example, in the +Y direction), desired images of the first and second patterns PA1, PA2 can be projected onto the shot area SH on the substrate P. It is possible to avoid any unnecessary exposure for the substrate P with the first exposure light beam EL1 and the second exposure light beam EL2, by moving the movable blind 10' in synchronization with the movement of the first and second masks M1, M2.

Sixth Embodiment

Figure 19:
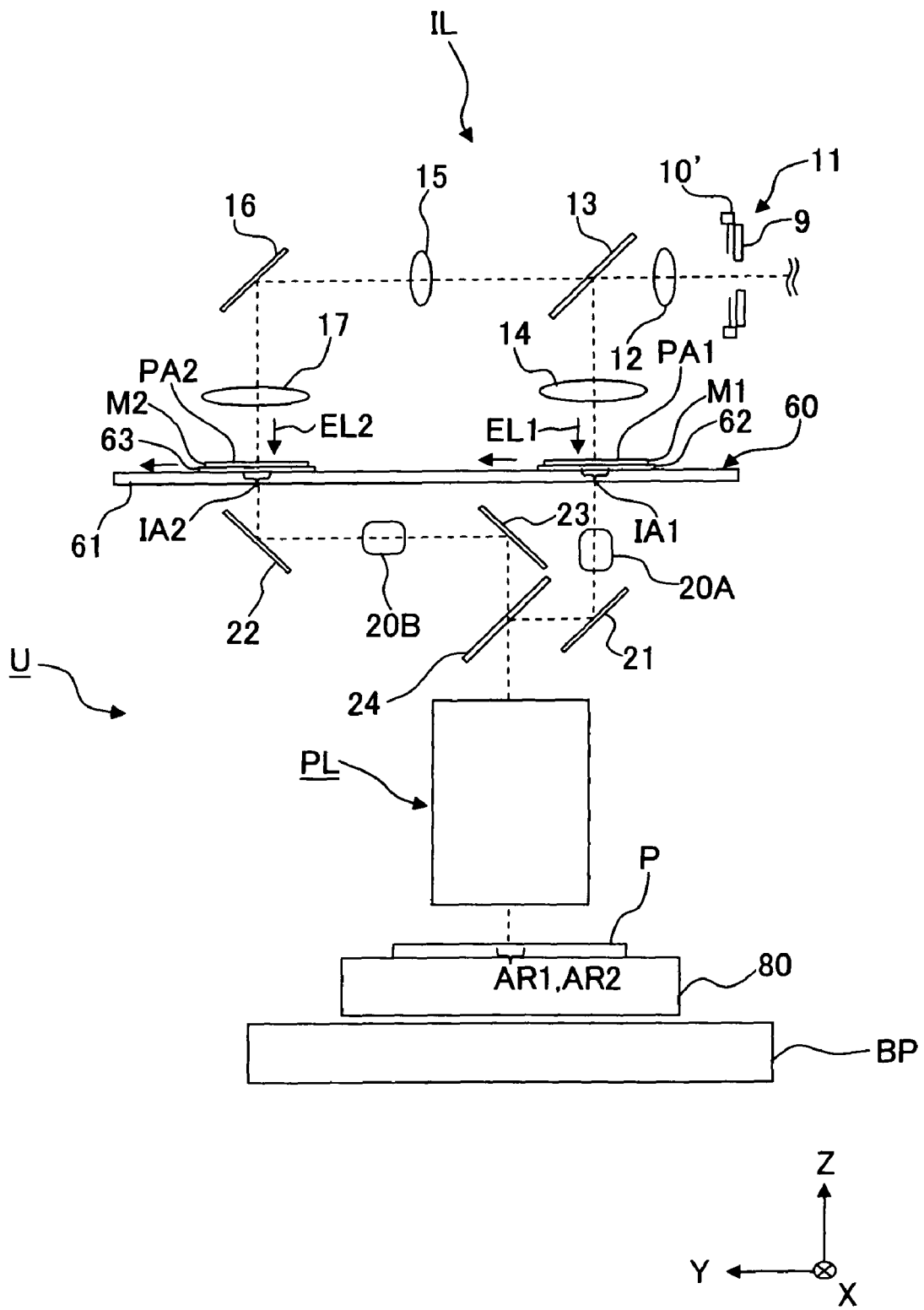
FIG. 19 shows a schematic arrangement view illustrating an exposure apparatus according to a sixth embodiment.

A sixth embodiment will be explained. FIG. 19 shows a schematic arrangement view illustrating the sixth embodiment. The feature of this embodiment, which is different from that of the fifth embodiment described above, is that the image of the first pattern PA1 is inverted an even number of times between the first mask M1 and the first exposure area AR1, and the image of the second pattern PA2 is inverted an even number of times between the second mask M2 and the second exposure area AR2. The difference will be mainly described below. The constitutive components, which are the same as or equivalent to those of the embodiment described above, are designated by the same reference numeral, any explanation of which will be simplified or omitted.

The illumination system IL of this embodiment is equivalent to that of the embodiment described above. The illumination system IL illuminates the first mask M1 with the first exposure light beam EL1 in the first polarization state (for example, in the S-polarization state) and illuminates the second mask M2 with the second exposure light beam EL2 in the second polarization state (for example, in the P-polarization state).

Also in this embodiment, the control unit 30 illuminates the first pattern PA1 and the second pattern PA2 with the first exposure light beam EL1 and the second exposure light beam EL2 respectively while moving the first mask M1 and the second mask M2 in the same scanning direction (for example, in the +Y direction) by using the mask stage 60 having the main stage 61 in the same manner as in the embodiment described above. The control unit 30 moves the substrate stage 80 which holds the substrate P in the scanning direction (for example, in the −Y direction) opposite to that of the first mask M1 and the second mask M2 in synchronization with the movement of the first mask M1 and the second mask M2 during the exposure for the shot area SH on the substrate P. The control unit 30 moves the movable blind 10' in synchronization with the movement of the first and second masks M1, M2. The shot area SH on the substrate P is subjected to the multiple exposure with the image of the first pattern PA1 formed with the first exposure light beam EL1 radiated onto the first exposure area AR1 and the image of the second pattern PA2 formed with the second exposure light beam EL2 radiated onto the second exposure area AR2.

The optical unit U is provided with a beam splitter 24 which is provided on a side of the object plane of the projection optical system PL (between the projection optical system PL and the mask stage 60) and into which the first exposure light beam EL1 from the first mask M1 and the second exposure light beam EL2 from the second mask M2 are allowed to come. The optical unit U has a first imaging optical system 20A which is provided on the optical path for the first exposure light beam EL1 between the first mask M1 and the substrate P (first exposure area AR1), and a second imaging optical system 20B which is provided on the optical path for the second exposure light beam EL2 between the second mask M2 and the substrate P (second exposure area AR2). The first imaging optical system 20A is provided between the first mask M1 and the projection optical system PL on the optical path for the first exposure light beam EL1 between the first mask M1 and the first exposure area AR1. The second imaging optical system 20B is provided between the second mask M2 and the projection optical system PL on the optical path for the second exposure light beam EL2 between the second mask M2 and the second exposure area AR2. The first and second imaging optical systems 20A, 20B of this embodiment are 1× magnification imaging optical systems. Each of the first and second imaging optical systems 20A, 20B has the function to invert the image of the object once.

The first imaging optical system 20A and a first reflecting mirror 21 are provided between the first mask M1 and the beam splitter 24. The first exposure light beam EL1 from the first mask M1 passes through the first imaging optical system 20A, and then comes into the beam splitter 24 via the first reflecting mirror 21. A second reflecting mirror 22, the second imaging optical system 20B, and a third reflecting mirror 23 are provided between the second mask M2 and the beam splitter 24. The second exposure light beam EL2 from the second mask M2 is reflected by the second reflecting mirror 22, and then passes through the second imaging optical system 20B. Afterwards, the second exposure light beam EL2 is reflected by the third reflecting member 23, and then comes into the beam splitter 24. The first exposure light beam EL1 and the second exposure light beam EL2, which are allowed to come into the beam splitter 24, are allowed to come into the projection optical system PL via the beam splitter 24.

In this embodiment, the image of the first pattern PA1 is inverted once by the first imaging optical system 20A between the first mask M1 and the projection optical system PL. In this embodiment, the projection optical system PL inverts the image of the object once. Therefore, the image of the first pattern PA1 is inverted twice (even number of times) between the first mask M1 and the first exposure area AR1. The image of the second pattern PA2 is inverted once by the second imaging optical system 20B between the second mask M2 and the projection optical system PL. Therefore, the image of the second pattern PA2 is inverted twice (even number of times) between the second mask M2 and the second exposure area AR2.

As described above, in the optical unit U of this embodiment, the image of the first pattern PA1 is inverted an even number of times between the first mask M1 and the first exposure area AR1, and the image of the second pattern PA2 is inverted an even number of times between the second mask M2 and the second exposure area AR2. Therefore, even when the first pattern PA1 and the second pattern PA2 are illuminated with the first exposure light beam EL1 and the second exposure light beam EL2 respectively while moving the first mask M1 and the second mask M2 in the same scanning direction (for example, in the +Y direction), desired images of the first and second patterns PA1, PA2 can be projected onto the shot area SH on the substrate P. The movable blind 10' is moved in synchronization with the movement of the first and second masks M1, M2, to thereby make it possible to avoid any unnecessary exposure for the substrate P by the first exposure light beam EL1 and the second exposure light beam EL2.

In the first to sixth embodiments described above, the first pattern PA1 is formed on the first mask M1, and the second pattern PA2 is formed on the second mask M2 which is distinct (different) from the first mask M1. However, the first pattern PA1 and the second pattern PA2 may be formed on a single mask. The substrate P can be subjected to the multiple exposure with the image of the first pattern PA1 and the image of the second pattern PA2 provided on the single mask.

Seventh Embodiment

A seventh embodiment will be explained. FIG. 20 shows a schematic arrangement view illustrating the seventh embodiment. The feature of this embodiment is that the first pattern PA1 and the second pattern PA2 are illuminated with the first exposure light beam EL1 and the second exposure light beam EL2 respectively while moving the first mask M1 and the second mask M2 in mutually opposite scanning directions. The difference will be mainly described below. The constitutive components, which are the same as or equivalent to those of the embodiment described above, are designated by the same reference numeral, any explanation of which will be simplified or omitted.

The illumination system IL of this embodiment includes the light source unit 1 which emits the exposure light beam EL, the first optical system 2 which converts the polarization state of the exposure light beam EL from the light source unit 1 and emits the exposure beam EL with the converted polarization state, the blind unit 11, and the polarization splitting optical system 13 which splits the exposure light beam EL into the first exposure light beam EL1 in the first polarization state (for example, in the S-polarization state) and the second exposure light beam EL2 in the second polarization state (for example, in the P-polarization state), in the same manner as in the embodiment described above. The light source unit 1 and the first optical system 2 are not shown in FIG. 20. In this embodiment, an imaging optical system (relay optical system) 19 is arranged on the optical path between the splitting optical system 13 and the second mask M2.

In this embodiment, the mask stage 60 includes a base member 65, a first stage 62' which is movable while holding the first mask M1 on the base member 65, and a second stage 63' which is movable while holding the second mask M2. The first stage 62' and the second stage 63' are movable independently on the base member 65. The control unit 30 illuminates the first pattern PA1 and the second pattern PA2 with the first exposure light beam EL1 and the second exposure light beam EL2 respectively while moving the first mask M1 and the second mask M2 in the mutually opposite scanning directions (Y axis direction) by using the first stage 62' and the second stage 63'.

For example, when the first mask M1 is moved in the +Y direction by the first stage 62' of the mask stage 60 during the exposure for the shot area SH on the substrate P, the second mask M2 is moved in the −Y direction by the second stage 63'. When the first mask M1 is moved in the −Y direction, the second mask M2 is moved in the +Y direction. The control unit 30 moves the substrate stage 80 which holds the substrate P in a predetermined scanning direction (Y axis direction) in synchronization with the movement of the first mask M1 and the second mask M2 during the exposure for the shot area SH on the substrate P.

In this embodiment, the number of times of imaging effected by the optical systems 14, 17, 19 arranged between the splitting optical system 13 and the first pattern PA1 and the second pattern PA2 is set so as to avoid, by moving the movable blind 10', any unnecessary radiation of the first and second exposure light beams EL1, EL2 onto the portions other than the first and second pattern formation areas SA1, SA2 of the first and second masks M1, M2 as well as to avoid any unnecessary exposure for the substrate P with the first exposure light beam EL1 and the second exposure light beam EL2. In this embodiment, the single imaging optical system (relay optical system) 19 is arranged on the optical path between the splitting optical system 13 and the second mask M2. The imaging optical system 19 has the function to invert the image of the object once. Therefore, the image of the blind unit 11, i.e., the image of the light passing area of the movable blind 10' (image of each of the edges E1 to E6) is inverted once by the single imaging optical system 19 between the splitting optical system 13 and the second mask M2. That is, in this embodiment, the number of times of imaging (number of times of image inversion) is one (odd number of times) in relation to the image of the light passing area of the movable blind 10' (image of each of the edges E1 to E6) between the splitting optical system 13 and the second mask M2. On the other hand, in this embodiment, the number of times of imaging (number of times of image inversion) is zero (even number of times) in relation to the image of light passing area of the movable blind 10' (image of each of the edges E1 to E6) between the splitting optical system 13 and the first mask M1.

The first exposure light beam EL1 in the first polarization state, split by the splitting optical system 13, is radiated onto the first mask M1 via the third optical system 14. On the other hand, the second exposure light beam EL2 in the second polarization state, split by the splitting optical system 13, comes into the reflecting mirror 16 via the imaging optical system 19, and is reflected by the reflecting mirror 16. After that, the second exposure light beam EL2 is radiated onto the second mask M2 via the fifth optical system 17.

The optical unit U of this embodiment has a beam splitter 24 which is provided on a side of the object plane of the projection optical system PL (between the projection optical system PL and the mask stage 60) and into which the first exposure light beam EL1 from the first mask M1 and the second exposure light beam EL2 from the second mask M2 are allowed to come, and a single imaging optical system 20 which is provided on the optical path for the second exposure light beam EL2 between the second mask M2 and the substrate P (second exposure area AR2). The imaging optical system 20 is provided between the second mask M2 and the projection optical system PL on the optical path for the second exposure light beam EL2 between the second mask M2 and the second exposure area AR2. The imaging optical system 20 is a 1× magnification imaging optical system. The imaging optical system 20 has the function to invert the image of the object once.

The first exposure light beam EL1 from the first mask M1 is reflected by the first reflecting mirror 21, and then comes into the beam splitter 24. The second exposure light beam EL2 from the second mask M2 is reflected by the second reflecting mirror 22, and then passes through the imaging optical system 20. Afterwards, the second exposure light beam EL2 is reflected by the third reflecting mirror 23, and then comes into the beam splitter 24. The first exposure light beam EL1 and the second exposure light beam EL2, allowed to come into the beam splitter 24, are allowed to come into the projection optical system PL via the beam splitter 24.

In the optical unit U of this embodiment, the image of the first pattern PA1 is inverted a certain number of times, i.e., any one of an even number of times and an odd number of times between the first mask M1 and the first exposure area AR1, and the image of the second pattern PA2 is inverted the other of the even and odd number of times between the second mask M2 and the second exposure area AR2. That is, when the image of the first pattern PA1 is inverted an even number of times between the first mask M1 and the first exposure area AR1 by the optical unit U, then the image of the second pattern PA2 is inverted an odd number of times between the second mask M2 and the second exposure area AR2. On the other hand, when the image of the first pattern PA1 is inverted an odd number of times between the first mask M1 and the first exposure area AR1, then the image of the second pattern PA2 is inverted an even number of times between the second mask M2 and the second exposure area AR2.

In this embodiment, the single imaging optical system 20, which has the function to invert the image of the object, is provided on the optical path for the second exposure light beam EL2 between the second mask M2 and the projection optical system PL. Therefore, the image of the second pattern PA2 is inverted once by the imaging optical system 20 between the second mask M2 and the projection optical system PL. In this embodiment, the projection optical system PL inverts the image of the object once. Therefore, the image of the second pattern PA2 is inverted twice (even number of times) between the second mask M2 and the second exposure area AR2. The image of the first pattern PA1 is inverted once (odd number of times) between the first mask M1 and the first exposure area AR1.

Next, an explanation will be made about a method for exposing the substrate P by using the exposure apparatus EX according to this embodiment.

The control unit 30 illuminates the first pattern PA1 and the second pattern PA2 with the first exposure light beam EL1 and the second exposure light beam EL2 respectively while moving the first mask M1 and the second mask M2 in the mutually opposite scanning directions by using the first stage 62' and the second stage 63' of the mask stage 60. The control unit 30 moves the substrate stage 80 which holds the substrate P in the scanning direction (Y axis direction) in synchronization with the movement of the first mask M1 and the second mask M2 during the exposure for the shot area SH on the substrate P.

The control unit 30 moves the movable blind 10' in synchronization with the movement of the first and second masks M1, M2. In this embodiment, the number of times of imaging effected by the optical system arranged between the splitting optical system 13 and the first pattern PA1 and the second pattern PA2 is set so as to avoid, by moving the movable blind 10', any unnecessary exposure for the substrate P with the first exposure light beam EL1 and the second exposure light beam EL2. Therefore, even when the first pattern PA1 and the second pattern PA2 are illuminated with the first exposure light beam EL1 and the second exposure light beam EL2 respectively while moving the first mask M1 and the second mask M2 in the mutually opposite scanning directions, any unnecessary radiation of the first and second exposure light beams EL1, EL2 onto the portions other than the first and second pattern formation areas SA1, SA2 of the first and second masks M1, M2 can be shielded by the single movable blind 10'. Accordingly, it is possible to avoid any unnecessary exposure for the substrate P with the first exposure light beam EL1 and the second exposure light beam EL2.

The image of the first pattern PA1 is inverted once by the projection optical system PL between the first mask M1 and the first exposure area AR1, and the image of the first pattern PA1 is projected onto the shot area SH on the substrate P. The image of the second pattern PA2 is inverted twice between the second mask M2 and the second exposure area AR2, and is projected onto the shot area SH on the substrate P. The shot area SH on the substrate P is subjected to the multiple exposure with the image of the first pattern PA1 formed with the first exposure light beam EL1 radiated onto the first exposure area AR1 and the image of the second pattern PA2 formed with the second exposure light beam EL2 radiated onto the second exposure area AR2.

As described above, in the optical unit U of this embodiment, the image of the first pattern PA1 is inverted an odd number of times between the first mask M1 and the first exposure area AR1, and the image of the second pattern PA2 is inverted an even number of times between the second mask M2 and the second exposure area AR2. Therefore, even when the first pattern PA1 and the second pattern PA2 are illuminated with the first exposure light beam EL1 and the second exposure light beam EL2 respectively while moving the first mask M1 and the second mask M2 in the mutually opposite scanning directions, the desired images of the first and second patterns PA1, PA2 can be projected onto the shot area SH on the substrate P. The movable blind 10' is moved in synchronization with the movement of the first and second masks M1, M2, to thereby make it possible to avoid any unnecessary exposure for the substrate P with the first exposure light beam EL1 and the second exposure light beam EL2.

Eighth Embodiment

An eighth embodiment will be explained. The feature of this embodiment is that a liquid immersion area of a liquid is formed on the substrate P, and the first exposure light beam EL1 and the second exposure light beam EL2 are radiated, through the liquid of the liquid immersion area, onto the shot area SH on the substrate P. The difference will be mainly described below. The constitutive components, which are the same as or equivalent to those of the embodiments described above, are designated by the same reference numeral, any explanation of which will be simplified or omitted.

Figure 21:
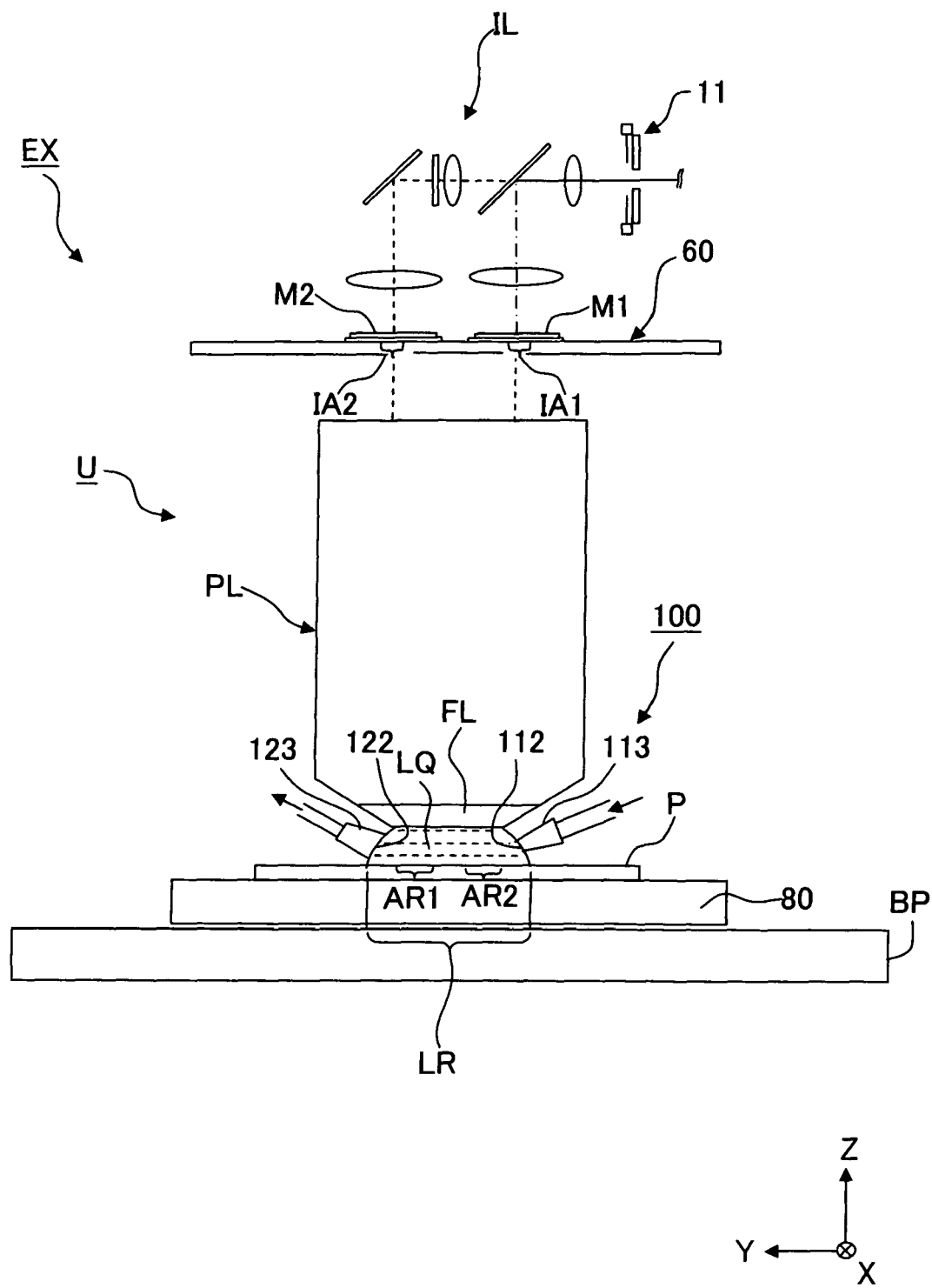
FIG. 21 shows a schematic arrangement view illustrating an exposure apparatus according to an eighth embodiment.

FIG. 21 shows a schematic arrangement view illustrating the eighth embodiment. Any of the illumination systems of the first to seventh embodiments described above can be used as the illumination system IL of this embodiment. Any of the projection optical systems of the respective embodiments described above can be also used as the projection optical system PL (optical unit U). When the shot area SH on the substrate P is subjected to the exposure, the first mask M1 and the second mask M2 may be moved in the same scanning direction, or may be moved in the mutually opposite scanning directions.

The exposure apparatus EX of this embodiment is an exposure apparatus to which the liquid immersion method is applied in order that the exposure wavelength is substantially shortened to improve the resolution and the depth of focus is substantially widened, as disclosed, for example, in International Publication No. 99/49504 and Japanese Patent Application Laid-open No. 2004-289126 (corresponding to United States Patent Application Publication No. 2004/0165159). The exposure apparatus EX includes a liquid immersion system 100 which forms a liquid immersion area LR of the liquid LQ on the substrate P. In this embodiment, water (pure or purified water) is used as the liquid LQ. A top coat film or the like, which protects the photosensitive material and the base material from the liquid LQ, can be provided on the substrate P.

The liquid immersion system 100 includes a supply member 113 having a supply port 112 for supplying the liquid LQ to the optical path and a recovery member 123 having a recovery port 122 for recovering the liquid LQ. The supply member 113 and the recovery member 123 are provided in the vicinity of the optical path for the first and second exposure light beams EL1, EL2 between the substrate P and the final optical element FL closest to the image plane of the projection optical system PL among the plurality of optical elements of the projection optical system PL. A liquid supply unit (not shown), which is capable of feeding the liquid LQ, is connected to the supply member 113. The liquid supply unit is capable of supplying the clean and temperature-adjusted liquid LQ to the optical path via the supply port 112. A liquid recovery unit (not shown), which includes, for example, a vacuum system and/or the like, is connected to the recovery member 123. The liquid recovery unit is capable of recovering, via the recovery port 122, the liquid LQ filling the optical path therewith. The operations of the liquid supply unit and the liquid recovery unit are controlled by the control unit 30. The control unit 30 controls the liquid immersion system 100 to concurrently perform the liquid supply operation by the liquid supply unit and the liquid recovery operation by the liquid recovery unit, thereby forming the liquid immersion area LR of the liquid LQ locally in a part of the area of the substrate P so as to fill, with the liquid, the optical path for the first and second exposure light beams EL1, EL2 between the lower surface of the final optical element FL of the projection optical system PL and the surface of the substrate P on the substrate stage 80. The liquid immersion area LR is formed to be larger than the first exposure area AR1 and the second exposure area AR2 on the substrate P. That is, the liquid immersion area LR is formed so that all of the first exposure area AR1 and the second exposure area AR2 are covered therewith.

The exposure apparatus EX forms the liquid immersion area LR of the liquid LQ on the substrate P held by the substrate stage 80. The first and second exposure light beams EL1, EL2 are radiated onto the first and second exposure areas AR1, AR2 on the substrate P respectively through the liquid LQ of the liquid immersion area LR to perform the exposure for the substrate P therewith.

The exposure apparatus EX radiates the first and second exposure light beams EL1, EL2 onto the first and second exposure areas AR1, AR2 respectively while moving the shot area SH on the substrate P in the Y axis direction with respect to the first and second exposure areas AR1, AR2 in a state in which the liquid immersion area LR is formed. With this, the shot area SH on the substrate P is subjected to the multiple exposure (double exposure) with the image of the first pattern PA1 formed with the first exposure light beam EL1 radiated onto the first exposure area AR1 through the liquid LQ and the image of the second pattern PA2 formed with the second exposure light beam EL2 radiated onto the second exposure area AR2 through the liquid LQ.

In this embodiment, water (pure or purified water) is used as the liquid LQ. However, it is also allowable to use liquids other than water as the liquid LQ. For example, when the exposure light beam EL is the $F_2$ laser, the $F_2$ laser beam is not transmitted through water. Therefore, the liquid LQ may be, for example, a fluorine-based fluid such as fluorine-based oil and perfluoropolyether (PFPE). Alternatively, other than the above, it is also possible to use, as the liquid LQ, liquids (for example, cedar oil) which have the transmittance with respect to the exposure light beam EL, which have the refractive index as high as possible, and which are stable against the photoresist coated on the surface of the substrate P and the projection optical system PL.

Any liquid, which has a refractive index with respect to the exposure light beam EL higher than that of water, may be used as the liquid LQ. For example, any liquid, which has a refractive index of about 1.6 to 1.8, may be used as the liquid LQ. Further, the final optical element FL may be formed of any material having a refractive index (for example, not less than 1.6) higher than those of silica glass and calcium fluoride. The liquid LQ, which has the refractive index (for example, not less than 1.5) higher than that of pure or purified water, includes, for example, predetermined liquids having the C—H bond or the O—H bond such as isopropanol having a refractive index of about 1.50 and glycerol (glycerin) having a refractive index of about 1.61, predetermined liquids (organic solvents) such as hexane, heptane, decane and the like; and decalin (decahydronaphthalene) having a refractive index of about 1.60. As for the liquid LQ, it is also allowable to use liquids obtained by mixing any two or more liquids of the foregoing liquids and liquids obtained by adding (mixing) at least one of the foregoing liquid or liquids to (with) pure or purified water. Further, as for the liquid LQ, it is also allowable to use liquids obtained by adding (mixing) base or acid such as $H^+$, $Cs^+$, $K^+$, $Cl^-$, $SO_4^{2-}$, $PO_4^{2-}$ and the like to (with) pure or purified water, and it is also allowable to use liquids obtained by adding (mixing) fine particles of Al oxide or the like to (with) pure or purified water. As for the liquid LQ, it is preferable to use liquids which have the small coefficients of light absorption, which have the small temperature dependency, and which are stable against the photosensitive material (or, against the top coat film, the antireflection film, or the like) coated on the surface of the substrate P and/or the projection system PL. As for the liquid LQ, it is also allowable to use liquids having a refractive index of about 1.6 to 1.8. As for the liquid LQ, it is also possible to use supercritical fluids.

The final optical element FL may be formed of silica glass (silica), or single crystal materials of fluorine compounds such as calcium fluoride (calcium fluoride), barium fluoride, strontium fluoride, lithium fluoride, sodium fluoride, and the like. Alternatively, the final optical element FL may be formed of a material having a refractive index (for example, not less than 1.6) higher than those of silica glass, calcium fluoride and the like. Materials usable as the material having the refractive index of not less than 1.6 include, for example, sapphire, germanium dioxide and the like as disclosed, for example, in International Publication No. 2005/059617, and potassium chloride (refractive index: about 1.75) as disclosed in International Publication No. 2005/059618.

It is not necessarily indispensable that a part of parts (for example, the member or members constructing the liquid supply unit and/or the liquid recovery unit) of the liquid immersion system 100 are provided for the exposure apparatus, and may be replaced with, for example, the equipment of the factory or the like in which the exposure apparatus is installed. The structure of the liquid immersion system 100 is not limited to the structure described above. It is possible to use those described, for example, in European Patent Publication No. 1420298, International Publication No. 2004/055803, International Publication No. 2004/057590, International Publication No. 2005/029559 (corresponding to United States Patent Application Publication No. 2006/0231206), International Publication No. 2004/086468 (corresponding to United States Patent Application Publication No. 2005/0280791), and Japanese Patent Application Laid-open No. 2004-289126 (corresponding to U.S. Pat. No. 6,952,253). The contents of, for example, U.S. Pat. No. 6,952,253 and United States Patent Application Publication Nos. 2006/0231206 and 2005/0280791 and the like described above are incorporated herein by reference within a range of permission of the domestic laws and ordinances of the designated or selected state, in relation to the liquid immersion mechanism of the liquid immersion exposure apparatus and the attached equipment thereof.

In relation to the projection optical system of this embodiment, the optical path, on the side of the object plane of the final optical element, may be also filled with the liquid, in addition to the optical path on the side of the image plane of the final optical element, as disclosed, for example, in International Publication No. 2004/019128 (corresponding to United States Patent Application Publication No. 2005/0248856). It is also allowable that a thin film, which has the liquid-attractive property and/or the dissolution-preventive function, may be formed on a part (including at least a contact surface with the liquid LQ) or all of the surface of the final optical element. Silica glass has the high affinity for the liquid LQ, and no dissolution-preventive film is required for the silica glass as well. However, it is preferable to form at least any dissolution-preventive film for calcium fluoride.

In this embodiment, the first exposure area AR1 and the second exposure area AR2 are covered with one liquid immersion area LR. However, the first exposure area AR1 and the second exposure area AR2 may be covered with distinct (different) liquid immersion areas (first and second liquid immersion areas). In this case, the first and second liquid immersion areas may be formed with liquids of different types (at least different in the refractive index with respect to the exposure light beam EL) respectively. For example, one of the first and second liquid immersion areas may be formed with water (pure or purified water), and the other of the first and second liquid immersion areas may be formed with a liquid having a refractive index with respect to the exposure light beam EL higher than that of water (refractive index of the water is about 1.44). At least one of the viscosity of the liquid LQ, the transmittance for the exposure light beam EL, and the temperature may mutually differ between the first liquid immersion area and the second liquid immersion area.

In each of the first to eighth embodiments described above, the exposure light beam EL, which is emitted from the light source unit 1, is split by the illumination system IL into the first exposure light beam EL1 in the first polarization state and the second exposure light beam EL2 in the second polarization state by using the splitting optical system (polarization splitting optical system) 13. However, it is allowable that the splitting optical system is formed with, for example, a half mirror; and that the exposure light beam EL, emitted from the light source unit 1, is split into a first exposure light beam having a first intensity (light amount) and a second exposure light beam EL having a second intensity (light amount) by using the splitting optical system. The illumination system may illuminates the first and second patterns with the first and second exposure light beams having the first and second intensities (light amounts) respectively.

Alternatively, when the light source unit 1 emits an exposure light beam EL having a predetermined wavelength band, the splitting optical system may be formed with, for example, a dichroic mirror; and the exposure light beam EL, emitted from the light source unit 1, may be split into a first exposure light beam having a first wavelength and a second exposure light beam having a second wavelength by using the splitting optical system. That is, the exposure light beam may be split or separated on the basis of the polarization state, the light intensity (or the light amount), the wavelength, or any combination thereof (or a first component and a second component, which differ in the physical property, may be extracted from the exposure light beam).

In the first to eighth embodiments described above, the projection optical system PL is not limited to those described above, and may be any one of, for example, the reduction system, the 1× magnification system, and the magnifying system. In the embodiments described above, the explanation has been made as exemplified by the case in which the projection optical system PL is the catadioptric system including catoptric optical elements and dioptric optical elements by way of example. However, the projection optical system PL may be, for example, the dioptric system including no catoptric optical element or the catoptric system including no dioptric optical element. As for the catadioptric system, it is also allowable to use the so-called inline type catadioptric system in which a plurality of reflecting surfaces are provided; an optical system (catoptric or dioptric system) forming an intermediate image at least once is provided at a part thereof; and a single optical axis is provided, as disclosed, for example, in International Publication No. 2004/107011 (corresponding to United States Patent Application Publication No. 2006/0121364). The exposure area, onto which the exposure light beam is radiated via the projection optical system, may be either an on-axis area which includes the optical axis in the field of the projection optical system, or an off-axis area which includes no optical axis, in the same manner as in the inline type catadioptric system described above.

In the respective embodiments described above, the first mask M1 and the second mask M2 are synchronously moved with respect to the substrate P by the main stage 61 provided on the mask stage 60. However, the movement of the first and second masks M1 and M2 is not limited to this. The first mask M1 and the second mask M2 can be synchronously moved with respect to the substrate P independently respectively as well. In this case, it is possible to provide a first mask stage and a second mask stage which are driven independently while placing (holding) the first mask M1 and the second mask M2 respectively thereon. For example, the main stage 61 can be omitted, and the first substage 62 and the second substage 63 can be synchronously moved with respect to the substrate P independently or in cooperation. When the first mask stage and the second mask stage, which are movable independently, are provided as described above, it is necessary that the first and second mask stages should be synchronously moved with respect to the substrate stage respectively. That is, it is necessary to adjust each of the positional relationship between the first mask placed on the first mask stage and the shot area of the substrate P and the positional relationship between the second mask placed on the second mask stage and the shot area of the substrate P. By performing the adjustment in this manner, the shot area of the substrate P can be subjected to the multiple exposure (double exposure) with the image of the pattern PA1 of the first mask formed in the first exposure area AR1 and the image of the pattern PA2 of the second mask formed in the second exposure area AR2 in such a state that the images are correctly overlaid with each other.

In the respective embodiments described above, the image of the first pattern PA1 of the first mask M1 and the image of the second pattern PA2 of the second mask M2 are projected onto the substrate P by using the single projection optical system PL. However, a plurality of (for example, two) projection optical systems may be provided to project the image of the first pattern PA1 of the first mask M1 and the image of the second pattern PA2 of the second mask M2 onto the substrate P by using the distinct or separate projection optical systems. The present invention is also applicable to a scanning type exposure apparatus of the so-called multi-lens system in which a plurality of projection optical systems are arranged so that the adjacent projection areas are displaced by a predetermined amount in the scanning direction, and that the ends of the adjacent projection areas are overlapped with each other in a direction perpendicular to the scanning direction. Also in this case, the increase in the size of the exposure apparatus can be avoided when the single light source unit 1 and the splitting optical system 13 are used.

In the respective embodiments described above, the first exposure area AR1 and the second exposure area AR2 can be simultaneously arranged in one shot area SH. However, it is not necessarily indispensable that the first exposure area AR1 and the second exposure area AR2 can be arranged simultaneously in one shot area SH. It is possible to arbitrarily define the first exposure area AR1 and the second exposure area AR2.

In the respective embodiments described above, the first exposure area AR1 and the second exposure area AR2 are separated from each other in the Y axis direction. However, parts of the first exposure area AR1 and the second exposure area AR2 may be overlapped with each other in the Y axis direction (scanning direction).

In the respective embodiments described above, the first exposure area AR1 and the second exposure area AR2 may be different from each other in at least one of the size and the shape. For example, the width in the X axis direction and/or the width in the Y axis direction may differ between the first exposure area AR1 and the second exposure area AR2. When the width in the X axis direction differs, only a part in the shot area SH is subjected to the multiple (double) exposure.

In the respective embodiments described above, the exposure light beam EL is continuously radiated onto each of the first exposure area AR1 and the second exposure area AR2 during the period of time in which the shot area SH passes across the first exposure area AR1 and the second exposure area AR2. However, the exposure light beam may be radiated only partially in the period of time during which the shot area SH passes across at least one of the exposure areas. That is, only a part of the shot area SH may be subjected to the multiple (double) exposure.

In the respective embodiments described above, the first mask M1 and the second mask M2 are used in order to form the first pattern and the second pattern. However, in place of these masks M1 and M2, it is possible to use an electronic mask (variably shaped mask) which generates a variable pattern. As the electronic mask as described above, it is possible to use DMD (Deformable Micro-mirror Device or Digital Micro-mirror Device) which is a type of the no light-emitting image display device (also referred to as "spatial light modulator" (SLM)). DMD has a plurality of reflecting elements (micromirrors) which are driven based on predetermined electronic data. The plurality of reflecting elements are arranged in a two-dimensional matrix form on a surface of DMD, and are driven in element unit (in units of elements) to reflect and deflect the exposure light beam EL. The respective reflecting elements have the reflecting surfaces for which the angles are adjusted. The operation of DMD may be controlled by the control unit 30. The control unit 30 drives the respective reflecting elements of DMD based on the electronic data (pattern information) corresponding to the first pattern and the second pattern to be formed on the substrate P, and the control unit 30 makes the exposure light beam EL, which is radiated from the illumination system IL, to be patterned by the reflecting elements. When DMD is used, it is possible to perform the multiple exposure more efficiently, because, when the pattern is changed, it is unnecessary to perform the mask-exchanging operation and the mask-positional adjustment operation for the mask on the mask stage, as compared with a case in which the exposure is performed with the mask (reticle) having the pattern formed therein. The exposure apparatus using DMD is disclosed, for example, in Japanese Patent Application Laid-open Nos. 8-313842 and 2004-304135 and U.S. Pat. No. 6,778,257. The contents of U.S. Pat. No. 6,778,257 is incorporated herein by reference within a range of permission of the domestic laws and ordinances of the designated or selected state.

In the respective embodiments described above, the interferometer system is used to measure the position information about the mask stage and the substrate stage. However, the measurement of the position information is not limited to this. For example, it is also allowable to use an encoder system which detects a scale (diffraction grating) provided on the upper surface of the substrate stage. In this case, it is preferable that a hybrid system including both of the interferometer system and the encoder system is provided, and that the measurement result of the interferometer system is used to calibrate the measurement result of the encoder system. The position control of the substrate stage may be performed by switching and using the interferometer system and the encoder system or using both of the interferometer and encoder systems.

In the respective embodiments described above, an ArF excimer laser may be used as a light source unit for generating an ArF excimer laser beam as the exposure light beam EL. However, it is also allowable to use a high harmonic wave-generating unit which includes, for example, a solid laser light source such as a DFB semiconductor laser, a fiber laser or the like; a light-amplifying section having a fiber amplifier or the like; a wavelength-converting section and which outputs a pulse light beam having a wavelength of 193 nm; and the like as disclosed, for example, in International Publication No. 1999/46835 (corresponding to U.S. Pat. No. 7,023,610). In the embodiments described above, the respective illumination areas and the first and second exposure areas are rectangular respectively. However, it is also allowable that the illumination and exposure areas have any other shape, for example, any circular arc-shaped form, any trapezoidal form, any parallelogram form, any lozenge form, or the like.

The substrate P, which is usable in the respective embodiments described above, is not limited only to the semiconductor wafer for producing the semiconductor device. Substrates applicable include, for example, a glass substrate for the display device, a ceramic wafer for the thin film magnetic head, a master plate (synthetic silica glass, silicon wafer) for the mask or the reticle to be used for the exposure apparatus, a film member, and the like. The shape of the substrate P is not limited only to the circular shape, and may be other shapes such as rectangular shapes or the like.

The present invention is also applicable to an exposure apparatus of the multistage type (for example, the twine-stage type) provided with a plurality of substrate stages as disclosed, for example, in Japanese Patent Application Laid-open Nos. 10-163099 and 10-214783 (corresponding to U.S. Pat. Nos. 6,341,007, 6,400,441, 6,549,269, and 6,590,634) and Published Japanese Translation of PCT International Publication for Patent Application No. 2000-505958 (corresponding to U.S. Pat. No. 5,969,441). The contents of U.S. Pat. Nos. 6,341,007, 6,400,441, 6,549,269, 6,590,634 and 5,969,441 described above are incorporated herein by reference within a range of permission of the domestic laws and ordinances of the designated or selected state, in relation to the exposure apparatus of the multistage type.

Further, the present invention is also applicable, for example, to an exposure apparatus provided with a substrate stage which holds a substrate and a measuring stage which is provided with a measuring member (for example, a reference member having a reference mark formed therein and/or various types of a photoelectric sensors) as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963).

The embodiment, among the embodiments described above, in which the optical path for the exposure light beam is filled with the liquid, adopts the exposure apparatus in which the space between the projection optical system and the substrate P is locally filled with the liquid. However, the present invention is also applicable to a liquid immersion exposure apparatus which performs the exposure in a state in which the entire surface of the substrate as the exposure objective is immersed in the liquid as disclosed, for example, in Japanese Patent Application Laid-open Nos. 6-124873 and 10-303114 and U.S. Pat. No. 5,825,043.

In the respective embodiments described above, the exposure apparatus EX is provided with the projection optical system. However, in place of the projection optical system, it is also allowable to use an optical system (for example, an diffraction optical element) which forms no image of the pattern. In the respective embodiments described above, the substrate P may be exposed with a line-and-space pattern by forming interference fringes in at least one of the first and second exposure areas AR1, AR2 as disclosed, for example, in International Publication No. 2001/035168.

The type of the exposure apparatus EX is not limited to the exposure apparatus, for producing the semiconductor element, which exposes the semiconductor element pattern on the substrate P. The present invention is also widely applicable, for example, to an exposure apparatus for producing the liquid crystal display device or producing the display as well as to an exposure apparatus for producing, for example, the thin film magnetic head, the micromachine, MEMS, the DNA chip, the image pickup element (CCD), the reticle, the mask, or the like.

The disclosures of various United States patents and various United States patent publications referred to in this specification, which are not included in those having been specifically incorporated herein explicitly, are also incorporated herein by reference within a range of permission of the domestic laws and ordinances of the designated or selected state.

As described above, the exposure apparatus EX according to each of the embodiments of the present invention is produced by assembling the various subsystems including the respective constitutive elements as defined in claims so that the predetermined mechanical accuracy, electric accuracy, and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, the piping connection of the air pressure circuits and the like in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature, the cleanness and the like are managed.

Figure 23:
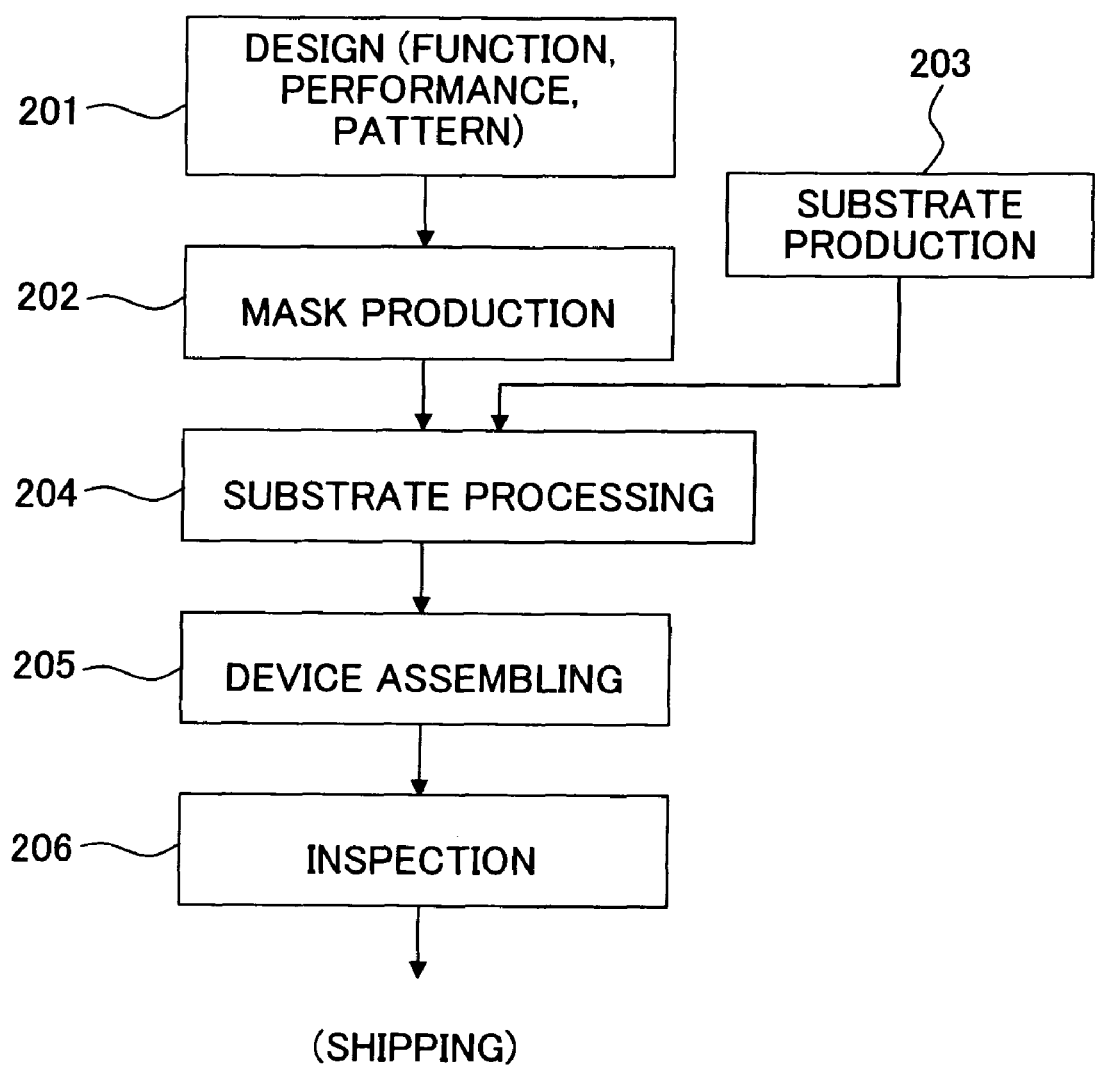
FIG. 23 shows a flow chart illustrating an example of steps of producing a microdevice.

As shown in FIG. 23, a microdevice such as the semiconductor device is produced by performing, for example, a step 201 of designing the function and the performance of the microdevice, a step 202 of manufacturing a mask or masks (reticle or reticles) based on the designing step, a step 203 of producing a substrate as a base material for the device, a substrate-processing step 204 including an exposure step of performing the multiple exposure for the substrate with a pattern(s) of the mask(s) by using the exposure apparatus EX of the embodiment described above and a development step of developing the exposed substrate, a step 205 of assembling the device (including processing processes such as a dicing step, a bonding step, and a packaging step), and an inspection step 206.

According to the present invention, the multiple exposure for the substrate can be realized correctly and highly efficiently. Therefore, it is possible to produce, at the high throughput, the device having the high density complicated circuit pattern to be used, for example, for the liquid crystal display device, the micromachine and the like. Therefore, the present invention will extremely contribute to the development of the precision mechanical equipment industry including the semiconductor industry in our country.

What is claimed is:

1. An exposure apparatus which exposes a substrate, comprising:
   a light source which generates an exposure light beam;
   an illumination system which illuminates a first pattern with a first exposure light beam and which illuminates a second pattern with a second exposure light beam;
   a moving unit which moves the first pattern and the second pattern relative to the substrate; and
   a movable blind which is movable in synchronization with movement of at least one of the first pattern, the second pattern, and the substrate and which has a first area allowing only the first exposure light beam to pass therethrough, a second area allowing only the second exposure light beam to pass therethrough, and a third area allowing both of the first exposure light beam and the second exposure light beam to pass therethrough,
   wherein:
   a predetermined area on the substrate is multiply exposed by radiating the first exposure light beam from the first pattern and the second exposure light beam from the second pattern onto the predetermined area on the substrate, and
   the illumination system radiates the first exposure light beam at a different point in time than the second exposure light beam.

2. The exposure apparatus according to claim 1, wherein the movable blind is moved in synchronization with the first pattern and the second pattern while the first pattern and the second pattern are being moved in synchronization with the substrate.

3. The exposure apparatus according to claim 2, wherein the first, second, and third areas are arranged and aligned in an arrangement direction in which the first pattern and the second pattern are arranged; and the third area is provided between the first area and the second area.

4. The exposure apparatus according to claim 2, wherein the first pattern corresponds to the first area and the third area, and the second pattern corresponds to the second area and the third area.

5. The exposure apparatus according to claim 2, wherein the first exposure light beam and the second exposure light beam are linearly polarized light beams which are perpendicular to each other; and the movable blind includes a polarizing plate.

6. The exposure apparatus according to claim 1, further comprising an adjusting unit which radiates the first exposure light beam passed through the first area and the first exposure light beam passed through the third area at a same intensity onto the substrate, and which radiates the second exposure light beam passed through the second area and the second exposure light beam passed through the third area at a same intensity onto the substrate.

7. The exposure apparatus according to claim 1, wherein a number of times of imaging effected by an optical system arranged between the light source and the first pattern and the second pattern is set by moving the movable blind to avoid unnecessary exposure for the substrate with the first exposure light beam and the second exposure light beam.

8. The exposure apparatus according to claim 1, wherein a liquid immersion area is formed on the substrate; and the first exposure light beam and the second exposure light beam are radiated onto the predetermined area on the substrate through a liquid of the liquid immersion area.

9. A method for producing a device, comprising:
   performing multiple exposure for a substrate by using the exposure apparatus as defined in claim 1;
   developing the substrate for which the multiple exposure has been performed; and
   processing the developed substrate.

* * * * *